US010948534B2

(12) United States Patent
Bowyer et al.

(10) Patent No.: US 10,948,534 B2
(45) Date of Patent: Mar. 16, 2021

(54) AUTOMATED TEST SYSTEM EMPLOYING ROBOTICS

(71) Applicant: Teradyne, Inc., North Reading, MA (US)

(72) Inventors: David Paul Bowyer, Littlehampton (GB); Jianfa Pei, Haverhill, MA (US); John P. Toscano, Auburn, MA (US); Philip Campbell, Bedford, NH (US); Valquirio N. Carvalho, Lowell, MA (US)

(73) Assignee: TERADYNE, INC., North Reading, MA (US)

( * ) Notice: Subject to any disclaimer, the term of this patent is extended or adjusted under 35 U.S.C. 154(b) by 221 days.

(21) Appl. No.: 15/688,104

(22) Filed: Aug. 28, 2017

(65) Prior Publication Data
US 2019/0064254 A1    Feb. 28, 2019

(51) Int. Cl.
*G01R 31/28* (2006.01)
*G01R 31/27* (2006.01)

(52) U.S. Cl.
CPC ......... *G01R 31/2808* (2013.01); *G01R 31/27* (2013.01); *G01R 31/2867* (2013.01); *G01R 31/2863* (2013.01)

(58) Field of Classification Search
None
See application file for complete search history.

(56) References Cited

U.S. PATENT DOCUMENTS

| 557,186 | A | 3/1896 | Cahill |
|---|---|---|---|
| 2,224,407 | A | 12/1940 | Passur |
| 2,380,026 | A | 7/1945 | Clarke |
| 2,631,775 | A | 3/1953 | Gordon |
| 2,635,524 | A | 4/1953 | Jenkins |
| 3,120,166 | A | 2/1964 | Lyman |
| 3,360,032 | A | 12/1967 | Sherwood |
| 3,364,838 | A | 1/1968 | Bradley |
| 3,517,601 | A | 6/1970 | Courchesne |
| 3,845,286 | A | 10/1974 | Aronstein et al. |
| 4,147,299 | A | 4/1979 | Freeman |
| 4,233,644 | A | 11/1980 | Hwang et al. |
| 4,336,748 | A | 6/1982 | Martin et al. |
| 4,379,259 | A | 4/1983 | Varadi et al. |
| 4,477,127 | A | 10/1984 | Kume |
| 4,495,545 | A | 1/1985 | Dufresne et al. |

(Continued)

FOREIGN PATENT DOCUMENTS

| AU | 583716 B2 | 5/1989 |
|---|---|---|
| CN | 1114109 A | 12/1995 |

(Continued)

OTHER PUBLICATIONS

U.S. Appl. No. 15/688,048, filed Aug. 28, 2017, Automated Test System Having Orthogonal Robots.

(Continued)

*Primary Examiner* — Nasima Monsur

(74) *Attorney, Agent, or Firm* — Burns & Levinson LLP.

(57) ABSTRACT

An example test system includes robotics configured to operate on devices at a first level of precision, and stages configured to operate at levels of precision that are less than the first level of precision. Each of the stages may include parallel paths that are configured to pass the devices between adjacent stages.

67 Claims, 45 Drawing Sheets

(56) References Cited

U.S. PATENT DOCUMENTS

| | | |
|---|---|---|
| 4,526,318 A | 7/1985 | Fleming et al. |
| 4,620,248 A | 10/1986 | Gitzendanner |
| 4,648,007 A | 3/1987 | Garner |
| 4,654,727 A | 3/1987 | Blum et al. |
| 4,654,732 A | 3/1987 | Mesher |
| 4,665,455 A | 5/1987 | Mesher |
| 4,683,424 A | 7/1987 | Cutright et al. |
| 4,685,303 A | 8/1987 | Branc et al. |
| 4,688,124 A | 8/1987 | Scribner et al. |
| 4,713,714 A | 12/1987 | Gatti et al. |
| 4,739,444 A | 4/1988 | Zushi et al. |
| 4,754,397 A | 6/1988 | Varaiya et al. |
| 4,768,285 A | 9/1988 | Woodman, Jr. |
| 4,775,281 A | 10/1988 | Prentakis |
| 4,778,063 A | 10/1988 | Ueberreiter |
| 4,801,234 A | 1/1989 | Cedrone |
| 4,809,881 A | 3/1989 | Becker |
| 4,817,273 A | 4/1989 | Lape et al. |
| 4,817,934 A | 4/1989 | McCormick et al. |
| 4,851,965 A | 7/1989 | Gabuzda et al. |
| 4,881,591 A | 11/1989 | Rignall |
| 4,888,549 A | 12/1989 | Wilson et al. |
| 4,911,281 A | 3/1990 | Jenkner |
| 4,967,155 A | 10/1990 | Magnuson |
| 5,012,187 A | 4/1991 | Littlebury |
| 5,045,960 A | 9/1991 | Eding |
| 5,061,630 A | 10/1991 | Knopf et al. |
| 5,094,584 A | 3/1992 | Bullock |
| 5,119,270 A | 6/1992 | Bolton et al. |
| 5,122,914 A | 6/1992 | Hanson |
| 5,127,684 A | 7/1992 | Klotz et al. |
| 5,128,813 A | 7/1992 | Lee |
| 5,136,395 A | 8/1992 | Ishii et al. |
| 5,143,193 A | 9/1992 | Geraci |
| 5,158,132 A | 10/1992 | Guillemot |
| 5,168,424 A | 12/1992 | Bolton et al. |
| 5,171,183 A | 12/1992 | Pollard et al. |
| 5,173,819 A | 12/1992 | Takahashi et al. |
| 5,176,202 A | 1/1993 | Richard |
| 5,205,132 A | 4/1993 | Fu |
| 5,206,772 A | 4/1993 | Hirano et al. |
| 5,207,613 A | 5/1993 | Ferchau et al. |
| 5,210,680 A | 5/1993 | Scheibler |
| 5,237,484 A | 8/1993 | Ferchau et al. |
| 5,263,537 A | 11/1993 | Plucinski et al. |
| 5,268,637 A | 12/1993 | Liken et al. |
| 5,269,698 A | 12/1993 | Singer |
| 5,295,392 A | 3/1994 | Hensel et al. |
| 5,309,323 A | 5/1994 | Gray et al. |
| 5,325,263 A | 6/1994 | Singer et al. |
| 5,343,403 A | 8/1994 | Beidle et al. |
| 5,349,486 A | 9/1994 | Sugimoto et al. |
| 5,368,072 A | 11/1994 | Cote |
| 5,374,395 A | 12/1994 | Robinson et al. |
| 5,379,229 A | 1/1995 | Parsons et al. |
| 5,398,058 A | 3/1995 | Hattori |
| 5,412,534 A | 5/1995 | Cutts et al. |
| 5,414,591 A | 5/1995 | Kimura et al. |
| 5,426,581 A | 6/1995 | Kishi et al. |
| 5,469,037 A | 11/1995 | McMurtrey, Sr. et al. |
| 5,477,416 A | 12/1995 | Schkrohowsky et al. |
| 5,484,012 A | 1/1996 | Hiratsuka |
| 5,486,681 A | 1/1996 | Dagnac et al. |
| 5,491,610 A | 2/1996 | Mok et al. |
| 5,543,727 A | 8/1996 | Bushard et al. |
| 5,546,250 A | 8/1996 | Diel |
| 5,557,186 A | 9/1996 | McMurtrey, Sr. et al. |
| 5,563,768 A | 10/1996 | Perdue |
| 5,570,740 A | 11/1996 | Flores et al. |
| 5,593,380 A | 1/1997 | Bittikofer |
| 5,601,141 A | 2/1997 | Gordon et al. |
| 5,604,662 A | 2/1997 | Anderson et al. |
| 5,610,893 A | 3/1997 | Soga et al. |
| 5,617,430 A | 4/1997 | Angelotti et al. |
| 5,644,705 A | 7/1997 | Stanley |
| 5,646,918 A | 7/1997 | Dimitri et al. |
| 5,654,846 A | 8/1997 | Wicks et al. |
| 5,673,029 A | 9/1997 | Behl et al. |
| 5,694,290 A | 12/1997 | Chang |
| 5,703,843 A | 12/1997 | Katsuyama et al. |
| 5,718,627 A | 2/1998 | Wicks |
| 5,718,628 A | 2/1998 | Nakazato et al. |
| 5,731,928 A | 3/1998 | Jabbari et al. |
| 5,751,549 A | 5/1998 | Eberhardt et al. |
| 5,754,365 A | 5/1998 | Beck et al. |
| 5,761,032 A | 6/1998 | Jones |
| 5,793,610 A | 8/1998 | Schmitt et al. |
| 5,811,678 A | 9/1998 | Hirano |
| 5,812,761 A | 9/1998 | Seki et al. |
| 5,813,817 A | 9/1998 | Matsumiya et al. |
| 5,819,842 A | 10/1998 | Potter et al. |
| 5,831,525 A | 11/1998 | Harvey |
| 5,851,143 A | 12/1998 | Hamid |
| 5,859,409 A | 1/1999 | Kim et al. |
| 5,859,540 A | 1/1999 | Fukumoto |
| 5,862,037 A | 1/1999 | Behl |
| 5,870,630 A | 2/1999 | Reasoner et al. |
| 5,886,639 A | 3/1999 | Behl et al. |
| 5,890,959 A | 4/1999 | Pettit et al. |
| 5,892,367 A | 4/1999 | Magee et al. |
| 5,912,799 A | 6/1999 | Grouell et al. |
| 5,913,926 A | 6/1999 | Anderson et al. |
| 5,914,856 A | 6/1999 | Morton et al. |
| 5,927,386 A | 7/1999 | Lin |
| 5,955,877 A | 9/1999 | Farnworth et al. |
| 5,956,301 A | 9/1999 | Dimitri et al. |
| 5,959,834 A | 9/1999 | Chang |
| 5,999,356 A | 12/1999 | Dimitri et al. |
| 5,999,365 A | 12/1999 | Hasegawa et al. |
| 6,000,623 A | 12/1999 | Blatti et al. |
| 6,005,404 A | 12/1999 | Cochran et al. |
| 6,005,770 A | 12/1999 | Schmitt |
| 6,008,636 A | 12/1999 | Miller et al. |
| 6,008,984 A | 12/1999 | Cunningham et al. |
| 6,011,689 A | 1/2000 | Wrycraft |
| 6,031,717 A | 2/2000 | Baddour et al. |
| 6,034,870 A | 3/2000 | Osborn et al. |
| 6,042,348 A | 3/2000 | Aakalu et al. |
| 6,045,113 A | 4/2000 | Itakura |
| 6,055,814 A | 5/2000 | Song |
| 6,066,822 A | 5/2000 | Nemoto et al. |
| 6,067,225 A | 5/2000 | Reznikov et al. |
| 6,069,792 A | 5/2000 | Nelik |
| 6,084,768 A | 7/2000 | Bolognia |
| 6,094,342 A | 7/2000 | Dague et al. |
| 6,104,607 A | 8/2000 | Behl |
| 6,107,813 A | 8/2000 | Sinsheimer et al. |
| 6,115,250 A | 9/2000 | Schmitt |
| 6,122,131 A | 9/2000 | Jeppson |
| 6,122,232 A | 9/2000 | Schell et al. |
| 6,124,707 A | 9/2000 | Kim et al. |
| 6,129,428 A | 10/2000 | Helwig et al. |
| 6,130,817 A | 10/2000 | Flotho et al. |
| 6,144,553 A | 11/2000 | Hileman et al. |
| 6,166,901 A | 12/2000 | Gamble et al. |
| 6,169,413 B1 | 1/2001 | Paek et al. |
| 6,169,930 B1 | 1/2001 | Blachek et al. |
| 6,177,805 B1 | 1/2001 | Pih |
| 6,178,835 B1 | 1/2001 | Orriss et al. |
| 6,181,557 B1 | 1/2001 | Gatti |
| 6,185,065 B1 | 2/2001 | Hasegawa et al. |
| 6,185,097 B1 | 2/2001 | Behl |
| 6,188,191 B1 | 2/2001 | Frees et al. |
| 6,192,282 B1 | 2/2001 | Smith et al. |
| 6,193,339 B1 | 2/2001 | Behl et al. |
| 6,209,842 B1 | 4/2001 | Anderson et al. |
| 6,227,516 B1 | 5/2001 | Webster, Jr. et al. |
| 6,229,275 B1 | 5/2001 | Yamamoto |
| 6,231,145 B1 | 5/2001 | Liu |
| 6,233,148 B1 | 5/2001 | Shen |
| 6,236,563 B1 | 5/2001 | Buican et al. |
| 6,247,944 B1 | 6/2001 | Bolognia et al. |
| 6,249,824 B1 | 6/2001 | Henrichs |
| 6,252,769 B1 | 6/2001 | Tullstedt et al. |

(56) References Cited

U.S. PATENT DOCUMENTS

| | | |
|---|---|---|
| 6,262,863 B1 | 7/2001 | Ostwald et al. |
| 6,272,007 B1 | 8/2001 | Kitlas et al. |
| 6,272,767 B1 | 8/2001 | Botruff et al. |
| 6,281,677 B1 | 8/2001 | Cosci et al. |
| 6,282,501 B1 | 8/2001 | Assouad |
| 6,285,524 B1 | 9/2001 | Boigenzahn et al. |
| 6,289,678 B1 | 9/2001 | Pandolfi |
| 6,297,950 B1 | 10/2001 | Erwin |
| 6,298,672 B1 | 10/2001 | Valicoff, Jr. |
| 6,302,714 B1 | 10/2001 | Bolognia et al. |
| 6,304,839 B1 | 10/2001 | Ho et al. |
| 6,307,386 B1 | 10/2001 | Fowler et al. |
| 6,327,150 B1 | 12/2001 | Levy et al. |
| 6,330,154 B1 | 12/2001 | Fryers et al. |
| 6,351,379 B1 | 2/2002 | Cheng |
| 6,354,792 B1 | 3/2002 | Kobayashi et al. |
| 6,356,409 B1 | 3/2002 | Price et al. |
| 6,356,415 B1 | 3/2002 | Kabasawa |
| 6,384,593 B1 | 5/2002 | Kobayashi et al. |
| 6,384,995 B1 | 5/2002 | Smith |
| 6,388,437 B1 | 5/2002 | Wolski et al. |
| 6,388,875 B1 | 5/2002 | Chen |
| 6,388,878 B1 | 5/2002 | Chang |
| 6,389,225 B1 | 5/2002 | Malinoski et al. |
| 6,390,756 B1 | 5/2002 | Isaacs et al. |
| 6,411,584 B2 | 6/2002 | Davis et al. |
| 6,421,236 B1 | 7/2002 | Montoya et al. |
| 6,434,000 B1 | 8/2002 | Pandolfi |
| 6,434,498 B1 | 8/2002 | Ulrich et al. |
| 6,434,499 B1 | 8/2002 | Ulrich et al. |
| 6,464,080 B1 | 10/2002 | Morris et al. |
| 6,467,153 B2 | 10/2002 | Butts et al. |
| 6,473,297 B1 | 10/2002 | Behl et al. |
| 6,473,301 B1 | 10/2002 | Levy et al. |
| 6,476,627 B1 | 11/2002 | Pelissier et al. |
| 6,477,044 B2 | 11/2002 | Foley et al. |
| 6,477,442 B1 | 11/2002 | Valerino, Sr. |
| 6,480,380 B1 | 11/2002 | French et al. |
| 6,480,382 B2 | 11/2002 | Cheng |
| 6,487,071 B1 | 11/2002 | Tata et al. |
| 6,489,793 B2 | 12/2002 | Jones et al. |
| 6,494,663 B2 | 12/2002 | Ostwald et al. |
| 6,525,933 B2 | 2/2003 | Eland |
| 6,526,841 B1 | 3/2003 | Wanek et al. |
| 6,535,384 B2 | 3/2003 | Huang |
| 6,537,013 B2 | 3/2003 | Emberty et al. |
| 6,544,309 B1 | 4/2003 | Hoefer et al. |
| 6,546,445 B1 | 4/2003 | Hayes |
| 6,553,532 B1 | 4/2003 | Aoki |
| 6,560,107 B1 | 5/2003 | Beck et al. |
| 6,565,163 B2 | 5/2003 | Behl et al. |
| 6,566,859 B2 | 5/2003 | Wolski et al. |
| 6,567,266 B2 | 5/2003 | Ives et al. |
| 6,568,770 B2 | 5/2003 | Gonska et al. |
| 6,570,734 B2 | 5/2003 | Ostwald et al. |
| 6,577,586 B1 | 6/2003 | Yang et al. |
| 6,577,687 B2 | 6/2003 | Hall et al. |
| 6,618,254 B2 | 9/2003 | Ives |
| 6,626,846 B2 | 9/2003 | Spencer |
| 6,628,518 B2 | 9/2003 | Behl et al. |
| 6,635,115 B1 | 10/2003 | Fairbairn et al. |
| 6,640,235 B1 | 10/2003 | Anderson |
| 6,644,982 B1 | 11/2003 | Ondricek et al. |
| 6,651,192 B1 | 11/2003 | Viglione et al. |
| 6,654,240 B1 | 11/2003 | Tseng et al. |
| 6,679,128 B2 | 1/2004 | Wanek et al. |
| 6,693,757 B2 | 2/2004 | Hayakawa et al. |
| 6,736,583 B2 | 5/2004 | Ostwald et al. |
| 6,741,529 B2 | 5/2004 | Getreuer |
| 6,746,648 B1 | 6/2004 | Mattila et al. |
| 6,751,093 B1 | 6/2004 | Hsu et al. |
| 6,791,785 B1 | 9/2004 | Messenger et al. |
| 6,791,799 B2 | 9/2004 | Fletcher |
| 6,798,651 B2 | 9/2004 | Syring et al. |
| 6,798,972 B1 | 9/2004 | Ito et al. |
| 6,801,834 B1 | 10/2004 | Konshak et al. |
| 6,806,700 B2 | 10/2004 | Wanek et al. |
| 6,808,353 B2 | 10/2004 | Ostwald et al. |
| 6,811,427 B2 | 11/2004 | Garrett et al. |
| 6,826,046 B1 | 11/2004 | Muncaster et al. |
| 6,830,372 B2 | 12/2004 | Liu et al. |
| 6,832,929 B2 | 12/2004 | Garrett et al. |
| 6,838,051 B2 | 1/2005 | Marquiss et al. |
| 6,861,861 B2 | 3/2005 | Song et al. |
| 6,862,173 B1 | 3/2005 | Konshak et al. |
| 6,867,939 B2 | 3/2005 | Katahara et al. |
| 6,892,328 B2 | 5/2005 | Klein et al. |
| 6,904,479 B2 | 6/2005 | Hall et al. |
| 6,908,330 B2 | 6/2005 | Garrett et al. |
| 6,928,336 B2 | 8/2005 | Peshkin et al. |
| 6,937,432 B2 | 8/2005 | Sri-Jayantha et al. |
| 6,957,291 B2 | 10/2005 | Moon et al. |
| 6,965,811 B2 | 11/2005 | Dickey et al. |
| 6,974,017 B2 | 12/2005 | Oseguera |
| 6,976,190 B1 | 12/2005 | Goldstone |
| 6,980,381 B2 | 12/2005 | Gray et al. |
| 6,982,872 B2 | 1/2006 | Behl et al. |
| 7,006,325 B2 | 2/2006 | Emberty et al. |
| 7,013,198 B2 | 3/2006 | Haas |
| 7,021,883 B1 | 4/2006 | Plutt et al. |
| 7,039,924 B2 | 5/2006 | Goodman et al. |
| 7,054,150 B2 | 5/2006 | Orriss et al. |
| 7,070,323 B2 | 7/2006 | Wanek et al. |
| 7,076,391 B1 | 7/2006 | Pakzad et al. |
| 7,077,614 B1 | 7/2006 | Hasper et al. |
| 7,088,541 B2 | 8/2006 | Orriss et al. |
| 7,092,251 B1 | 8/2006 | Henry |
| 7,106,582 B2 | 9/2006 | Albrecht et al. |
| 7,123,477 B2 | 10/2006 | Coglitore et al. |
| 7,126,777 B2 | 10/2006 | Flechsig et al. |
| 7,130,138 B2 | 10/2006 | Lum et al. |
| 7,134,553 B2 | 11/2006 | Stephens |
| 7,139,145 B1 | 11/2006 | Archibald et al. |
| 7,164,579 B2 | 1/2007 | Muncaster et al. |
| 7,167,360 B2 | 1/2007 | Inoue et al. |
| 7,181,458 B1 | 2/2007 | Higashi |
| 7,203,021 B1 | 4/2007 | Ryan et al. |
| 7,203,060 B2 | 4/2007 | Kay et al. |
| 7,206,201 B2 | 4/2007 | Behl et al. |
| 7,216,968 B2 | 5/2007 | Smith et al. |
| 7,219,028 B2 | 5/2007 | Bae et al. |
| 7,219,273 B2 | 5/2007 | Fisher et al. |
| 7,227,746 B2 | 6/2007 | Tanaka et al. |
| 7,232,101 B2 | 6/2007 | Wanek et al. |
| 7,243,043 B2 | 7/2007 | Shin |
| 7,248,467 B2 | 7/2007 | Sri-Jayantha et al. |
| 7,259,966 B2 | 8/2007 | Connelly, Jr. et al. |
| 7,273,344 B2 | 9/2007 | Ostwald et al. |
| 7,280,353 B2 | 10/2007 | Wendel et al. |
| 7,289,885 B2 | 10/2007 | Basham et al. |
| 7,304,855 B1 | 12/2007 | Milligan et al. |
| 7,315,447 B2 | 1/2008 | Inoue et al. |
| 7,349,205 B2 | 3/2008 | Hall et al. |
| 7,353,524 B1 | 4/2008 | Lin et al. |
| 7,385,385 B2 | 6/2008 | Magliocco et al. |
| 7,395,133 B2 | 7/2008 | Lowe |
| 7,403,451 B2 | 7/2008 | Goodman et al. |
| 7,421,623 B2 | 9/2008 | Haugh |
| 7,437,212 B2 | 10/2008 | Farchmin et al. |
| 7,447,011 B2 | 11/2008 | Wade et al. |
| 7,457,112 B2 | 11/2008 | Fukuda et al. |
| 7,467,024 B2 | 12/2008 | Flitsch |
| 7,476,362 B2 | 1/2009 | Angros |
| 7,483,269 B1 | 1/2009 | Marvin, Jr. et al. |
| 7,505,264 B2 | 3/2009 | Hall et al. |
| 7,554,811 B2 | 6/2009 | Scicluna et al. |
| 7,568,122 B2 | 7/2009 | Mechalke et al. |
| 7,570,455 B2 | 8/2009 | Deguchi et al. |
| 7,573,715 B2 | 8/2009 | Mojaver et al. |
| 7,584,851 B2 | 9/2009 | Hong et al. |
| 7,612,996 B2 | 11/2009 | Atkins et al. |
| 7,625,027 B2 | 12/2009 | Kiaie et al. |
| 7,630,196 B2 | 12/2009 | Hall et al. |
| 7,635,246 B2 | 12/2009 | Neeper et al. |

(56) References Cited

U.S. PATENT DOCUMENTS

| | | |
|---|---|---|
| 7,643,289 B2 | 1/2010 | Ye et al. |
| 7,646,596 B2 | 1/2010 | Ng |
| 7,729,107 B2 | 6/2010 | Atkins et al. |
| 7,778,031 B1 | 8/2010 | Merrow et al. |
| 7,789,267 B2 | 9/2010 | Hutchinson et al. |
| 7,848,106 B2 | 12/2010 | Merrow |
| 7,890,207 B2 | 2/2011 | Toscano et al. |
| 7,904,211 B2 | 3/2011 | Merrow et al. |
| 7,908,029 B2 | 3/2011 | Slocum, III |
| 7,911,778 B2 | 3/2011 | Merrow |
| 7,920,380 B2 | 4/2011 | Merrow et al. |
| 7,929,303 B1 | 4/2011 | Merrow |
| 7,932,734 B2 | 4/2011 | Merrow et al. |
| 7,940,529 B2 | 5/2011 | Merrow et al. |
| 7,945,424 B2 | 5/2011 | Garcia et al. |
| 7,987,018 B2 | 7/2011 | Polyakov et al. |
| 7,995,349 B2 | 8/2011 | Merrow et al. |
| 7,996,174 B2 | 8/2011 | Garcia et al. |
| 8,041,449 B2 | 10/2011 | Noble et al. |
| 8,086,343 B2 | 12/2011 | Slocum, III |
| 8,095,234 B2 | 1/2012 | Polyakov et al. |
| 8,102,173 B2 | 1/2012 | Merrow |
| 8,116,079 B2 | 2/2012 | Merrow |
| 8,117,480 B2 | 2/2012 | Merrow et al. |
| 8,140,182 B2 | 3/2012 | Noble et al. |
| 8,160,739 B2 | 4/2012 | Toscano et al. |
| 8,238,099 B2 | 8/2012 | Merrow |
| 8,279,603 B2 | 10/2012 | Merrow et al. |
| 8,305,751 B2 | 11/2012 | Merrow |
| 8,318,512 B2 | 11/2012 | Shah et al. |
| 8,405,971 B2 | 3/2013 | Merrow et al. |
| 8,466,699 B2 | 6/2013 | Merrow et al. |
| 8,467,180 B2 | 6/2013 | Merrow et al. |
| 8,482,915 B2 | 7/2013 | Merrow |
| 8,499,611 B2 | 8/2013 | Merrow et al. |
| 8,547,123 B2 | 10/2013 | Merrow et al. |
| 8,549,912 B2 | 10/2013 | Merrow et al. |
| 8,628,239 B2 | 1/2014 | Merrow et al. |
| 8,631,698 B2 | 1/2014 | Merrow et al. |
| 8,655,482 B2 | 2/2014 | Merrow |
| 8,687,349 B2 | 4/2014 | Truebenbach |
| 8,687,356 B2 | 4/2014 | Merrow |
| 8,926,196 B2 | 1/2015 | Detofsky et al. |
| 9,196,518 B1 | 11/2015 | Hofmeister et al. |
| 9,459,312 B2 | 10/2016 | Arena et al. |
| 2001/0006453 A1 | 7/2001 | Glorioso et al. |
| 2001/0044023 A1 | 11/2001 | Johnson et al. |
| 2001/0046118 A1 | 11/2001 | Yamanashi et al. |
| 2001/0048590 A1 | 12/2001 | Behl et al. |
| 2002/0009391 A1 | 1/2002 | Marquiss et al. |
| 2002/0026258 A1* | 2/2002 | Suzuki .................. B65G 57/04 700/112 |
| 2002/0030981 A1 | 3/2002 | Sullivan et al. |
| 2002/0044416 A1 | 4/2002 | Harmon et al. |
| 2002/0051338 A1 | 5/2002 | Jiang et al. |
| 2002/0071248 A1 | 6/2002 | Huang et al. |
| 2002/0079422 A1 | 6/2002 | Jiang |
| 2002/0090320 A1 | 7/2002 | Burow et al. |
| 2002/0116087 A1 | 8/2002 | Brown |
| 2002/0161971 A1 | 10/2002 | Dimitri et al. |
| 2002/0172004 A1 | 11/2002 | Ives et al. |
| 2003/0035271 A1 | 2/2003 | Lelong et al. |
| 2003/0043550 A1 | 3/2003 | Ives |
| 2003/0206397 A1 | 11/2003 | Allgeyer et al. |
| 2004/0165489 A1 | 8/2004 | Goodman et al. |
| 2004/0230399 A1 | 11/2004 | Shin |
| 2004/0236465 A1 | 11/2004 | Butka et al. |
| 2004/0251866 A1 | 12/2004 | Gan et al. |
| 2004/0264121 A1 | 12/2004 | Orriss et al. |
| 2005/0004703 A1 | 1/2005 | Christie |
| 2005/0010836 A1 | 1/2005 | Bae et al. |
| 2005/0012498 A1 | 1/2005 | Lee et al. |
| 2005/0018397 A1 | 1/2005 | Kay et al. |
| 2005/0055601 A1 | 3/2005 | Wilson et al. |
| 2005/0057849 A1 | 3/2005 | Twogood et al. |
| 2005/0069400 A1 | 3/2005 | Dickey et al. |
| 2005/0109131 A1 | 5/2005 | Wanek et al. |
| 2005/0116702 A1 | 6/2005 | Wanek et al. |
| 2005/0131578 A1 | 6/2005 | Weaver |
| 2005/0179457 A1 | 8/2005 | Min et al. |
| 2005/0207059 A1 | 9/2005 | Cochrane |
| 2005/0219809 A1 | 10/2005 | Muncaster et al. |
| 2005/0225338 A1 | 10/2005 | Sands et al. |
| 2005/0270737 A1 | 12/2005 | Wilson et al. |
| 2006/0010353 A1 | 1/2006 | Haugh |
| 2006/0023331 A1 | 2/2006 | Flechsig et al. |
| 2006/0028802 A1 | 2/2006 | Shaw et al. |
| 2006/0035563 A1* | 2/2006 | Kalenian .................. B24B 37/30 451/5 |
| 2006/0066974 A1 | 3/2006 | Akamatsu et al. |
| 2006/0130316 A1 | 6/2006 | Takase et al. |
| 2006/0190205 A1 | 8/2006 | Klein et al. |
| 2006/0227517 A1 | 10/2006 | Zayas et al. |
| 2006/0250766 A1 | 11/2006 | Blaalid et al. |
| 2007/0034368 A1 | 2/2007 | Atkins et al. |
| 2007/0035874 A1 | 2/2007 | Wendel et al. |
| 2007/0035875 A1 | 2/2007 | Hall et al. |
| 2007/0053154 A1 | 3/2007 | Fukuda et al. |
| 2007/0082907 A1 | 4/2007 | Canada et al. |
| 2007/0127202 A1 | 6/2007 | Scicluna et al. |
| 2007/0127206 A1 | 6/2007 | Wade et al. |
| 2007/0152655 A1 | 7/2007 | Ham et al. |
| 2007/0183871 A1 | 8/2007 | Hofmeister et al. |
| 2007/0185676 A1 | 8/2007 | Ding et al. |
| 2007/0195497 A1 | 8/2007 | Atkins |
| 2007/0248142 A1 | 10/2007 | Rountree et al. |
| 2007/0253157 A1 | 11/2007 | Atkins et al. |
| 2007/0286045 A1 | 12/2007 | Onagi et al. |
| 2008/0007865 A1 | 1/2008 | Orriss et al. |
| 2008/0030945 A1 | 2/2008 | Mojaver et al. |
| 2008/0112075 A1 | 5/2008 | Farquhar et al. |
| 2008/0239564 A1 | 10/2008 | Farquhar et al. |
| 2008/0282275 A1 | 11/2008 | Zaczek et al. |
| 2008/0282278 A1 | 11/2008 | Barkley |
| 2008/0317575 A1 | 12/2008 | Yamazaki et al. |
| 2009/0028669 A1 | 1/2009 | Rebstock |
| 2009/0082907 A1 | 3/2009 | Stuvel et al. |
| 2009/0122443 A1 | 5/2009 | Farquhar et al. |
| 2009/0142169 A1 | 6/2009 | Garcia et al. |
| 2009/0153992 A1 | 6/2009 | Garcia et al. |
| 2009/0153993 A1 | 6/2009 | Garcia et al. |
| 2009/0153994 A1 | 6/2009 | Merrow et al. |
| 2009/0175705 A1 | 7/2009 | Nakao et al. |
| 2009/0261047 A1 | 10/2009 | Merrow |
| 2009/0261228 A1 | 10/2009 | Merrow |
| 2009/0261229 A1 | 10/2009 | Merrow |
| 2009/0262444 A1 | 10/2009 | Polyakov et al. |
| 2009/0262445 A1 | 10/2009 | Noble et al. |
| 2009/0262454 A1 | 10/2009 | Merrow |
| 2009/0262455 A1 | 10/2009 | Merrow |
| 2009/0265032 A1 | 10/2009 | Toscano et al. |
| 2009/0265043 A1 | 10/2009 | Merrow et al. |
| 2009/0265136 A1 | 10/2009 | Garcia et al. |
| 2009/0297328 A1 | 12/2009 | Slocum, III |
| 2010/0074404 A1 | 3/2010 | Ito |
| 2010/0083732 A1 | 4/2010 | Merrow et al. |
| 2010/0165498 A1 | 7/2010 | Merrow et al. |
| 2010/0165501 A1 | 7/2010 | Polyakov et al. |
| 2010/0168906 A1 | 7/2010 | Toscano et al. |
| 2010/0172722 A1 | 7/2010 | Noble et al. |
| 2010/0193661 A1 | 8/2010 | Merrow |
| 2010/0194253 A1 | 8/2010 | Merrow et al. |
| 2010/0195236 A1 | 8/2010 | Merrow et al. |
| 2010/0230885 A1 | 9/2010 | Di Stefano |
| 2010/0249993 A1* | 9/2010 | Mitsuyoshi ....... H01L 21/67742 700/228 |
| 2010/0265609 A1 | 10/2010 | Merrow et al. |
| 2010/0265610 A1 | 10/2010 | Merrow et al. |
| 2010/0279439 A1 | 11/2010 | Shah et al. |
| 2010/0302678 A1 | 12/2010 | Merrow |
| 2011/0011844 A1 | 1/2011 | Merrow et al. |
| 2011/0012631 A1 | 1/2011 | Merrow et al. |
| 2011/0012632 A1 | 1/2011 | Merrow et al. |
| 2011/0013362 A1 | 1/2011 | Merrow et al. |

(56) References Cited

U.S. PATENT DOCUMENTS

| | | | |
|---|---|---|---|
| 2011/0013665 A1 | 1/2011 | Merrow et al. | |
| 2011/0013666 A1 | 1/2011 | Merrow et al. | |
| 2011/0013667 A1 | 1/2011 | Merrow et al. | |
| 2011/0064546 A1 | 3/2011 | Merrow | |
| 2011/0074458 A1* | 3/2011 | Di Stefano | G01R 1/0466 324/757.01 |
| 2011/0157825 A1 | 6/2011 | Merrow et al. | |
| 2011/0172807 A1 | 7/2011 | Merrow | |
| 2011/0185811 A1 | 8/2011 | Merrow et al. | |
| 2011/0189934 A1 | 8/2011 | Merrow | |
| 2011/0236163 A1 | 9/2011 | Smith et al. | |
| 2011/0261483 A1 | 10/2011 | Campbell et al. | |
| 2011/0305132 A1 | 12/2011 | Merrow et al. | |
| 2011/0310724 A1 | 12/2011 | Martino | |
| 2012/0023370 A1 | 1/2012 | Truebenbach | |
| 2012/0034054 A1 | 2/2012 | Polyakov et al. | |
| 2012/0050903 A1 | 3/2012 | Campbell et al. | |
| 2012/0106351 A1 | 5/2012 | Gohel et al. | |
| 2012/0321435 A1 | 12/2012 | Truebenbach | |
| 2013/0071224 A1 | 3/2013 | Merrow et al. | |
| 2013/0108253 A1 | 5/2013 | Akers et al. | |
| 2013/0181576 A1* | 7/2013 | Shiozawa | H02N 2/0095 310/323.17 |
| 2013/0200915 A1 | 8/2013 | Panagas | |
| 2013/0256967 A1 | 10/2013 | Carvalho | |
| 2014/0093214 A1 | 4/2014 | Detofsky et al. | |
| 2014/0271064 A1 | 9/2014 | Merrow et al. | |
| 2014/0306728 A1 | 10/2014 | Arena et al. | |
| 2017/0059635 A1 | 3/2017 | Orchanian et al. | |
| 2019/0064252 A1 | 2/2019 | Bowyer et al. | |
| 2019/0064254 A1 | 2/2019 | Bowyer et al. | |
| 2019/0064305 A1 | 2/2019 | Khalid | |

FOREIGN PATENT DOCUMENTS

| | | |
|---|---|---|
| CN | 1177187 A | 3/1998 |
| CN | 1192544 A | 9/1998 |
| CN | 2341188 Y | 9/1999 |
| DE | 3786944 T2 | 11/1993 |
| DE | 69111634 T2 | 5/1996 |
| DE | 69400145 T2 | 10/1996 |
| DE | 19701548 A1 | 8/1997 |
| DE | 19804813 A1 | 9/1998 |
| DE | 69614460 T2 | 6/2002 |
| DE | 69626584 T2 | 12/2003 |
| DE | 19861388 B4 | 8/2007 |
| EP | 0210497 A2 | 2/1987 |
| EP | 0242970 A2 | 10/1987 |
| EP | 0 277 634 A2 | 8/1988 |
| EP | 0356977 A2 | 3/1990 |
| EP | 0442642 A2 | 8/1991 |
| EP | 0466073 A2 | 1/1992 |
| EP | 582017 A1 | 2/1994 |
| EP | 0617570 A1 | 9/1994 |
| EP | 0635836 A1 | 1/1995 |
| EP | 741508 A2 | 11/1996 |
| EP | 0757320 A2 | 2/1997 |
| EP | 0757351 A2 | 2/1997 |
| EP | 0776009 A2 | 5/1997 |
| EP | 0840476 A2 | 5/1998 |
| EP | 1 045 301 A2 | 10/2000 |
| EP | 1209557 A2 | 5/2002 |
| EP | 1234308 A1 | 8/2002 |
| EP | 1422713 A2 | 5/2004 |
| EP | 1612798 A1 | 1/2006 |
| EP | 1760722 A1 | 3/2007 |
| GB | 2241118 A | 8/1991 |
| GB | 2276275 A | 9/1994 |
| GB | 2299436 A | 10/1996 |
| GB | 2312984 A | 11/1997 |
| GB | 2328782 A | 3/1999 |
| GB | 2439844 A | 1/2008 |
| JP | 61-115279 | 6/1986 |
| JP | 62-177621 | 8/1987 |
| JP | 62-239394 | 10/1987 |
| JP | 62-251915 | 11/1987 |
| JP | 63-002160 | 1/1988 |
| JP | 63-016482 | 1/1988 |
| JP | 63-062057 | 3/1988 |
| JP | 63-201946 | 8/1988 |
| JP | 63-004483 | 9/1988 |
| JP | 63-214972 | 9/1988 |
| JP | 63-269376 | 11/1988 |
| JP | S63-195697 U | 12/1988 |
| JP | 64-089034 | 4/1989 |
| JP | 2-091565 | 3/1990 |
| JP | 2-098197 | 4/1990 |
| JP | 2-185784 | 7/1990 |
| JP | 2-199690 | 8/1990 |
| JP | 2-278375 | 11/1990 |
| JP | 2-297770 | 12/1990 |
| JP | 3-078160 B2 | 4/1991 |
| JP | 3-105704 B2 | 5/1991 |
| JP | H05-319520 A | 12/1993 |
| JP | 6-004220 | 1/1994 |
| JP | 6-004981 | 1/1994 |
| JP | 6-162645 | 6/1994 |
| JP | 6-181561 | 6/1994 |
| JP | 6-215515 | 8/1994 |
| JP | 6-274943 | 9/1994 |
| JP | 6-314173 | 11/1994 |
| JP | 7-007321 | 1/1995 |
| JP | 7-029364 | 1/1995 |
| JP | H07-010212 A | 1/1995 |
| JP | 7-037376 | 2/1995 |
| JP | 7-056654 | 3/1995 |
| JP | 7-111078 | 4/1995 |
| JP | 7-115497 | 5/1995 |
| JP | 7-201082 | 8/1995 |
| JP | 7-226023 | 8/1995 |
| JP | 7-230669 | 8/1995 |
| JP | 7-257525 | 10/1995 |
| JP | 1982246 | 10/1995 |
| JP | 7-307059 | 11/1995 |
| JP | 8007994 | 1/1996 |
| JP | 8-030398 | 2/1996 |
| JP | 8-030407 | 2/1996 |
| JP | 8-079672 | 3/1996 |
| JP | 8-106776 | 4/1996 |
| JP | 8-110821 | 4/1996 |
| JP | 8-167231 | 6/1996 |
| JP | 8-212015 | 8/1996 |
| JP | 8-244313 | 9/1996 |
| JP | 8-263525 | 10/1996 |
| JP | 8-263909 | 10/1996 |
| JP | 8-297957 | 11/1996 |
| JP | 2553315 B2 | 11/1996 |
| JP | 9-044445 | 2/1997 |
| JP | 9-064571 | 3/1997 |
| JP | 9-082081 | 3/1997 |
| JP | 2635127 B2 | 7/1997 |
| JP | 9-306094 | 11/1997 |
| JP | H09-319466 A | 12/1997 |
| JP | 10-040021 | 2/1998 |
| JP | 10-049365 | 2/1998 |
| JP | 10-064173 | 3/1998 |
| JP | 10-098521 | 4/1998 |
| JP | 2771297 B2 | 7/1998 |
| JP | 10-275137 | 10/1998 |
| JP | 10-281799 | 10/1998 |
| JP | 10-320128 | 12/1998 |
| JP | 10-340139 | 12/1998 |
| JP | 2862679 B2 | 3/1999 |
| JP | 11-134852 | 5/1999 |
| JP | 11-139839 | 5/1999 |
| JP | 2906930 B2 | 6/1999 |
| JP | 11-203201 | 7/1999 |
| JP | 11-213182 | 8/1999 |
| JP | 11-327800 | 11/1999 |
| JP | 11-353128 | 12/1999 |
| JP | 11-353129 | 12/1999 |
| JP | 3-008086 B2 | 2/2000 |
| JP | 2000-056935 A | 2/2000 |

(56) References Cited

FOREIGN PATENT DOCUMENTS

| | | |
|---|---|---|
| JP | 2000-066845 A | 3/2000 |
| JP | 2000-112831 A | 4/2000 |
| JP | 2000-113563 A | 4/2000 |
| JP | 2000-114759 A | 4/2000 |
| JP | 2000-125290 A | 4/2000 |
| JP | 2000-132704 A | 5/2000 |
| JP | 2000-149431 A | 5/2000 |
| JP | 3052183 B2 | 6/2000 |
| JP | 2000-228686 A | 8/2000 |
| JP | 2000-235762 A | 8/2000 |
| JP | 2000-236188 A | 8/2000 |
| JP | 2000-242598 A | 9/2000 |
| JP | 2000-278647 A | 10/2000 |
| JP | 3097994 B2 | 10/2000 |
| JP | 2000-305860 A | 11/2000 |
| JP | 2001-005501 A | 1/2001 |
| JP | 2001-023270 A | 1/2001 |
| JP | 2001-100925 A | 4/2001 |
| JP | 3-207947 B2 | 9/2001 |
| JP | 3-210662 B2 | 9/2001 |
| JP | 3-212859 B2 | 9/2001 |
| JP | 3-214490 B2 | 10/2001 |
| JP | 3-240821 B2 | 12/2001 |
| JP | 2002-42446 | 2/2002 |
| JP | 3-295071 B2 | 6/2002 |
| JP | 2007087498 A | 4/2007 |
| JP | 2007-188615 A | 7/2007 |
| JP | 2007-220184 A | 8/2007 |
| JP | 2007-293936 A | 11/2007 |
| JP | 2007-305206 A | 11/2007 |
| JP | 2007-305290 A | 11/2007 |
| JP | 4-017134 B2 | 12/2007 |
| JP | 2007-328761 A | 12/2007 |
| JP | 2008-503824 A | 2/2008 |
| JP | 4-143989 B2 | 9/2008 |
| JP | 4-172658 B2 | 10/2008 |
| JP | 4-214288 B2 | 1/2009 |
| JP | 4-247385 B2 | 4/2009 |
| JP | 4-259956 B2 | 4/2009 |
| JP | 4-307440 B2 | 8/2009 |
| JP | 4-325923 B2 | 9/2009 |
| JP | 5-035053 B2 | 9/2012 |
| JP | 5-035415 B2 | 9/2012 |
| JP | 5-066896 B2 | 11/2012 |
| JP | 5-068257 B2 | 11/2012 |
| JP | 5-073566 B2 | 11/2012 |
| JP | 5-073803 B2 | 11/2012 |
| JP | 5-101603 B2 | 12/2012 |
| JP | 5-173718 B2 | 4/2013 |
| JP | 5-189163 B2 | 4/2013 |
| JP | 5-204725 B2 | 6/2013 |
| JP | 5-223551 B2 | 6/2013 |
| KR | 1998-0035445 A | 8/1998 |
| KR | 10-0176527 | 11/1998 |
| KR | 10-0214308 B1 | 8/1999 |
| KR | 10-0403039 B1 | 10/2003 |
| KR | 10-2007-0024354 A | 3/2007 |
| KR | 10-2013-0111915 A | 10/2013 |
| SG | 45223 A1 | 1/1998 |
| TW | 387574 U | 4/2000 |
| WO | WO-89/01682 A1 | 2/1989 |
| WO | WO-97/06532 A1 | 2/1997 |
| WO | WO-00/49487 A1 | 8/2000 |
| WO | WO-00/67253 A1 | 11/2000 |
| WO | WO-01/09627 A2 | 2/2001 |
| WO | WO-01/41148 A1 | 6/2001 |
| WO | WO-03/013783 A1 | 2/2003 |
| WO | WO-03/021597 A1 | 3/2003 |
| WO | WO-03/021598 A1 | 3/2003 |
| WO | WO-03/067385 A2 | 8/2003 |
| WO | WO-2004/006260 A1 | 1/2004 |
| WO | WO-2004/114286 A1 | 12/2004 |
| WO | WO-2005/024830 A1 | 3/2005 |
| WO | WO-2005/024831 A1 | 3/2005 |
| WO | WO-2005/109131 A1 | 11/2005 |
| WO | WO-2006/030185 A1 | 3/2006 |
| WO | WO-2006/048611 A1 | 5/2006 |
| WO | WO-2006/100441 A1 | 9/2006 |
| WO | WO-2006/100445 A1 | 9/2006 |
| WO | WO-2007/031729 A1 | 3/2007 |

OTHER PUBLICATIONS

U.S. Appl. No. 15/688,073, filed Aug. 28, 2017, Automated Test System Having Multiple Stages.
U.S. Appl. No. 15/688,104, filed Aug. 28, 2017, Automated Test System Employing Robotics.
U.S. Appl. No. 15/688,112, filed Aug. 28, 2017, Calibration Process for an Automated Test System.
International Search Report for PCT/US2018/046734, 4 pages (dated Dec. 11, 2018).
Written Opinion for PCT/US2018/046734, 7 pages (dated Dec. 11, 2018).
Abraham et al., "Thermal Proximity Imaging of Hard-Disk Substrates", IEEE Transactions on Mathematics 36:3997-4004, Nov. 2000.
Abramovitch, "Rejecting Rotational Disturbances on Small Disk Drives Using Rotational Accelerometers", Proceedings of the 1996 IFAC World Congress in San Francisco, CA, 8 pages (Jul. 1996).
Ali et al., "Modeling and Simulation of Hard Disk Drive Final Assembly Using a HDDTemplate" Proceedings of the 2007 Winter Simulation Conference, IEEE pp. 1641-1650 (2007).
Anderson et al., "Clinical chemistry: concepts and applications", The McGraw-Hill Companies, Inc., pp. 131-132, 2003.
Anderson et al., "High Reliability Variable Load Time Controllable Vibration Free Thermal Processing Environment", Delphion, 3 pages (Dec. 1993). hhttps://www.delphion.com/tdbs/tdb?order=93A+63418 (retrieved Mar. 18, 2009).
Asbrand, "Engineers at One Company Share the Pride and the Profits of Successful Product Design", Professional Issues, 4 pages, 1987.
Bair et al., "Measurements of Asperity Temperatures of a Read/Write Head Slider Bearing in Hard Magnetic Recording Disks", Journal of Tribology 113:547-554, Jul. 1991.
Bakken et al., "Low Cost, Rack Mounted, Direct Access Disk Storage Device", Delphion, 2 pages (Mar. 1977). http://www.delphion.com/tdbs/tdb (retrieved Mar. 3, 2005).
Biber et al., "Disk Drive Drawer Thermal Management", Advances in Electronic Packaging vol. 1:43-46, 1995.
Christensen, "How Can Great firms Fail? Insights from the hard Disk Drive Industry", Harvard Business School Press, pp. 1-26, 2006.
Chung et al., "Vibration Absorber for Reduction of the In-plane Vibration in an Optical Disk Drive", IEEE Transactions on Consumer Electronics, Vo. 48, May 2004.
Curtis et al., "InPhase Professional Archive Drive Architecture", InPhase Technologies, Inc., 6 pages (Dec. 17, 2007) http://www.science.edu/TechoftheYear/Nominees/InPhase.
Exhibit 1 in *Xyratex Technology, Ltd v. Teradyne, Inc.*; Newspaper picture that displays the CSO tester; 1990.
Exhibit 1314 in *Xyratex Technology, Ltd V. Teradyne, Inc.*; Case, "Last products of Disk-File Development at Hursley and Millbrook," IBM, Oct. 12, 1990.
Exhibit 1315 in *Xyratex Technology, Ltd V. Teradyne, Inc.*; Case, "History of Disk-File Development at Hursley and Millbrook," IBM, Oct. 17, 1990.
Exhibit 1326 in *Xyratex Technology, Ltd v. Teradyne, Inc.*; Image of the back of Exhibit 1 and Exhibit 2 photos, which display the photos dates; 1990.
Exhibit 2 in *Xyratex Technology, Ltd v. Teradyne, Inc.*; Photos of the CSO tester obtained from Hitachi; 1990.
Findeis et al., "Vibration Isolation Techniques Sutiable for Portable Electronic Speckle Pattern Interferometry", Proc. SPIE vol. 4704, pp. 159-167, 2002 http://www.ndt.uct.ac.za/Paoers/soiendt2002.odf.
FlexStar Technology, "A World of Storage Testing Solutions," http://www.flexstar.com, 1 page (1999).

(56) References Cited

OTHER PUBLICATIONS

FlexStar Technology, "Environment Chamber Products," http://www.flexstar.com, 1 page (1999).
FlexStar Technology, "FlexStar's Family of Products," http://www.flexstar.com, 1 page (1999).
FlexStar Technology, 30E/Cascade Users Manual, Doc #98-36387-00 Rev. 1.8, pp. 1-33, Jun. 1, 2004.
Frankovich, "The Basics of Vibration Isolation Using Elastomeric Materials", Aearo Ear Specialty Composites, 8 pages (2005) http://www.isoloss.com/11dfs/engineering/BasicsoNibrationisolation.
Grochowski et al., "Future Trends in Hard Disk Drives", IEEE Transactions on Magnetics, 32(3): 1850-1854 (May 1996).
Gurumurthi et al., "Disk Drive Roadmap from the Thermal Perspective: A Case for Dynamic Thermal Management", International Symposium on Computer Architecture Proceedings of the 32nd Annual International Symposium on Computer Architecture, Technical Report CSE-05-001, pp. 38-49 (Feb. 2005).
Gurumurthi et al., "Thermal Issues in Disk Drive Design: Challenges and Possible Solutions", ACM Transactions on Storage, 2(1): 41-73 (Feb. 2006).
Gurumurthi, "The Need for temperature-Aware Storage Systems", The Tenth Intersociety conference on Thermal and Thermomechanical Phenomena in Electronics, pp. 387-394, 2006.
Haddad et al., "A new Mounting Adapter for Computer Peripherals with Improved Reliability, Thermal Distribution, Low Noise and Vibration Reduction", ISPS, Advances in Information Storage and Processing Systems, 1:97-108, 1995.
Henderson, "HAD High Aerial Densities Require Solid Test Fixtures", Flexstar Technology, 3 pages (Feb. 26, 2007).
HighBeam Research website "ACT debuts six-zone catalytic gas heater. (American Catalytic Technologies offers new heaters)", 4 pages (Oct. 26, 1998). http://www.highbeam.com.
HighBeam Research website "Asynchronous Testing Increases Throughput", 7 pages (Dec. 1 2000). http://www.highbeam.com.
HighBeam Research website "Credence announces Production Release of the EPRO AQ Series for Integrated Test and Back-end Processing", 4 pages (1995). http://www.highbeam.com.
HighBeam Research website "Test Multiple Parts at Once for Air Leaks. (Brief Article)", 1 page (1999) http://www.highbeam.com.
Iwamiya, "Hard Drive Cooling Using a Thermoelectric Cooler", EEP—vol. 19-2, Advances in Electronic Packaging, vol. 2:2203-2208, ASME 1997.
Johnson et al., "Performance Measurements of Tertiary Storage Devices", Proceedings of the 24th VLDB Conference, New York, pp. 50-61, 1998.
Ku, "Investigation of Hydrodynamic Bearing Friction in Data Storage information System Spindle Motors", ISPSvol. 1, Advances in Information Storage and Processing Systems, pp. 159-165, ASME 1995.
Lindner, "Disk drive mounting", IBM Technical Disclosure Brochure, vol. 16, No. 3, pp. 903-904, Aug. 1973.
Low, Y.L. et al., "Thermal network model for temperature prediction in hard disk drive", Microsyst Technol, 15: 1653-1656 (2009).
McAuley, "Recursive Time Trapping for Synchronization of Product and Chamber Profiles for Stress Test", Delphion, 3 pages (Jun. 1988), https://www.delphion.com/tdbs/tdb, (retrieved Mar. 18, 2009).
Morgenstern, Micropolis Drives Target High-end Apps; Technology Provides Higher Uninterrupted Data Transfer. (Applications; Microdisk AV LS 3020 and 1050AV and I 760AV LT Stackable Hard Drive Systems) (Product Announcement) MacWeek, vol. 8, No. 6, p. 8; Feb. 7, 1994.
Morris, "Zero Cost Power and Cooling Monitor System", 3 pages (Jun. 1994) https://www.delphion.com/tdbs/tdb (retrieved Jan. 15, 2008).
Nagarajan, "Survey of Cleaning and cleanliness Measurement in Disk Drive Manufacture", North Carolina Department of Environment and Natural Resources, Feb. 13-21, 1997.
Park, "Vibration and Noise Reduction of an Optical Disk Drive by Using a Vibration Absorber Methods and Apparatus for Securing Disk Drives in a Disk", IEEE Transactions on Consumer Electronics, vol. 48, Nov. 2002.
Prater et al., "Thermal and Heat-Flow Aspects of Actuators for Hard Disk Drives", InterSociety Conference on Thermal Phenomena, pp. 261-268, 1994.
Ruwart et al., "Performance Impact of External Vibration on Consumer-grade and enterprise-class Disk Drives", Proceedings of the 22nd IEEE/13th Goddard Conference on Mass Storage Systems and Technologies, 2005.
Schroeder et al., "Disk Failures in the Real World: What does an MTTP of 1,000,000 hours mean to you?", In FAST'07: 5th USENIX Conference on File and Storage Technologies, San Jose, CA, Feb. 14-16, 2007.
Schulze et al., "How Reliable is a Raid?," COMPCON Spring apos; 89. Thirty-Fourth IEEE Computer Society International Conference: Intellectual Leverage, Digest of papers; pp. 118-123, Feb. 27-Mar. 3, 1989.
Seagate Product Marketing, "Seagate's Advanced Multidrive System (SAMS) Rotational Vibration Feature", Publication TP-229D, Feb. 2000.
Suwa et al., "Evaluation System for Residual Vibration from HDD Mounting Mechanism" IEEE Transactions on Magnetics, vol. 35, No. 2, pp. 868-873, Mar. 1999.
Suwa et al., "Rotational Vibration Suppressor" IBM Technical Disclosure Bulletin Oct. 1991.
Terwiesch et al., "An Exploratory Study of International Product Transfer and Production Ramp-Up in the Data Storage Industry", The Information Storage Industry Center, University of California, pp. 1-31, 1999. www-iros.ucsd.edu/sloan/.
Tzeng, "Dynamic Torque Characteristics of Disk-Drive Spindle Bearings", ISPS—vol. 1, Advances in Information Storage and Processing Systems, pp. 57-63, ASME 1995.
Tzeng, "Measurements of Transient Thermal Strains in a Disk-Drive Actuator", InterSociety conference on Thermal Phenomena, pp. 269-274, 1994.
Wilson—7000 disk Drive Analyzer Product Literature, date accessed Jan. 28, 2009, 2 pages.
Winchester, "Automation Specialists Use Machine Vision as a System Development Tool", IEE Computing & Control Engineering, Jun./Jul. 2003.
Xyratex Product Test brochure, "Automated Production Test Solutions", 2006.
*Xyratex Technology, Ltd. V. Teradyne, Inc.*, Amended Joint Trial Exhibit List of Xyratex and Teradyne. Case No. CV 08-04545 SJO (PLAx), Nov. 12, 2009.
*Xyratex Technology, Ltd. V. Teradyne, Inc.*, Teradyne, Inc's Prior Art Notice Pursuant to 35; U.S.C. Section 282. Case No. CV 08-04545 SJO (PLAx), Oct. 16, 2009.
Xyratex to Debut its New Automated Test Solution for 2.5-Inch Disk Drives at DISKCON USA 2004, PR Newswire Europe (2004).
Xyratex, "Continuous Innovation—Production Test Systems" www.xyratex.com/Products/production-test-system (1995-2008).
Xyratex, "Key Advantages—Production Test Systems" www.xyratex.com/Products/production-test-system (1995-2008).
Xyratex, "Process Challenges in the Hard Drive Industry" slide presentation, Asian Diskcon (2006).
Xyratex, "Production Test Systems" www.xyratex.com/Products/production-test-system (1995-2008).
Xyratex, "Single cell—Production Test Systems" www.xyratex.com/Products/production-test-system (1995-2008).
Xyratex, "Storage Infrastructure" www.xyratex.com/Products/storage-infrastructure/default.aspx (1995-2008).
Xyratex, "Testing Drives Colder—Production Test Systems" www.xyratex.com/Products/production-test-system (1995-2008).
U.S. Appl. No. 16/105,179, filed Aug. 20, 2018, Carrier-Based Test System.
International Preliminary Report on Patentability for PCT/US2018/046734, 8 pages (dated Mar. 13, 2020).

\* cited by examiner

AUTOMATED TEST SYSTEM EMPLOYING ROBOTICS

TECHNICAL FIELD

This specification relates generally to automated test systems and components thereof.

BACKGROUND

System-level testing (SLT) involves testing an entire device, rather than individual components of the device. If the device passes a battery of system-level tests, it is assumed that the individual components of the device are operating properly. SLT has become more prevalent as the complexity of, and number of components in, devices have increased. For example, a chip-implemented system, such as an application-level integrated circuit (ASIC), may be tested on a system level in order to determine that components that comprise the system are functioning correctly.

SLT systems have traditionally required large footprints in order to provide sufficient testing speed and throughput. For example, some SLT systems can occupy spaces measured in dozens of square meters.

SUMMARY

An example test system comprises robotics configured to operate on devices at a first level of precision, and stages configured to operate at levels of precision that are less than the first level of precision. Each of the stages may comprise parallel paths that are configured to pass the devices between adjacent stages. The example test system may comprise one or more of the following features, either alone or in combination.

The example test system may comprise a test carrier comprising a test socket for holding a device under test. The stages may comprise: a test rack comprising a test slot; a test arm configured to receive the test carrier, to flip the test carrier, to rotate the test carrier, and to push the test carrier into the test slot following rotating the test carrier, with the test arm comprising a pusher that is air-controlled to extend and thereby push the test carrier into the test slot; and a pneumatic system to deliver air to the pusher to push the test carrier. The pneumatic system may comprise at least one rotary cable that is configured to deliver both air to move the pusher and to transmit electrical signals to and from the test arm. The at least one rotary cable may comprise an electrical conduit surrounded by tubing, with the tubing being connected to an air source to pass the air to the pusher. The pusher may comprise a head that is configured to engage a member on the carrier to push the carrier.

The test carrier may be first test carrier. The pusher may be configured to engage a member of a second test carrier in the test slot prior to rotating the test carrier. The second test carrier may comprise release buttons to engage to release the second test carrier from the test slot. The test arm may comprise air-controlled extenders to engage the release buttons. A port may be controllable to travel at least partway along the test arm to connect to an air hose located proximate to the pusher. The air-controlled extenders may be configured to receive air from the air hose following connection, and to extend outwardly in response to receipt of the air to engage the release buttons.

The test arm may be configured to move in a direction that has a vertical component relative to ground in order to cause the pusher to engage a member on the second test carrier. The pusher may be configured to retract following engaging the member and following the air-controlled extenders engaging the release buttons. The pusher may retract to cause the second test carrier to leave the test slot. The test arm may be configured to hold the second test carrier on one side of the test arm, and to rotate following retracting thereby positioning the first test carrier for pushing into the test slot. Following pushing the test carrier into the test slot, the test arm may be configured to flip and to rotate to reach a position to receive another test carrier. The rotary cable may have a diameter that changes based on flipping of the test arm.

In the example test system, the stages may comprise a device shuttle to transport devices; the robotics may comprise a robot to move the devices between the test carrier and the device shuttle; the device shuttle may be configured to move, towards a stage of the test system containing the robot, a first device among the devices that has not been tested. The device shuttle may be configured to move in a first dimension. The robot may be configured to move the first device from the device shuttle to the test carrier. The robot may be configured to move in a second dimension that is different from the first dimension.

In the example test system, cameras are configured to capture images of the devices. The robot may be controllable based on the images captured. The cameras may comprise one or more first camera(s) that are below the robot and that face upward relative to ground, and one or more second camera(s) that are above the robot and that face downward relative to ground. The test system may have a footprint that is less than sixteen square meters, that is less than ten square meters, that is less than nine square meters, or that is less than eight square meters. The test system may have a volume of less than forty-eight cubic meters.

In the example test system, a test carrier comprises a test socket for holding a device under test; the stages comprise: a test rack comprising a test slot; and a test arm configured to receive the test carrier, to flip the test carrier, to rotate the test carrier, and to push the test carrier into the test slot following rotating the test carrier. The test arm may comprise a pusher that is configured to extend and thereby push the test carrier into the test slot. The pusher may comprise a head that is configured to engage a member on the carrier to push the carrier. The test carrier may be first test carrier; and the pusher may be configured to engage a member of a second test carrier in the test slot prior to rotating the test carrier. The second test carrier may comprise release buttons to engage to release the second test carrier from the test slot. The test arm may comprise actuators to engage the release buttons. The actuators may be configured extend outwardly in response to a stimulus to engage the release buttons.

The test arm may be configured to move in a direction that has a vertical component relative to ground in order to cause the pusher to engage a member on the second test carrier. The pusher may be configured to retract following engaging the member and following the actuators engaging the release buttons, with the pusher retracting to cause the second test carrier to leave the test slot. The pusher may be configured to extend and thereby push the first test carrier into the test slot following causing the second test carrier to leave the test slot. The test slot may remain occupied during testing except for a time between removal of the second test carrier and insertion of the first test carrier. The test rack may comprise multiple test slots and, for each of the multiple test slots, the test arm may be configured to remove a test carrier containing tested devise and to insert a test carrier containing untested devices before proceeding to service a next test slot.

The test slot may comprise guides that are engaged by the test carrier upon entry of the test carrier into the test slot. The guides may be for directing the test carrier into position while the pusher continues to push the test carrier. The pusher may be configured to extend in a single dimension to push the test carrier into the test slot. The pusher may be configured to push in the single dimension independently of movement of the test carrier in dimensions other than the single dimension.

The stages may comprise a carrier holder for holding the test carrier in the test arm. The test carrier may contain grooves that enable movement of the test carrier in at least the single dimension. The pusher may be configured to extend through the carrier holder to push the test carrier into the test slot.

In the example test system, a test carrier may hold devices tested or to be tested; and the stages may comprise: a test slot; and a test arm comprising: a pusher that mates to the test carrier, with the pusher being extendible and retractable to move the test carrier relative to the test slot; and a carrier holder to hold the test carrier on the test arm, with the carrier holder comprising a gripper that is spring-loaded to hold the test carrier and to maintain the test carrier within the carrier holder. The test carrier may comprise grooves; and the gripper may be configured to engage the grooves of the test carrier to hold the test carrier in place absent external force applied to the arms. The gripper may comprise springs that are configured to spread the gripper to expand to accept the test carrier, and to release the test carrier. The gripper may be configured to engage the test carrier to hold the test carrier in place absent external force applied to the gripper while still allowing movement of the test carrier in response to applied force along a longitudinal dimension of the carrier holder.

The stages may comprise a carrier shuttle. The carrier shuttle may comprise posts to engage flanges to cause the gripper to open and thereby expand an area for receiving the test carrier. The carrier holder may be a first carrier holder, the test carrier may be first test carrier, and the test system may comprise a second test. The test arm may comprise a second carrier holder to hold the second test carrier on the test arm. The carrier holder may comprise a second gripper that is spring-loaded to hold the second test carrier and to maintain the second test carrier within the carrier holder.

The test arm may comprise a first face and a second face. The first face is for holding the first carrier holder and the second face is for holding the second carrier holder. The first carrier holder and the second carrier holder face in opposite directions.

The stages may comprise: a track along which the pusher is configured to travel; and a termination block against which a part of the pusher abuts when the pusher is fully extended. The pusher may comprise one or more springs that engage the termination block when the pusher is at least partially extended. The termination block may be arranged to engage the one or more springs when the pusher is fully extended. The one or more springs may include two springs. The springs may be configured and arranged to compress, at least partially, when the pusher is at least partially extended.

The stages may comprise a pneumatic system to control extending and retracting the pusher. The pneumatic system may comprise air valves to receive air to cause the pusher to extend. The one or more springs may be configured to apply force to the pusher in a direction opposite to motion of the pusher. The test arm may be configured to receive the test carrier and, following receipt of the test carrier, to flip and to rotate to position the test carrier for insertion into the test slot.

The example test system may comprise: a test carrier comprising a test socket, with the test socket for receiving a device for test, the test socket comprising electrical connections; a socket cap to contact the device and to apply pressure to cause the device to connect electrically to the electrical connections; and an actuator that is movable relative to the socket cap to engage the socket cap. The stages may comprise a carrier shuttle having a surface to receive the test carrier, the surface comprising ports to force air to float the test carrier or to suction air to hold the test carrier. The stages may comprise an air control system to force the air to float the test carrier during removal of the socket cap from the device in a test carrier, and to suction air thereafter.

The actuator may comprise: a key element that is rotatable; tooling balls arranged relative to the key element; and a block, with the tooling balls being fixed to the block, and with the key element passing through the block and being movable relative to the block. The socket cap may comprise a kinematic mount comprising: a first structure comprising grooves that are configured and arranged to engage the tooling balls, with the first structure having a hole, and with the hole and the key element having complementary shapes to allow the key element to pass through the hole; a second structure having a hole, with the hole and the key element having complementary shapes to allow the key element to pass through the hole, and with the key element being configured to rotate to engage the second structure. At least one compression spring may be by the first structure and the second structure.

The actuator and the air control system may be configured to operate together to cause operations comprising: the air control system forces air to float the test carrier; the actuator engages the socket cap forcing the tooling balls against the grooves and causing the key element to pass through the first and second structures; the actuator rotates the key element; the key element pulls against the second element while the tooling balls pushes against the grooves to compress the compression spring; the actuator moves the socket cap in place over the device causing the socket cap to connect to the test carrier; and following connection of the socket cap to the test carrier, the actuator retracts. The air control system may be configured to force air out of the ports to float the test carrier while the socket cap is positioned over the device, and to suction air through the ports to hold the test carrier when the socket cap is fixed into place.

The stages may comprise a device shuttle to move the device towards, and away from, a stage of the test system containing the test socket. The robotics may comprise a robot to move the device between the device shuttle and the test socket. The robot may be in the stage of the test system. The robot may be configured to move in a first dimension and the device shuttle is configured to move in a second dimension that is different from the first dimension. The robot may be configured to rotate the device before, or after, placement in the test socket. The actuator may be controllable using a pneumatic system.

The example test system may comprise a test socket for receiving a device for test. The test socket comprises electrical connections; a socket cap to contact the device and to apply pressure to cause the device to connect electrically to the electrical connections; and an actuator that is movable relative to the socket cap to engage the socket cap and to compress and release the socket cap. The actuator may comprise: a key element that is rotatable; tooling balls arranged relative to the key element; and a block, with the tooling balls being fixed to the block, and the key element passing through the block and being movable relative to the block.

The socket cap comprises a kinematic mount comprising: a first structure comprising grooves that are configured and arranged to engage the tooling balls, with the first structure having a hole, and with the hole and the key element having complementary shapes to allow the key element to pass through the hole; and a second structure having a hole, with the hole and the key element having complementary shapes to allow the key element to pass through the hole, and with the key element being configured to rotate to engage the second structure. At least one compression spring may be controllable by the first structure and the second structure.

The actuator may be configured to operate together to cause operations comprising: the actuator engages the socket cap forcing the tooling balls against the grooves and causing the key element to pass through the first and second structures; the actuator rotates the key element; the key element pulls against the second element while the tooling balls pushes against the grooves to compress the compression spring; the actuator moves the socket cap in place over the device causing the socket cap to connect to the test carrier; and following connection of the socket cap to the test carrier, the actuator retracts. There may be three tooling balls arranged at equidistant locations relative to the key.

The stages may comprise: trays to hold devices that have been tested and devices that are to be tested, with the trays containing cells, and with each cell for holding a single device; a device shuttle to transport the devices that have been tested, or the devices that are to be tested, between the trays and a stage of the test system configured to receive devices that have been tested or to forward devices to be tested; a robot to move the devices between the trays and the device shuttle; one or more cameras to image cells of the trays; and one or more processing devise to locate cells of the trays that do not contain a device based on the image data, and to control the robot to move based on locations of the cells that do not contain a device. The robot may be configured to move in two dimensions to reach different cells of the trays. The robot may be configured to move to place devices that have been tested into cells that do not contain devices. The stages may comprise a loading station to receive trays of devices to be tested, and to receive trays of devices that have been tested.

The trays may comprise: a first tray containing devices to be tested; a second tray containing devices that have been tested and that have passed testing; and a third tray containing devices that have been tested and that have not passed testing. The example test system may have a footprint that is less than sixteen square meters, that is less than ten square meters, that is less than nine square meters, or that is less than eight square meters. The example test system may have a volume of less than forty-eight cubic meters. The robot may be a first robot; and the robotics may comprise second robots to move devices between the device shuttle and a test carrier. The first robot may operate with less precision than the second robots.

A cell among the cells may have tapered edges, with the tapered edges for funneling a device received in the cell to a resting position. The one or more processing devise may be programmed to control the robot to move so as not to place devices into cells that already contain a device. The one or more processing devices may be programmed to receive image data from the one or more cameras, with the image data representing cells of the trays, with the image data being received in real-time.

Any two or more of the features described in this specification, including in this summary section, can be combined to form implementations not specifically described herein.

The systems and techniques and processes described herein, or portions thereof, can be implemented as/controlled by a computer program product that includes instructions that are stored on one or more non-transitory machine-readable storage media, and that are executable on one or more processing devices to control (e.g., coordinate) the operations described herein. The systems and techniques and processes described herein, or portions thereof, can be implemented as an apparatus, method, or electronic system that can include one or more processing devices and memory to store executable instructions to implement various operations.

The details of one or more implementations are set forth in the accompanying drawings and the description below. Other features, objects, and advantages will be apparent from the description and drawings, and from the claims.

DESCRIPTION OF THE DRAWINGS

Like reference numerals in different figures indicate like elements.

DETAILED DESCRIPTION

Figure 1:
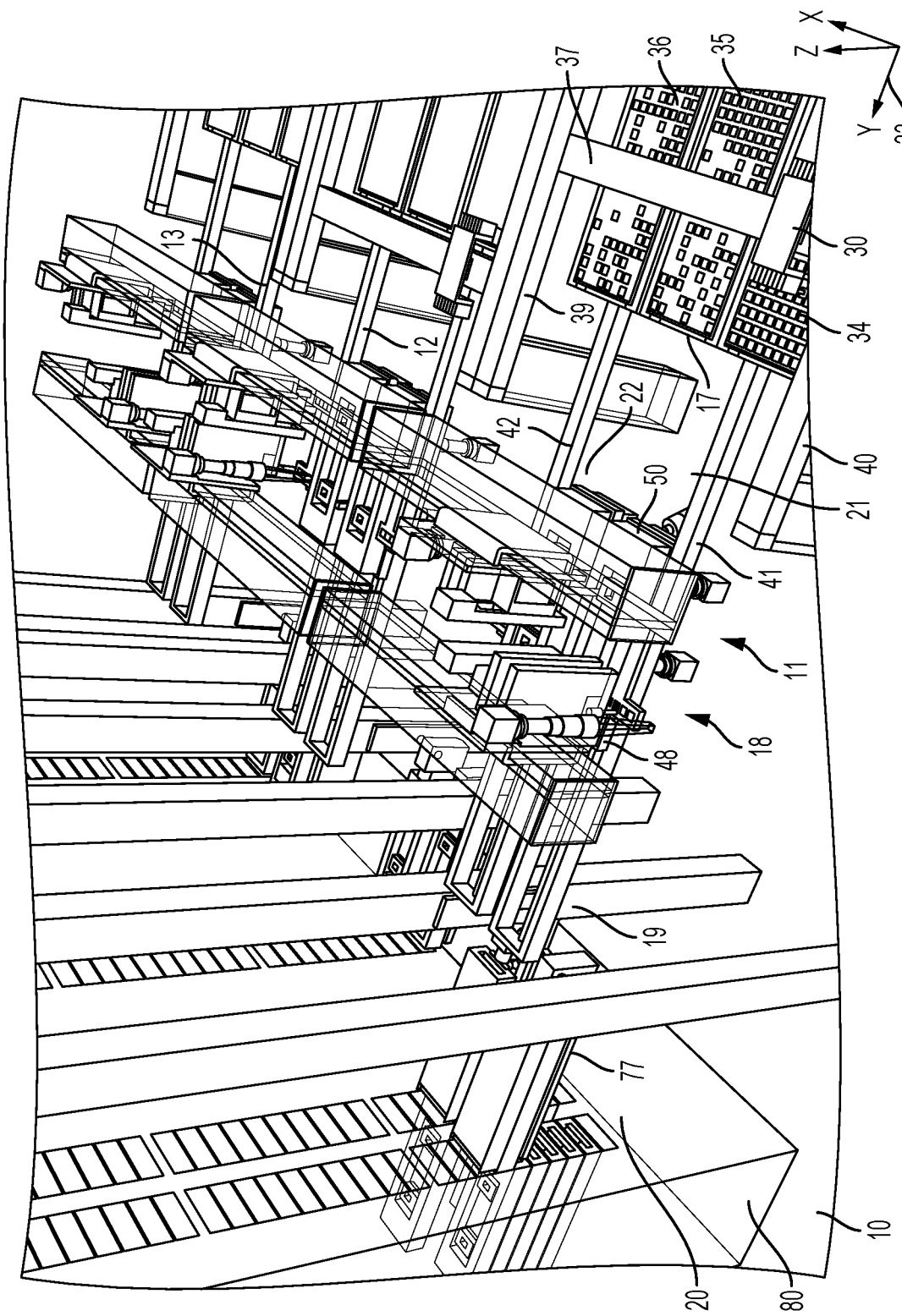
FIGS. 1 to 19 are perspective block diagrams showing parts of an example test system at sequential instances of time during an example course of operation.

Described herein are example implementations of a test system and components thereof. In some implementations, the test system is constrained in size, without sacrificing speed or throughput. For example, in some implementations the test system may have a footprint of less than sixteen square meters (16 m$^2$) and a volume of less than forty-eight cubic meters (48 m$^3$). The test system may also be configured to test an individual device in ten minutes, and to test tens, hundreds, or thousands of devices contemporaneously or concurrently. However, the example test system described herein is not limited to any particular size, testing speed, or throughput. In some implementations, the test system is an SLT system; however, the components and features described herein may be realized in any appropriate testing context.

In some implementations, the example test system is modular, enabling the test system to accommodate various testing requirements. Each unit of the test system is referred to as a slice. Two or more slices may be combined and controlled to operate in concert (e.g., dependently) or independently to perform testing operations. In some implementations a slice of the test system may have a footprint of less than sixteen square meters (16 m$^2$) and a volume of less than forty-eight cubic meters (48 m$^3$). In some implementations, a slice of the test system has a footprint that is less than 10 m$^2$, or less than 9 m$^2$, or less than 8 m$^2$, e.g., a footprint of about 7.2 m$^2$.

FIGS. 1 to 19 show different operational positions of the example test system. Those figures are first used to describe components of the example test system. In this regard, FIGS. 1 to 20 show an example slice 11 that may be part of a test system 10. Other slices are labeled 12 and 13 in FIG. 1 only. In this example, test system 10 is an SLT test system; however, the system may be used in any testing context. Example test system 10 includes five stages (or zones) per slice; however, any appropriate number of stages may be included in the test system. In the example implementation of FIGS. 1 to 20, the five stages include an input/output (I/O) stage 14 (see FIG. 20, not shown in FIGS. 1 to 19), a transport stage 17, a loading stage 18, an insertion stage 19, and a test stage 20. The definitions of the various stages are not meant to be limiting, and one or more components may perform functions in two or more of the stages. In some implementations, different stages are configured to operate with different levels of precision. For example, higher levels of precision (e.g., down to the micron level) may be used in the loading stage, whereas lower levels of precision may be used in some or all other stages. As described herein, system components, such as mechanical components, may be configured for operation within tolerances that enable lower levels of precision in some stages. By relegating higher precision to stages that may require it, the cost and complexity of the test system can be controlled in some cases.

As explained herein, the different stages of the test system may operate independently and contemporaneously. In the example of FIGS. 1 to 19, each stage includes two parallel paths 21 and 22. Each of the parallel paths includes automation to pass devices between adjacent stages. Operation of the different stages independently, contemporaneously, and in the parallel paths may support higher testing throughput and speed than some comparable test systems. In this regard, testing throughput may be measured in terms of devices tested per unit of time, such as an hour. Furthermore, by breaking functions down by stage, each stage may operate at a limited, or reduced, rate. As a result, there may be fewer opportunities to damage devices under test. In some implementations, each of the stages that moves devices includes functionality to load and to unload devices, and to transport devices.

Figure 20:
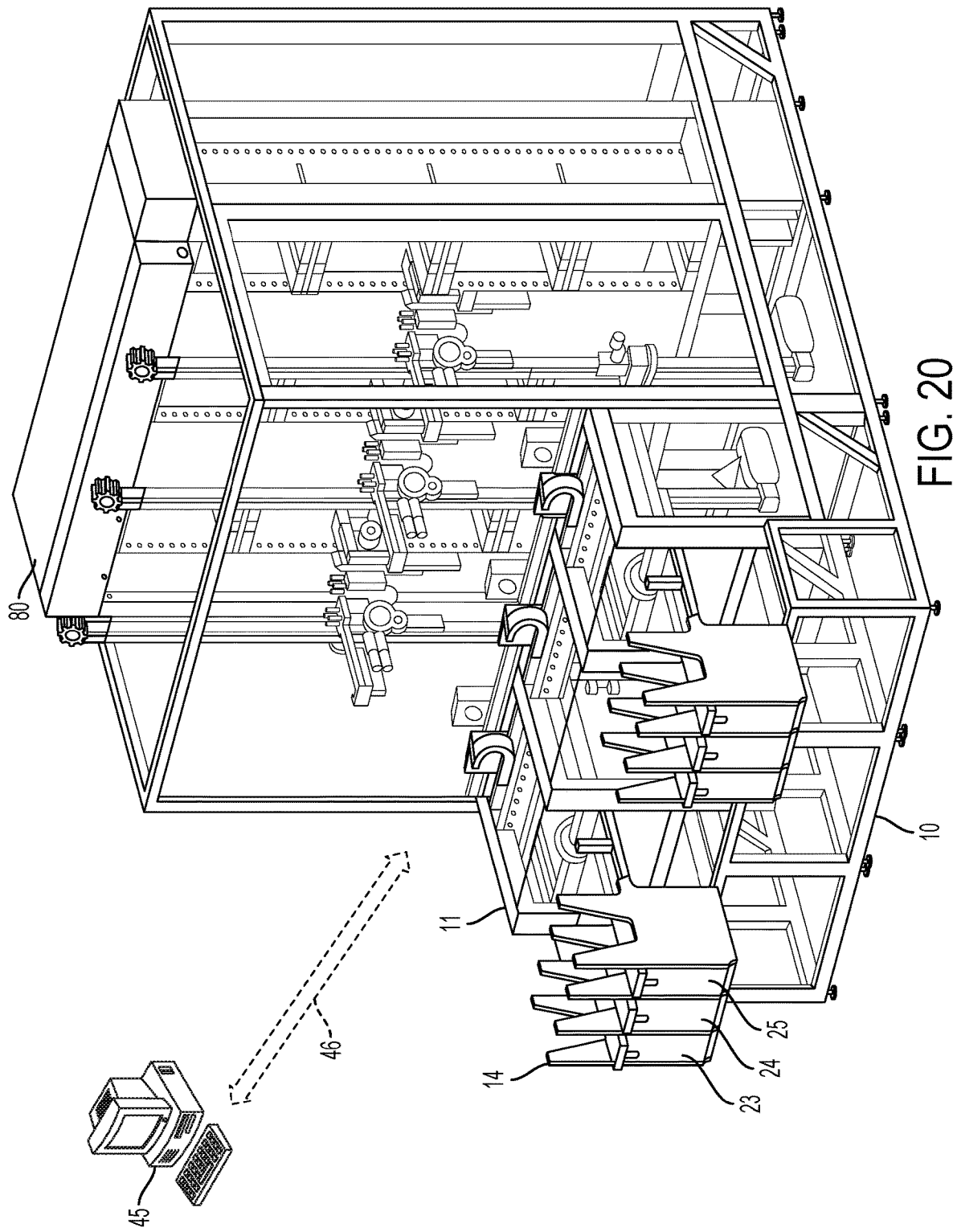
FIG. 20 is a perspective view of example test system containing two slices.

In the example of FIG. 20, I/O stage 14 includes, but is not limited to, feeders for receiving trays of tested devices, and for providing trays of untested devices to the test system. In some implementations, the devices may be loaded using tape and reel feeder devices instead of trays, although trays are described in the following example implementations. In the example of FIG. 20, there are three feeders 23, 24, 25 per slice; however, the system is not limited to use with three feeders. A first feeder 23 is for trays containing untested devices; a second feeder 24 is for trays containing tested devices that have not passed testing, and a third feeder 25 is for trays containing devices that have passed testing. In this example, feeder 23 is loaded manually with trays of untested devices. A tray among a stack of trays containing untested devices is fed from feeder 23 to the transport stage 17. After all devices on that tray have been forwarded for testing, and the tray is empty, the tray is retracted into the feeder and a new tray containing untested devices is fed to the transport stage. In this example, feeders 24 and 25 are loaded manually with empty trays. After devices have been loaded onto that tray following testing, and the tray is full (in some implementations), the tray is retracted into the feeder and a new, empty tray is fed from the I/O stage to the transport stage from either feeder 24 or 25. In this example, operations of feeders 24 and 25 are the same for trays containing devices that have passed testing and trays containing devices that have not passed testing.

Figure 21:
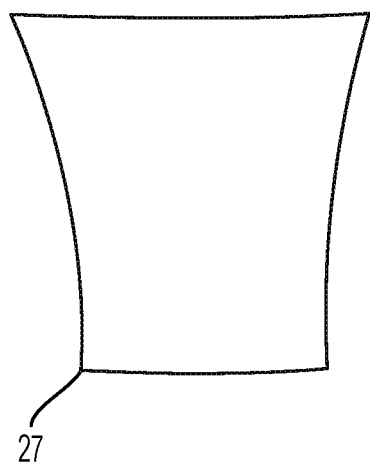
FIG. 21 is a cut-away, side view of an example tray cell.

In some implementations, each tray includes cells for holding devices to be tested or cells for holding devices that have been tested. As shown in FIG. 21, a cell 27 may include tapered edges, that are wider near the top of the cell and that decrease in width deeper into the cell. The tapered edges are configured to funnel a device received in a cell to a resting position. For example, as described below, devices that have been tested are returned to cells in the trays. As a device is placed into a cell, the tapered edges funnel or guide the device to its resting position within the cell. Use of tapered edges of this type make it possible to use less precise robotics in the transport stage. That is, the width and tapered edges result in a tolerances that enable robotics placing devices into the trays to be operated with less precision.

Figure 2:
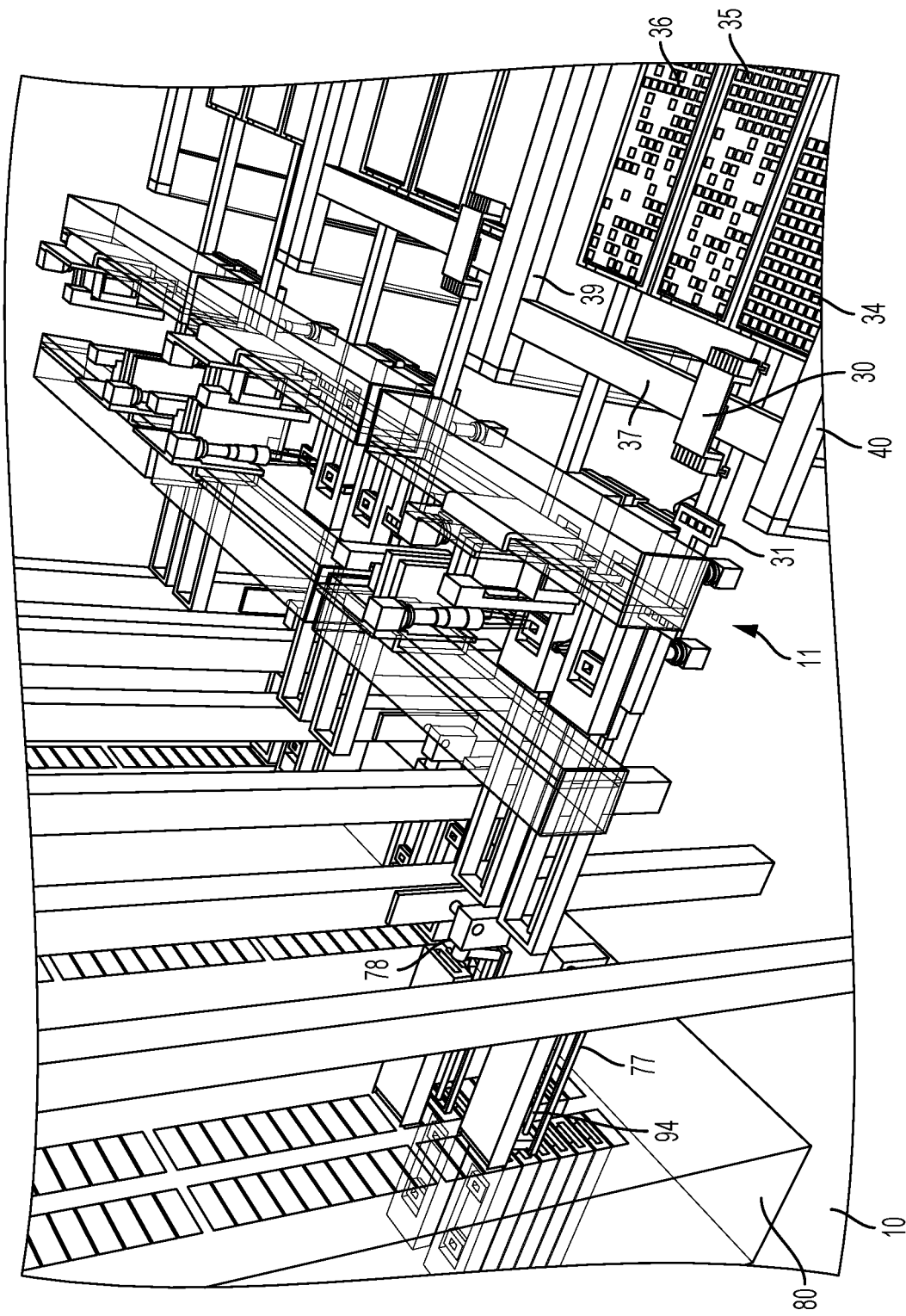
Figure 8:
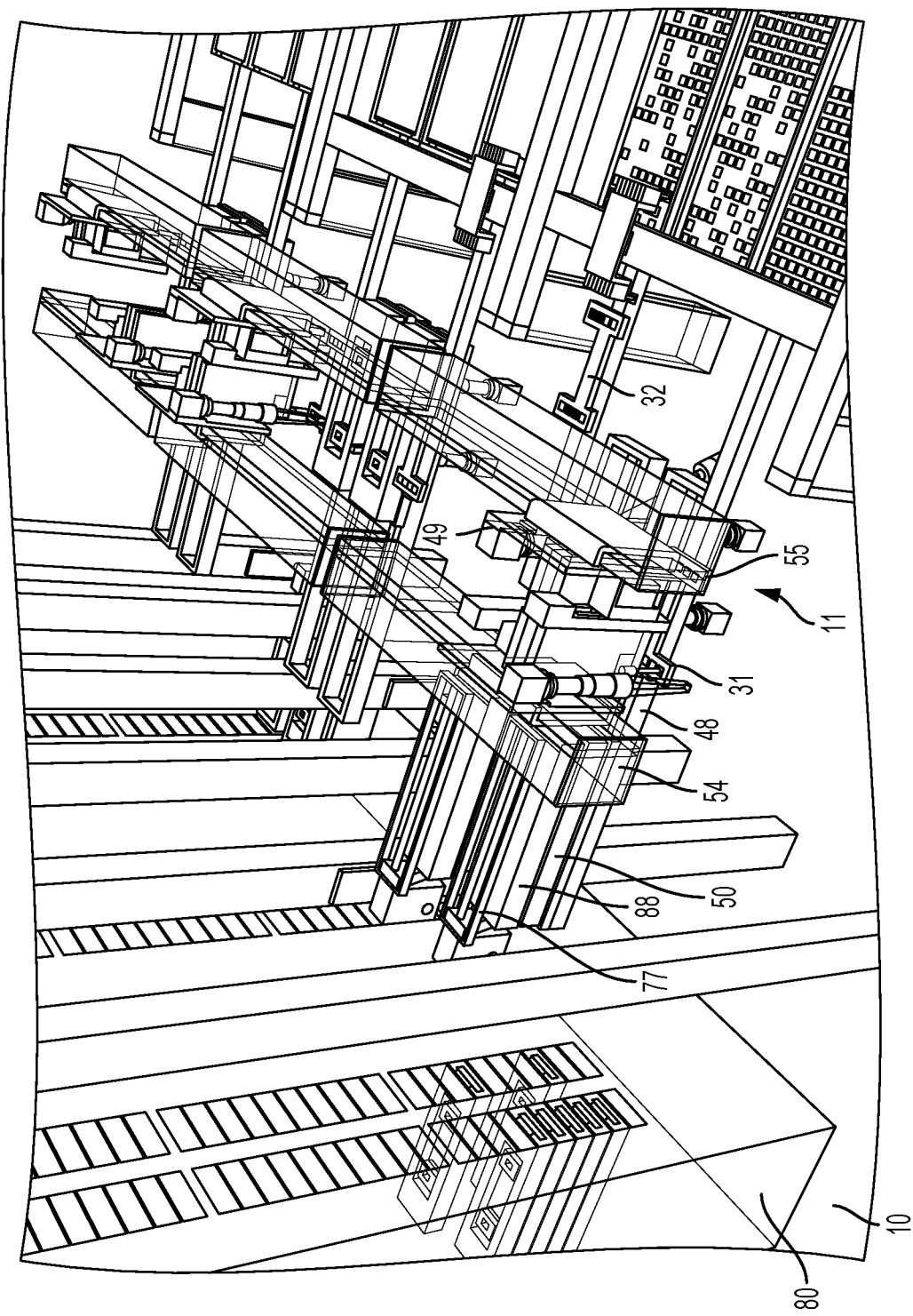

In this example, transport stage 17 includes, but is not limited to, a transport robot 30 and two device shuttles 31, 32 (e.g., FIGS. 2 and 8). The two device shuttles provide parallel transport paths, both into, and out of, the loading stage 18 described below, and support testing throughput and redundant reliability in some examples. Transport robot 30 is controllable to pick untested devices from a tray 34 (e.g., FIG. 2) and to place the untested devices onto device shuttles 31 and/or 32 (e.g., FIG. 8). Transport robot 30 is controllable to pick tested devices from device shuttles 31 and 32, and to place the tested devices into an appropriate one of trays 35 or 36, depending upon whether a particular device has passed testing or has not passed testing. In some implementations, transport robot 30 may pick and hold the device through air suction or using mechanical grips or other mechanical mechanisms. In some implementations, the transport robot may include eight pick-and-place actuators for picking, holding, and placing devices. In some implementations, the transport robot may include more or less than eight pick-and-place actuators for picking, holding, and placing devices.

By way of example, transport robot 30 is configured and controllable to pick an untested from a cell of tray 34 and to place the device on a device shuttle 31. In this example, transport robot 30 is configured and controllable to pick a tested device from device shuttle 31 or 32, and to place the tested device into a cell in tray 35 or 36. As described above, the tray cell may have tapered edges, which may reduce the need for precision when placing a tested device into a cell on the tray. For example, the tapered edges may allow the transport robot to deviate by, e.g., tenths of a millimeter or more, when placing the device in a cell of a tray, and still result in the device reach its resting position within the cell. That is, in implementations such as these, the transport robot may be able to position a device and deviate from a target position by tenths of millimeters or more, with the deviation being corrected by the tapered edges.

In the example of FIGS. 1 to 20, transport robot 30 is movable in two dimensions. Referring to legend 33 of FIG. 1, transport robot 30 is movable in the Cartesian X dimension (relative to ground) and in the Cartesian Y dimension (relative to ground). Movement in both the X and Y dimensions enables transport robot 30 to reach all cells of trays 34, 35, and 36 in the transport stage (see also FIG. 2, for example). In this example, movement in the X dimension is enabled by lateral track 37. For example, transport robot 30 is controllable to move along lateral track 37 in the X dimension. In this example, movement in the Y dimension is enabled by longitudinal tracks 39, 40. Together, lateral track 37 and longitudinal tracks 39, 40 form an H-bar. In this example, lateral track 37 (holding transport robot 30) is controllable to move along longitudinal tracks 39, 40 in the Y dimension. In some implementations, transport robot 30 is controllable to move along lateral track 37 at the same time as lateral track 37 moves along longitudinal tracks 39, 40. As a result, the time it takes to reach individual cells can be reduced. Other appropriate mechanisms may be used to implement X and/or Y movement of the transport robot.

In the example of FIGS. 1 to 20, there are two device shuttles 31 and 32. In this example, each of device shuttles 31 and 32 is constrained to move in the Y dimension; however, in some implementations this is not the case. For example, device shuttles 31 and 32 are configured to move along tracks 41 and 42 (see, e.g., FIG. 1), respectively, between the transport stage and the loading stage. In this example, each device shuttle contains multiple receptacles, each for holding a device. For example, device shuttle 31 contains four receptacles; however, a device shuttle may contain more than four receptacles or fewer than four receptacles. Transport robot 30 moves devices between the device shuttle receptacles and tray cells, as described.

In some implementations, the two devices shuttles may be configured and controlled to operate in parallel, independently, contemporaneously, and/or concurrently. For example, the transport robot may provide one device shuttle with devices to be tested, while removing devices that have been tested from another device shuttle. The two devices shuttles may be configured to move between the loading stage and the transport stage independently, in parallel, contemporaneously, and/or concurrently. For example, one device shuttle may transport devices to be tested from the transport stage towards, and to, the loading stage, while the other device shuttle transports devices that have been tested away from the loading stage and to the transport stage. In addition, one device shuttle may be stationary while the other device shuttle is moving. For example, one device shuttle may receive devices to be tested while the other device shuttle transports devices to or from the loading stage.

One or more cameras may be located above the area holding trays 34, 35, 36 to capture images of the trays continuously, periodically, or intermittently. The cameras may be configured to capture images of the trays, at least in part, in order to identify which cells of which trays are empty and which cells of which trays are full. For example, as described, cells in trays 35 and 36 receive devices that have been tested from transport robot 30. To reduce the chances that transport robot 30 will place two devices in the same cell, the cameras capture images of the trays during system operation. One or more computing systems 45 (see, e.g., FIG. 20—referred to as "the computing system") that control operation of the test system 10, as described herein, receive images captured by the cameras and use the captured images to control operation of the transport robot. For example, the computing system may be programmed to control the transport robot to place devices only in cells that are confirmed not to contain a device already. To implement this feature, the rate at which images of the tray cells are captured may be at least, or greater than, the rate at which the transport robot delivers devices that have been tested to the cells in the trays. Communication between the computing system and the test system are represented conceptually by arrow 46 in FIG. 20.

The images captured by the cameras may also be used to trigger feeding of trays into, or out of, the transport stage. For example, captured images may identify when all cells of tray 34 are empty (e.g., all untested devices have been moved to the loading stage), which may trigger movement of tray 34 back to feeder 24 and movement of a new tray of untested devices into the transport stage. For example, the captured images may identify when all cells of tray 35 or 36 are full, which may trigger movement of tray 35 or 36 back to feeder 24 or 25, respectively, and movement of a new tray of untested devices into the transport stage.

Figure 3:
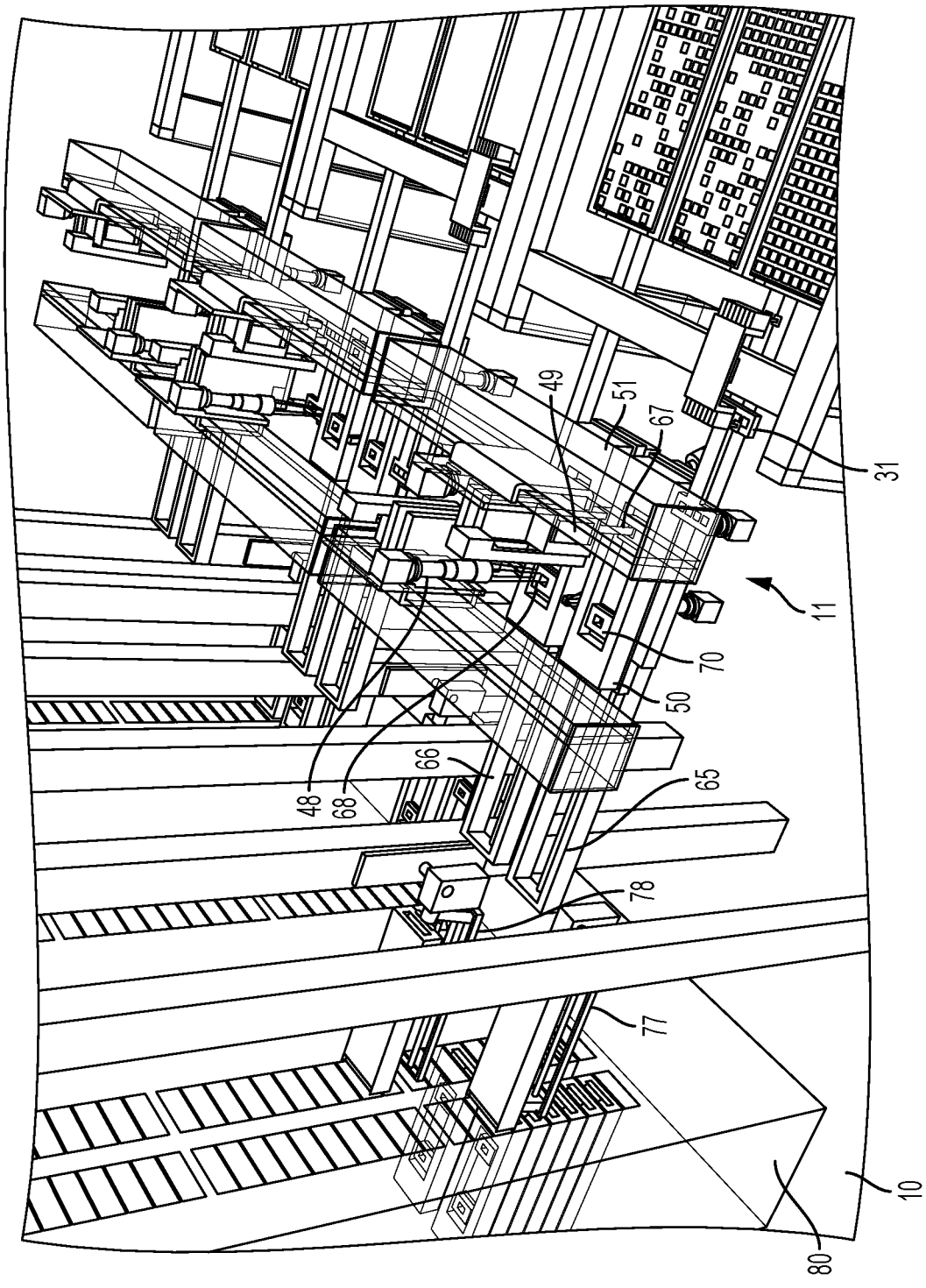

In some implementations, loading stage 18 includes, but is not limited to, loading robots 48, 49 (see, e.g., FIGS. 1 and 8) and an area for loading devices into, and unloading devices from, test carriers, such as 50 and 51 (see, e.g., FIG. 3). In this example, there are two loading robots per slice; however, the test system may include any appropriate number of loading robots. In this example, loading robots 48, 49 are configured to move in the X dimension (and also in the Z dimension to perform pick-and-place operations on devices as described herein). By contrast, in this example, the device shuttles are constrained to move in the Y dimension. In this example, each loading robot 48, 49 is configured to move along a different, respective track 54, 55 (see, e.g., FIG. 8). The loading robots are controllable to move devices into, and out of, test carriers 50, 51 when in the loading stage. For example, each loading robot may be configured to move devices between a device shuttle and a socket in a test carrier.

Figure 22:
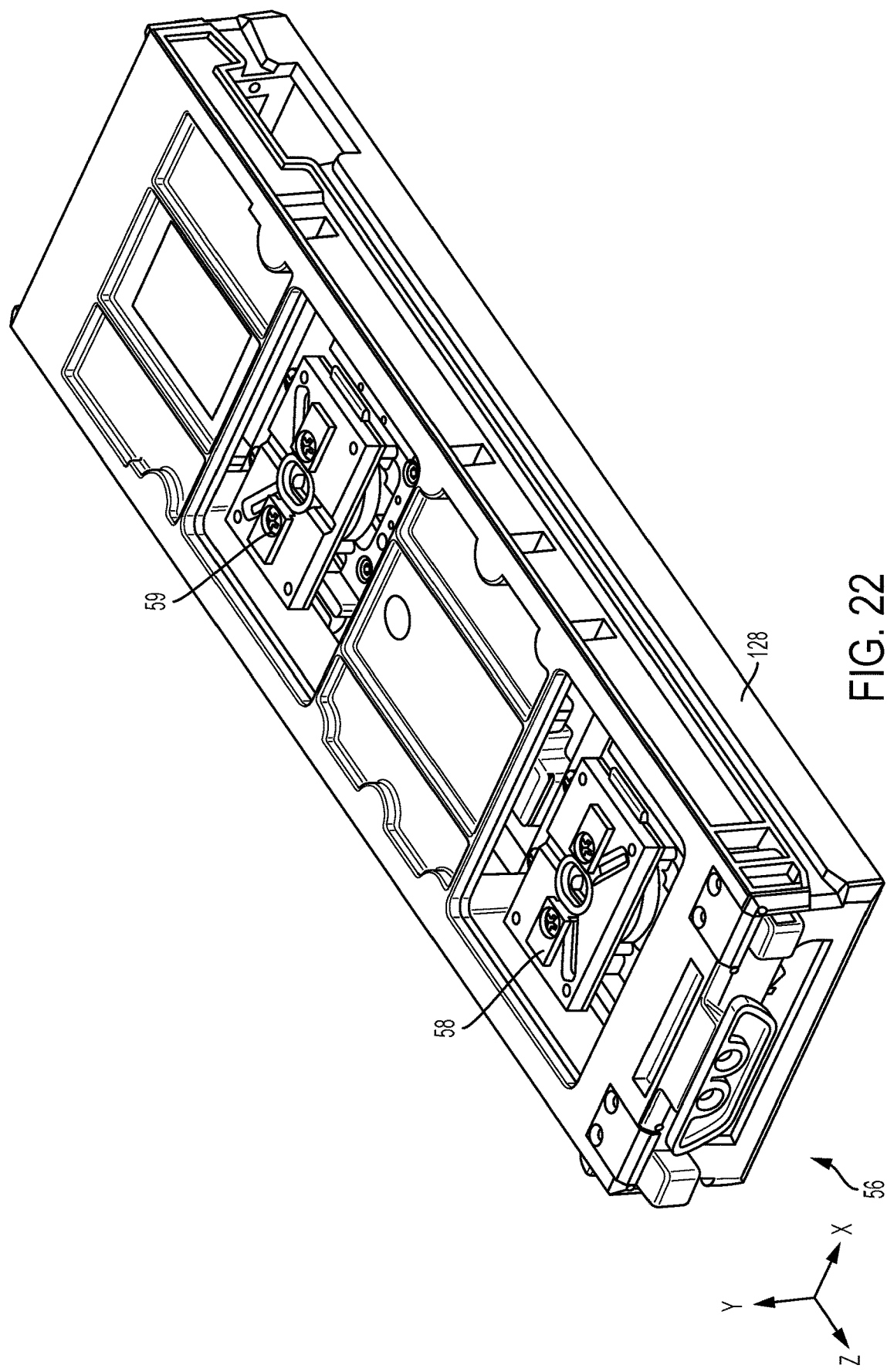
FIG. 22 is a perspective view of an example test carrier.

FIG. 22 shows an example of a test carrier 56. In some implementations, SLT sockets and electronics are concentrated in the test carrier, which is self-contained, portable, and removable. In some implementations, the test carrier includes an electrical interface that is configurable to connect to devices in the test carrier. For example, the interface can be configured to connect to a variety of different electrical interfaces. In the example of FIG. 22, test carrier 56 includes two sockets 58, 59 arranged along the test carrier's longitudinal dimension. Although two test sockets are shown in the example of FIG. 22, other implementations of the test carrier may contain more, or fewer than, two sockets. Each test socket holds a corresponding device.

In some implementations, a test socket is device-specific. For example, the test socket may contain electrical contacts that are complementary to corresponding electrical contacts on a device under test (DUT). Among other things, the loading robots may be configured to place untested devices into test sockets, and to remove tested devices from test sockets. The test sockets are inlaid in the test carrier, and contain walls that may guide devices under test into position so that electrical contacts in the carrier socket and electrical contacts on the device under test align. In some implementations, for example, where the electrical contacts are relatively large, the loading robots may not require a high level of precision, and the test socket walls may play a prominent role in guiding devices under test into position so that electrical contacts in the carrier socket and electrical contacts on the device under test align.

In some implementations, for example, where the electrical contacts are relatively small, more precise placement of the devices into the test sockets may be required. For example, in some implementations, the loading robots may be controllable to operate at a micron (μm)-level precision when placing devices into the test sockets. For example, in some implementations, the loading robots may be controlled to operate at a precision of 1 μm, 2 μm, 3 μm, 4 μm, 5 μm, 6 μm, 7 μm, 8 μm, 9 μm, 10 μm, and so forth. That is, some in implementations, the loading robots may be required not to deviate from a target position by more than an amount of microns. In some implementations, only the loading stage includes robotics and/or mechanics that require high levels of precision, e.g., down to the micron level. In some implementations, the remaining stages may operate with less precision than the loading stage. By relegating higher precision to the loading stage in some implementations, it may be possible to contain system cost and complexity.

Figure 23:
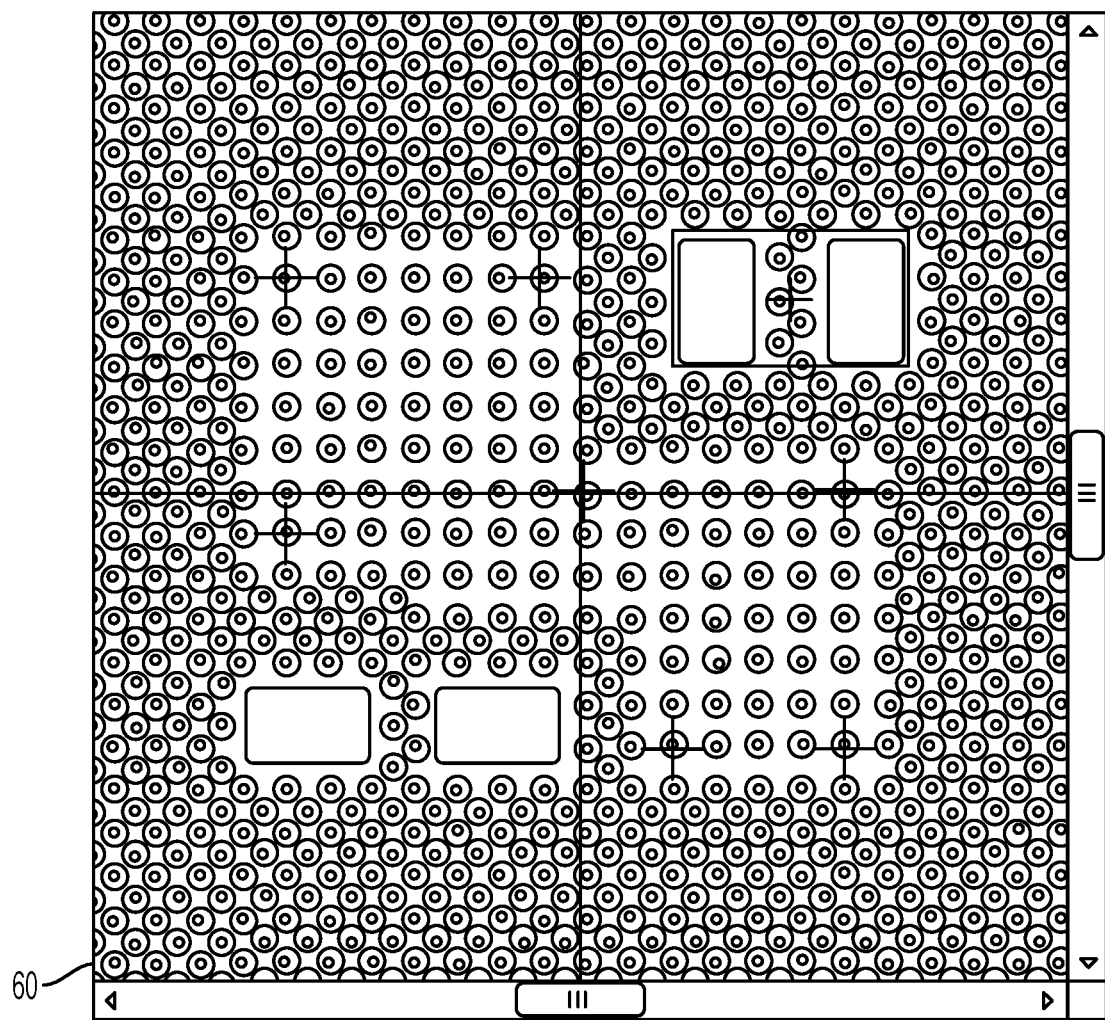
FIG. 23 is an example of an image of electrical contacts of a device captured by a camera located below the tester loading stage.
Figure 24:
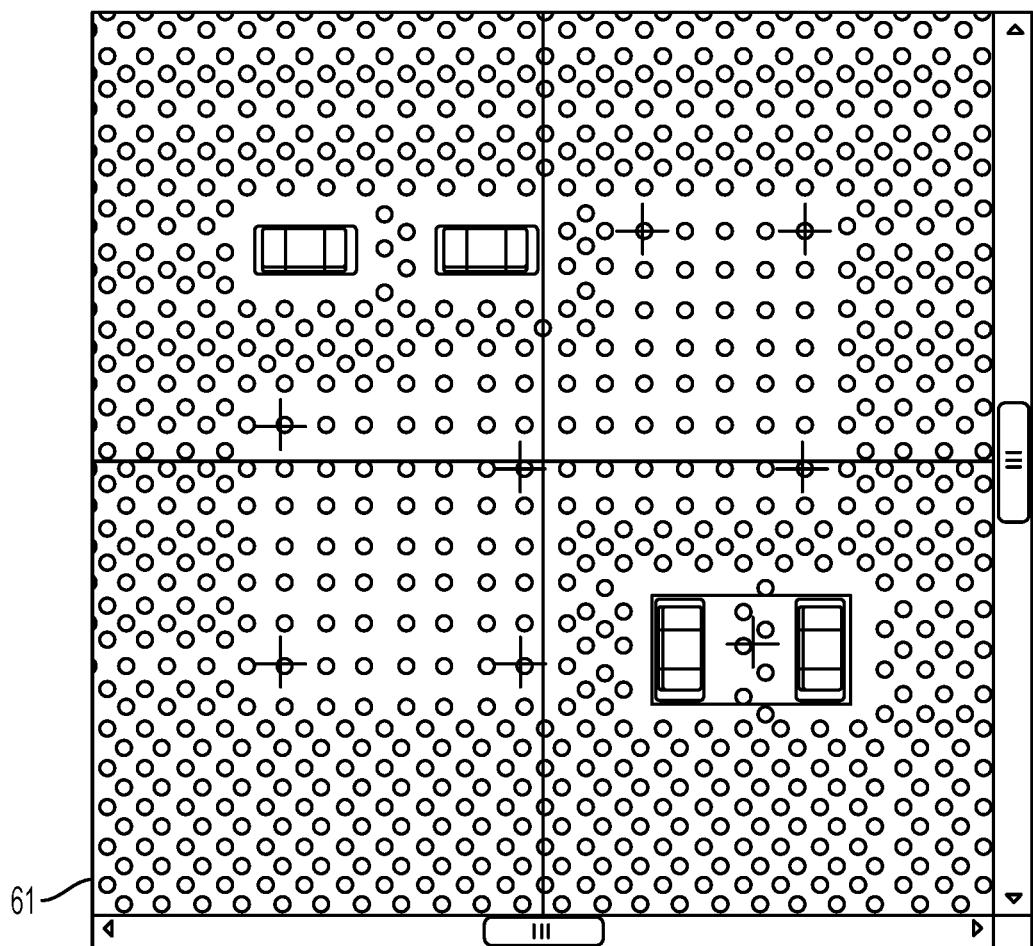
FIG. 24 is an example of an image of electrical contacts of a socket in a test carrier captured by a camera located above the tester loading stage.
Figure 25:
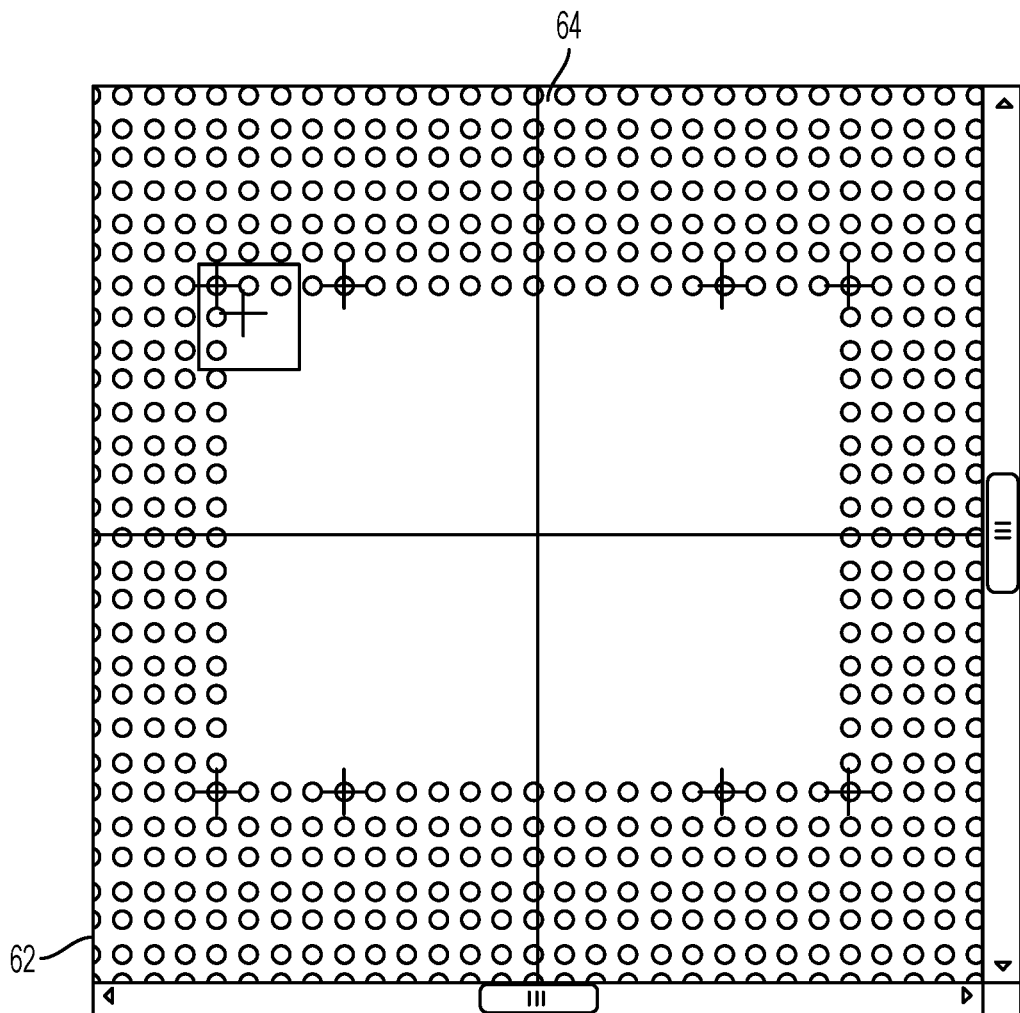
FIG. 25 is an example of an image of a device in a test carrier captured by a camera located above the tester loading stage.

In some implementations, precision may be supported using cameras located above and below the loading stage. For example, a camera above the loading stage may capture an image 61 (FIG. 24) of electrical contacts in a socket of a test carrier, and a camera below the loading stage may capture an image 60 (FIG. 23) of complementary electrical contacts of the device under test. The images may be provided to the computing system, which may align electrical contacts on the images, and control the loading robot to place the device at an appropriate location, with appropriate precision, in the test socket. Following placement, alignment may be confirmed by capturing another image 62 of the device in the test socket (FIG. 25), and confirming that the device aligns to a predefined grid pattern 64. In some implementations, the cameras include a look-up camera (below the loading stage) and a look-down camera (above the loading stage) that are configured and controlled to capture images of the device before placement into the test socket and after placement into the test socket. The computing system that controls operation of the test system may be programmed to receive the captured images and to calculate an offset between side solder pads of the device and bottom side soldier balls on the device. The computing system may control the loading robot using the calculated offset to place the device into the test socket and then to place a socket cap on the device. In some implementations, the foregoing features enable the loading stage to position the device and socket cap precisely, without relying solely on device edge alignment to position the device within the test socket.

In some implementations, a first camera is mounted on each loading robot and therefore can be moved along the X dimension, and the first camera is above the sockets and thus can be focused on the sockets. In some implementations, a second camera is mounted below each loading robot and is focused on each robot's vacuum tip in order to image below the device held on the vacuum tip. The position of each loading robot is adjustable in the X and Z dimensions and in terms of pitch, yaw, and roll. The carrier shuttle is controllable to provide Y-dimension adjustments. In some implementations, the second camera is static mounted, whereas each first camera is movable along with a loading robot, as described.

After an untested device reaches a resting position within the test socket, a socket cap is placed over the test socket, among other things, to apply pressure to the device to cause the electrical contacts in the test socket to mate to the complementary electrical contacts in the test carrier. In some implementations, the socket cap may include memory storing executable instructions that are usable by the device during test. For example, the executable instructions may include operational instructions, test routines, and so forth. Accordingly, the socket cap may also include electrical contacts that mate to complementary electrical contacts on the device and/or the test carrier. In some implementations, the socket cap exerts about 35 pounds (lbs) of force on the device in order to implement the various electrical connections; however, any appropriate amount of force may be applied to implement connections. In some implementations, as described herein, the socket cap may be, or include, a kinematic mount, that applies the force via a compression spring. Examples of a socket cap and its installation in a test socket by a loading robot are described below.

Figure 40:
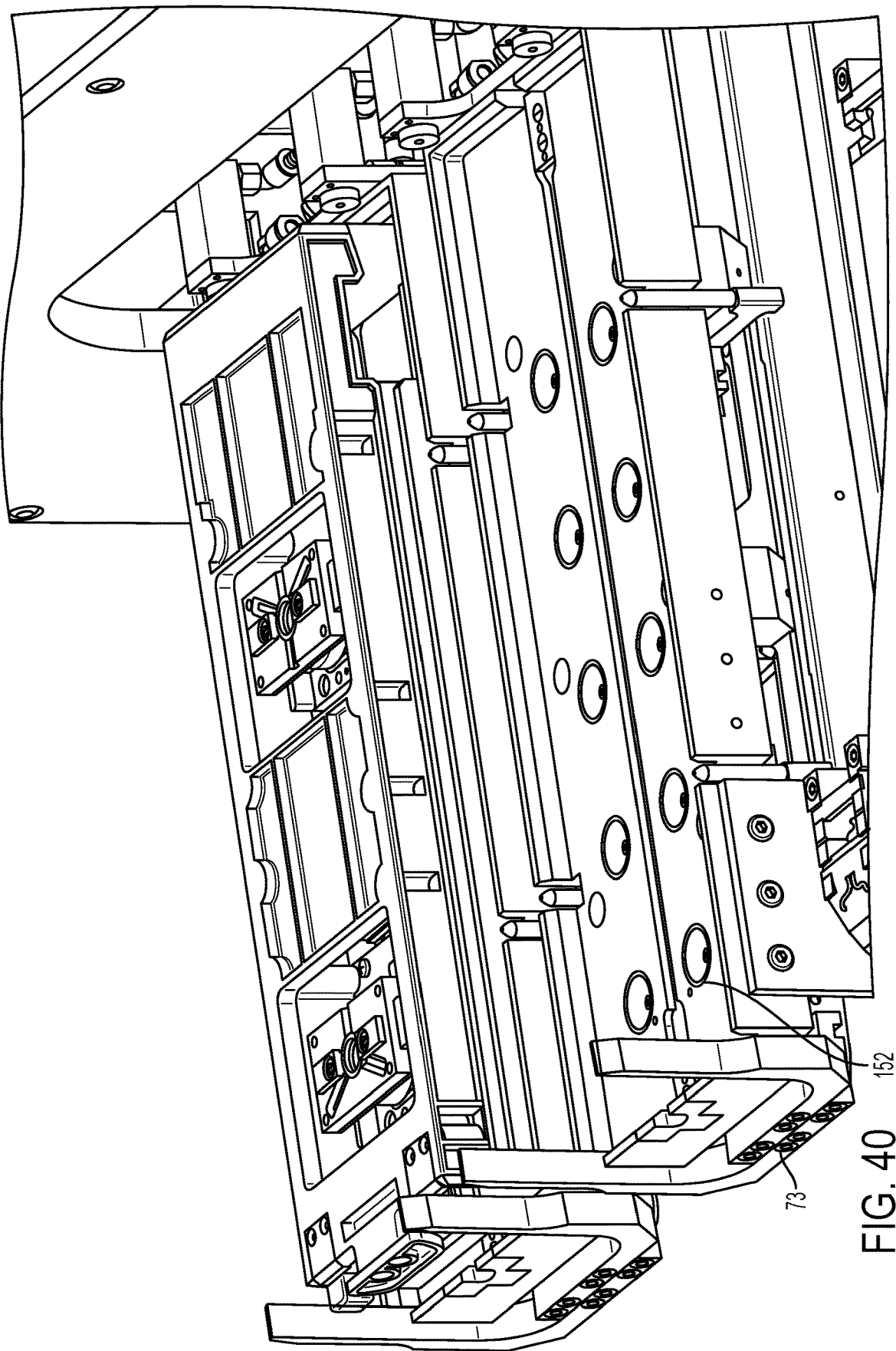
FIG. 40 is a perspective view showing two example test carrier shuttles—one holding a test carrier and one not holding a test carrier.

Referring back to FIGS. 1 to 19, an example loading robot 48 performs operations in sequence and, in some implementations, does not operate empty-handed. As explained in more detail below, a test carrier is held on a carrier shuttle that moves between the insertion stage 19 and the loading stage 18. In some implementations, there are two carrier shuttles 73, 74 (e.g., FIG. 6) per slice; however, the test system is no limited to use with two carrier shuttles. The carrier shuttles move in the Y dimension along tracks 65, 66, respectively. The carrier shuttles are configured to transport test carriers between test arms in the insertion stage 19 and the loading robots 48, 49 in the loading stage 18. Referring to FIG. 40, each carrier shuttle include air ports 152 on a surface thereof that accepts the test carrier. The air ports force pressurized air through the ports to float the test carriers at appropriate times, and suction air through the ports to create a vacuum and lock the test carriers in place at appropriate times. For example, the air ports force pressurized air through the ports of a carrier shuttle to float a test carrier in the shuttle during removal of a socket cap. The carrier shuttle suctions air through the ports to lock the test carrier in place following removal of the socket cap in order to place an untested device in the socket and replace the socket cap.

In some implementations, during loading and unloading, each loading robot services a diametrically-opposite (e.g., diagonally-located) test socket on a different test carrier. For example, in FIG. 3, loading robot 49 services test socket 67 of test carrier 50 while loading robot 48 services test socket 68 of carrier test carrier 51. Servicing a test slot may include performing any appropriate operation with regard to that test slot including, but not limited to, adding devices to the test slot, removing devices from the test slot, adding a socket cap to a test socket, and/or removing a socket cap from a test socket. Different loading robots service diametrically-opposite (e.g., diagonally-located) test slots on different test carriers in some implementations because the test carriers are floated during at least part of the servicing operations. For example, in FIG. 3, both test carriers 50 and 51 may be floated at appropriate times, for reasons explained below. As a result, test carrier 50 may move wobble when loading robot 49 services test socket 67. This movement may affect the location of the other test socket 70 on the same test carrier. In some implementations, to avoid errors that could result from movements caused by two different loading robots servicing the same test carrier at the same time, the computing system controls the robots so that they do not service the same test carrier at the same time. In some implementations, the robots are controlled to operate in parallel to service different test sockets on different test carriers contemporaneously or concurrently. Because of the geometry of example loading stage 18, the loading robots service diametrically-opposite (e.g., diagonally-located) test sockets on different test carriers. In some implementations, test systems having different geometries may result in differently-located test sockets being serviced in parallel contemporaneously or concurrently.

In some implementations, a loading robot performs operations in sequence and does not operate empty-handed. As noted, each loading robot is configured to, and controllable to, move a device under test between a test carrier and a device shuttle. In an example operational sequence, a carrier shuttle 73 moves from the insertion stage to the loading stage, as shown, e.g., in FIG. 11. Carrier shuttle 73 contains a test carrier 88 having tested devices in its test sockets. As shown in FIGS. 12 to 16, loading robot 48 services test socket 89 to remove a tested device from the test socket and to place an untested device into the test socket. The operational sequence includes the following—where appropriate, details about specific operations are provided below. In this example, each loading robot includes two picker heads—one to remove and replace devices and one to remove and replace socket caps. The carrier shuttle floats the test carrier containing tested devices. A socket picker head of loading robot 48 locks into the socket cap (not shown in FIG. 12) on the test socket, and removes the socket cap while the test carrier is floating on pressurized air. The floating may reduce the chances of damage to circuit boards within the test carrier connected to the device in the test socket. Next, in order to ensure that the test carrier stays in place for subsequent operations, in this example the air through the carrier shuttle ports is suctioned to create a vacuum in order to hold the test carrier in place.

Meanwhile, the socket cap is held by a socket picker head of the loading robot until it is replaced onto the test socket. While the socket picker head is still holding the socket cap, a device picker head of the same loading robot 48 removes the tested device from the test socket 89 (see FIG. 12, for example), and moves in the X dimension and the Z dimension to place the tested device on a device shuttle 31. At a location of the device shuttle, the device picker head unloads the tested device into an empty receptacle on the device shuttle, and the device picker head picks-up an untested device from another receptacle on the device shuttle. The loading robot moves the untested device into position over the empty test socket (FIGS. 13 and 14), and the device picker head places the untested device into the empty test socket with appropriate precision. In some implementations, placement is computer-controlled based on images from the cameras above and below the loading stage, as described herein. In some implementations, the device picker head is configured to rotate an untested device prior to placement in the test carrier to orient the device at a specified orientation within a test socket.

Figure 15:
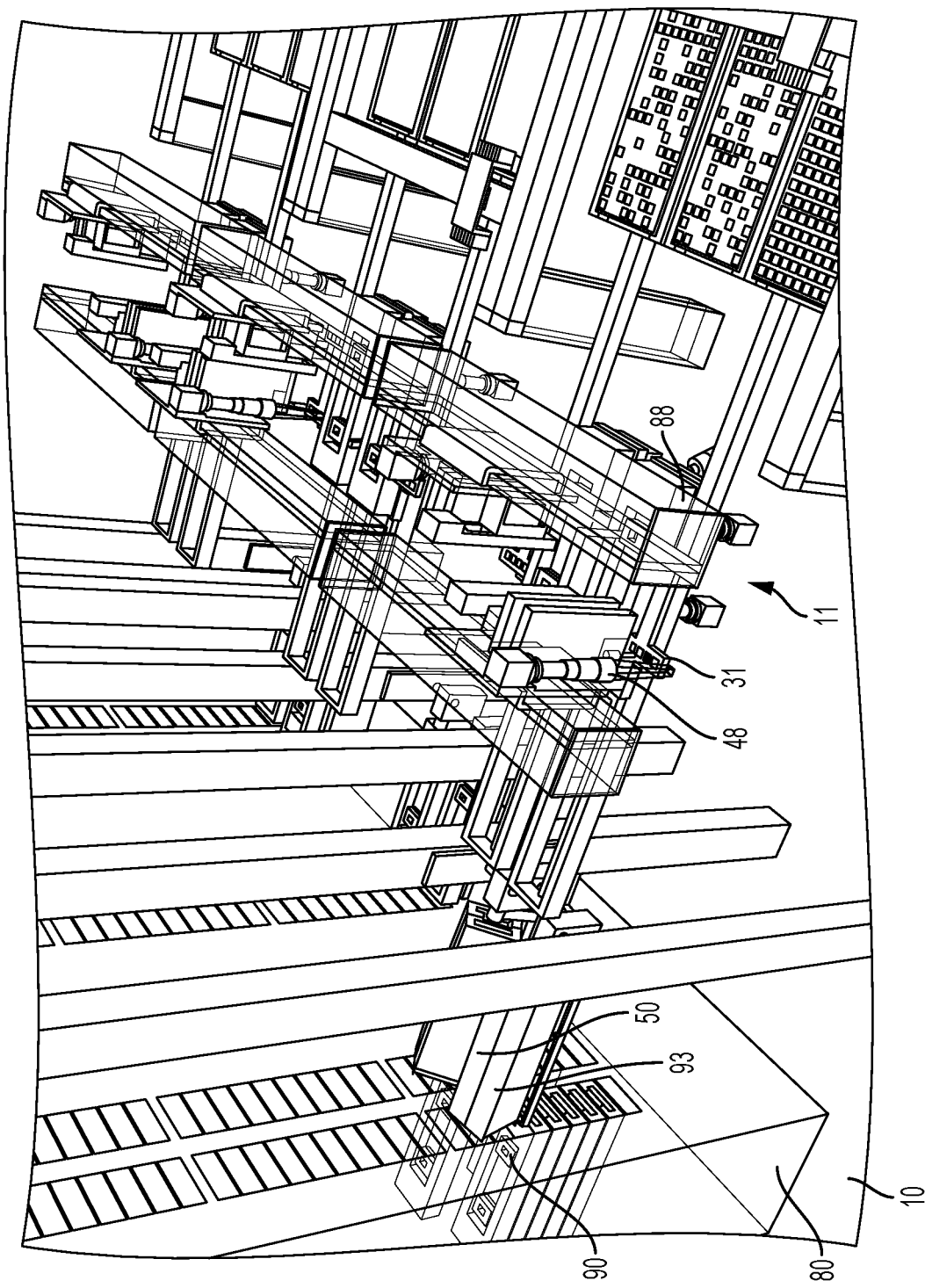
Figure 16:
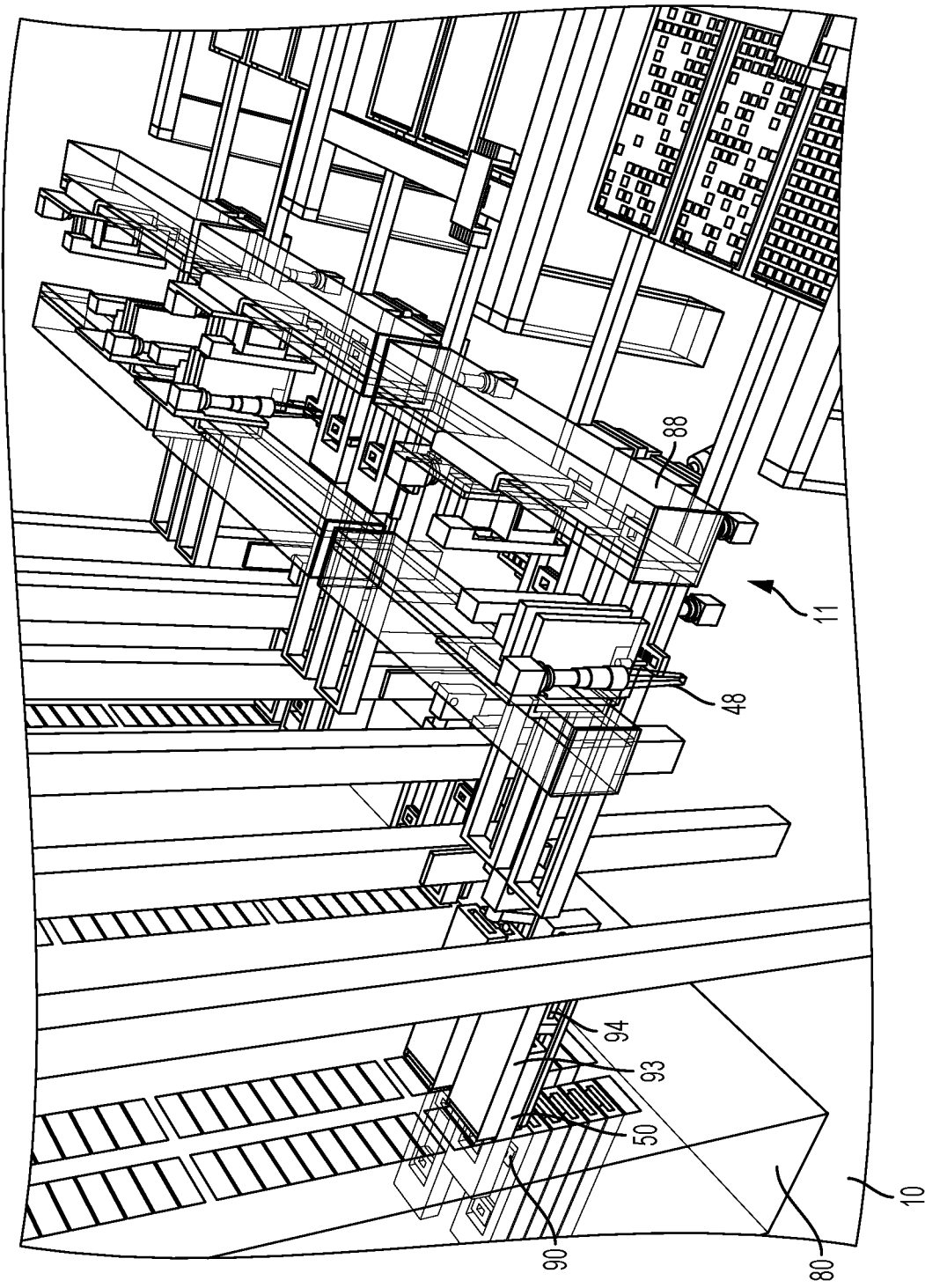
Figure 17:
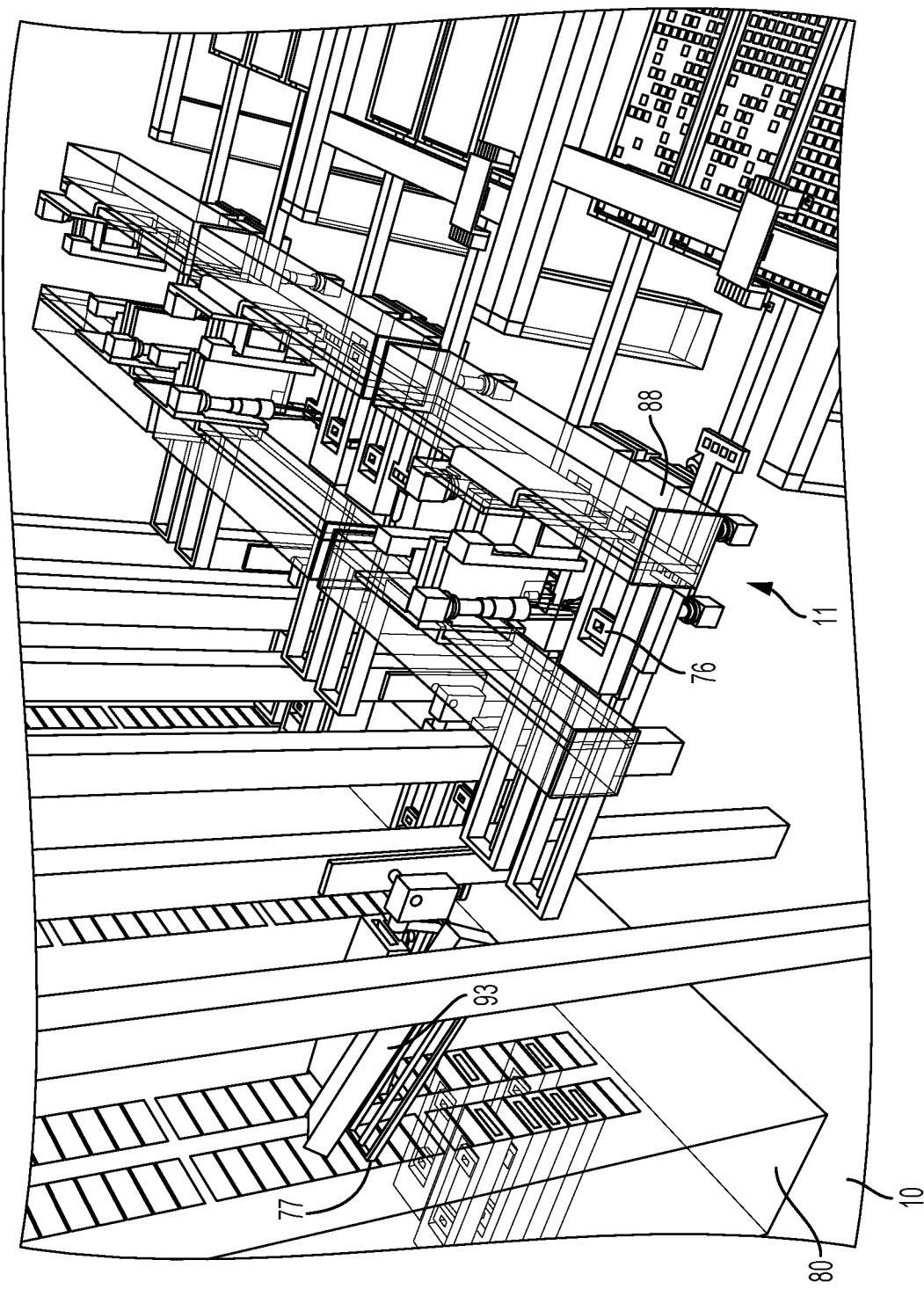

After the untested device is in place in the test socket, the socket picker head of the same loading robot places the socket cap 76 over the test socket (FIGS. 15, 16, and 17). Appropriate force is applied using a compression spring that is described below in order to ensure that electrical contacts in the socket cap, the device, and the test socket mate to create electrical connections to permit signals to pass. Following servicing of test socket 89 by loading robot 48, the other test socket of the same test carrier is serviced by loading robot 49. In this example, after both test sockets in the same test carrier contain untested devices, the test carrier is transported to the insertion stage. Also, as explained above, the tested devices from the test carrier are transported, by the device shuttle, to the transport stage for placement into appropriate trays. The computing system keeps track of whether a tested device has passed or failed testing, and controls the transport robot described herein to place each device into an appropriate tray.

As explained, the carrier shuttle is configured and controllable to transport the test carrier from the loading stage to the insertion stage. In some implementations, the insertion stage is a lower-precision stage than the loading stage, in that the insertion stage is configured and controlled to operate with higher tolerances for deviations than the loading stage. That is, while the loading stage may permit deviations of only microns, the insertion stage may allow deviations in terms of, e.g., tenths of millimeters, millimeters, or more. In this example, the mechanics of the insertion stage support these higher tolerances for deviations for reasons explained.

Figure 4:
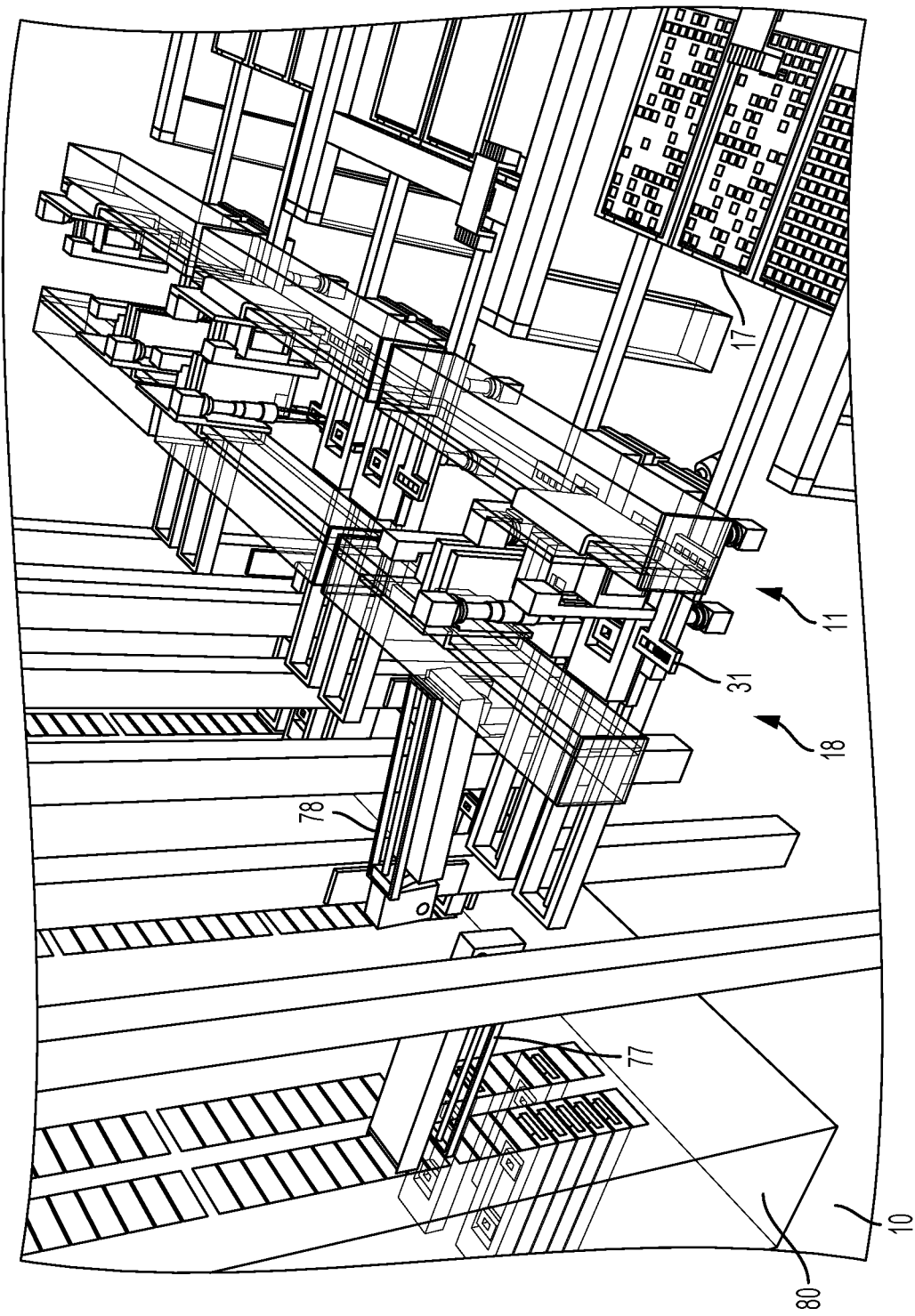
Figure 5:
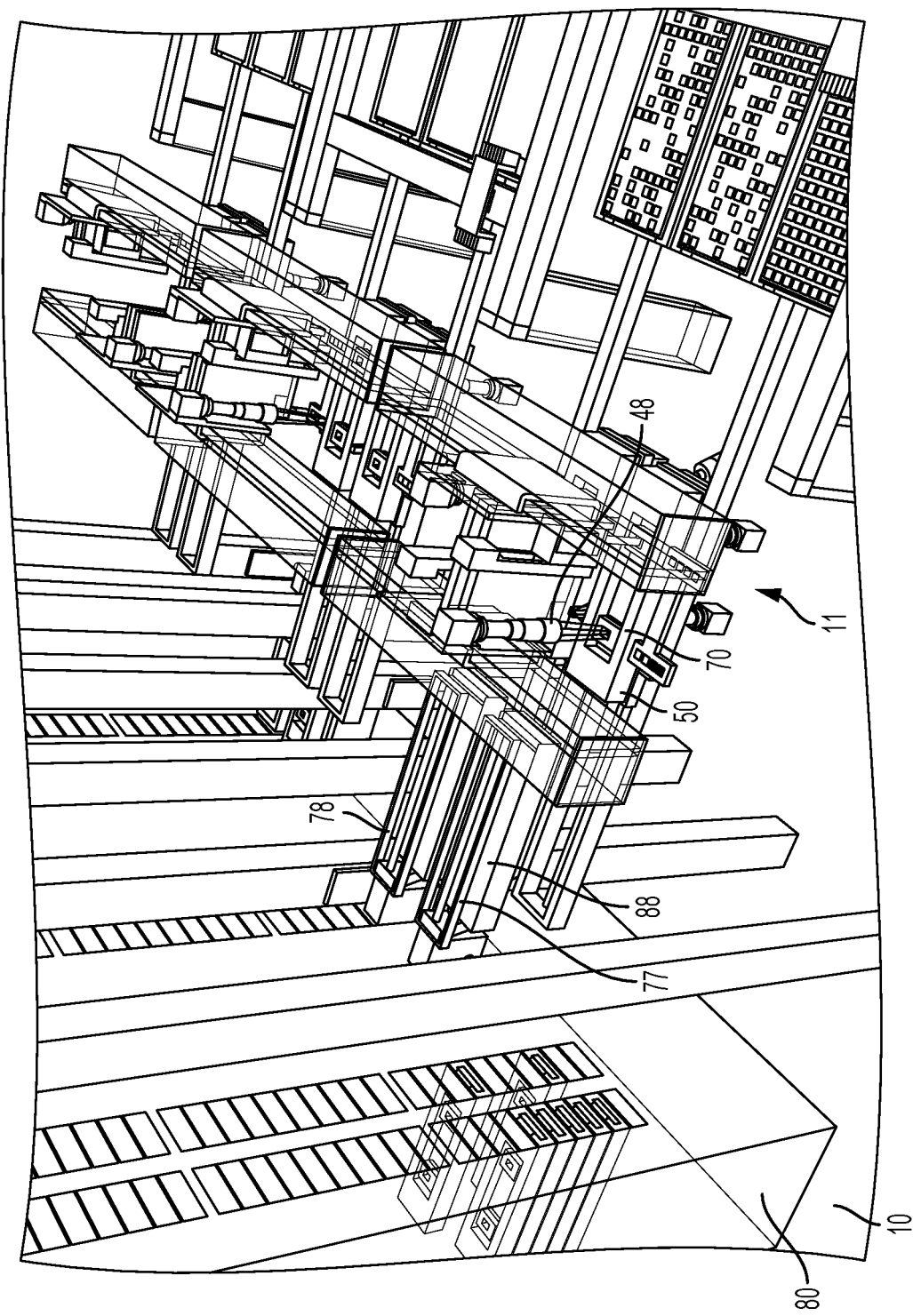

The insertion stage includes, but is not limited to, test arms 77, 78 (see, e.g., FIG. 5). Each of test arms 77, 78 is configured and controllable to receive a test carrier from a carrier shuttle and to insert the test carrier into a target test slot in a test rack 80. Test rack 80 is three-dimensional structure, as shown in FIGS. 1 to 20, which contains vertically-accessible test slots. In some implementations, the test rack provides physical support for the test carrier, enables communications to devices in the test carrier, and implements data collection and control of testing operations. In some implementations, the test rack is configured to control the thermal test characteristics of the devices in the test carrier, e.g., through use of air pushers, fans, or other convective or conductive heating and/or cooling devices.

In the example of FIGS. 1 to 20, two test arms 77, 78 are shown per slice; however, the test system may include any appropriate number of test arms. The test arms are movable in all three dimensions—X, Y and Z, including rotations and flipping in the manner described herein—in order to insert test carriers into test slots in the test rack, and to extract, or to remove, test carriers from the test slots in the test rack.

Figure 26:
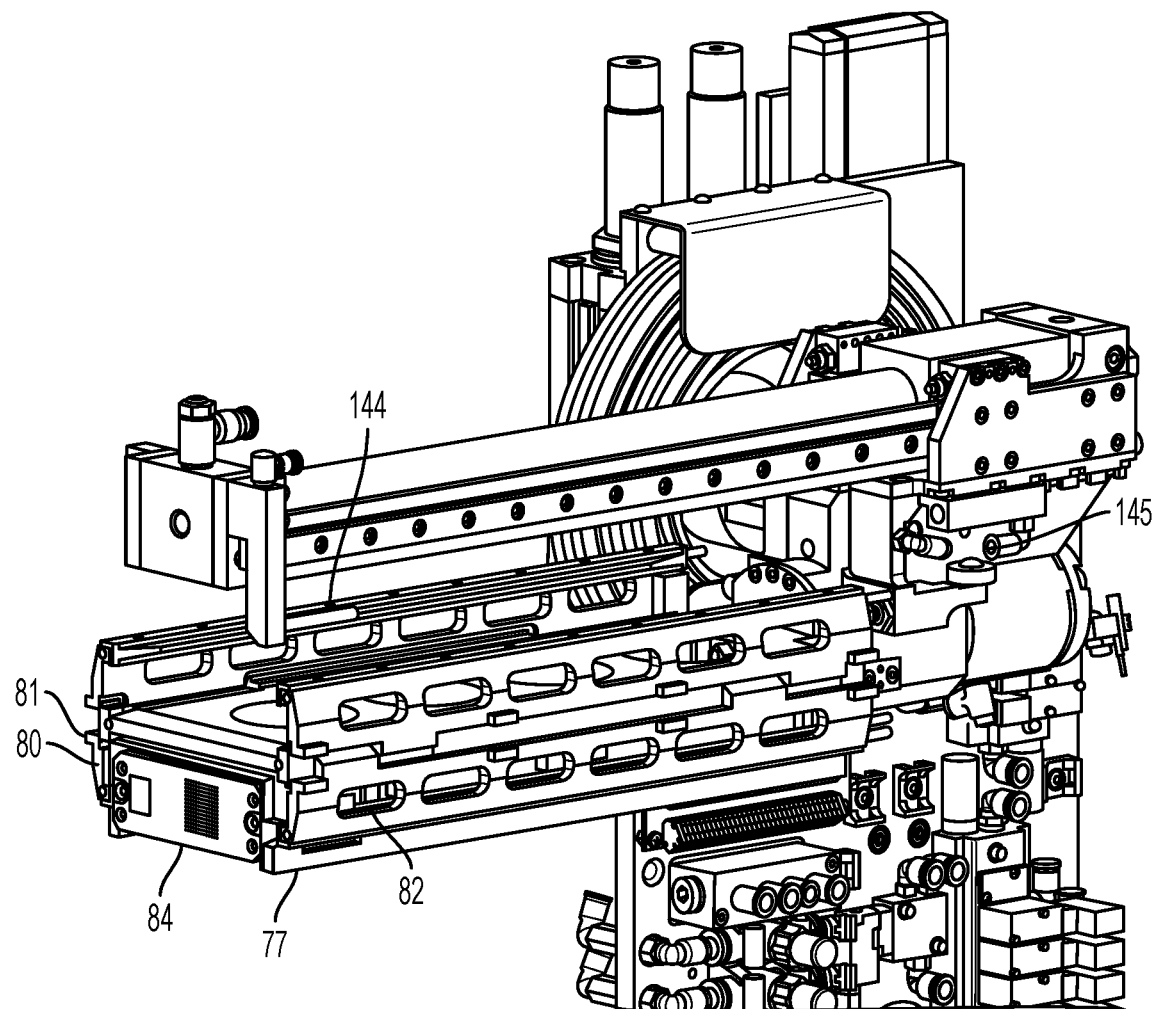
FIG. 26 is a perspective view of an example test arm and an example gripper that are included in the example test system.

Each test arm is configured to hold two test carriers at the same time—one on each face or side of the test arm. In some implementations, each side of a test arm (e.g., 77) includes a carrier-holding receptacle, such as gripper 80 of FIG. 26, for receiving, for holding, and for releasing a test carrier. In this example, the gripper is spring-loaded to accept a test carrier containing untested devices from a carrier shuttle, and to release a test carrier containing tested to device to the (same or different) carrier shuttle. In the example of FIG. 26, the gripper 80 includes two spring-mounted flanges 81, 82, that are configured to engage respective grooves on sides of a test carrier 84 in order to hold the test carrier in place absent external force applied to the test arms. The gripper comprises springs that are configured expand the flanges to accept the test carrier and then snap back into place to hold the test carrier. The flanges are also controllable to spread to release the test carrier. As described in more detail below, the carrier shuttle may be configured to control opening and closing of each gripper.

Test rack 80 includes multiple test slots. Each test slot may be configured and controllable to test devices in the test sockets on a test carrier, and to report the test results back to the computing system controlling the test system. The computing system keeps track of which devices passed testing, and which devices failed testing, and sorts the devices accordingly, as described herein. A test slot in the test rack is serviced by a test arm. In some implementations, during testing, a test slot always remains occupied except for the short time during which test carriers are exchanged in the slot. For example, a test arm may arrive at a test slot while holding a test carrier containing untested devices, extract a test carrier containing tested devices from the test slot, and insert the test carrier containing untested devices into that same test slot from which the other test carrier was extracted. Thus, except for the time between the removal and insertion of the test carriers, the test slot remains occupied. Each test slot in the test rack may be serviced in this manner to enhance testing throughput. Examples of how test carriers are inserted and extracted are provided below.

In an example operation, a test carrier containing tested devices is extracted from a test slot and held in a first gripper on one side of a test arm. At this time, the test arm also holds a test carrier containing untested devices in a second gripper on the other side of the test arm. At least part of the test arm holding the test carriers then rotates (e.g., about 180°) while in front of the now-open test slot so as to position the test carrier containing untested devices for insertion into the test slot. The test carrier containing untested devices is then pushed into the test slot using an air-controlled arm, referred to herein as a pusher (described in more detail below), leaving that second gripper empty and ready to receive a new test carrier The test arm then moves—e.g., flips and rotates—to position itself to pick-up a test carrier containing untested devices from a carrier shuttle, and to deposit the test carrier containing tested devices onto the (same or different) carrier shuttle. In this example, the test carrier rotates (e.g., about 180°) and flips, as described with respect to FIGS. 17 and 18. The rotation is about a longitudinal axis of the test arm and the flipping includes a rotation in the X dimension. As a result of this movement, the empty second gripper is in position to pick-up a test carrier containing untested devices from the carrier shuttle. Accordingly, the second gripper is controlled to pick-up the test carrier containing untested devices from the carrier shuttle. The test arm then rotates along its longitudinal axis at a point above, or proximate to, the carrier shuttle to position the test carrier containing tested devices for deposit onto the carrier shuttle. The first gripper holding that test carrier is opened, resulting in the test carrier containing the tested devices being deposited on the carrier shuttle. Thereafter, the carrier shuttle transports test carrier containing the tested devices to the loading stage.

At this time, therefore, the first gripper is empty and the second gripper holds a test carrier containing untested devices. Accordingly, the test arm rotates and flips to position the test arm to service another test slot. The test arm may also move vertically to position itself in front of a target test slot to be serviced. This rotation and flipping is opposite to the rotation and flipping performed to position the test arm above the carrier shuttle. Thus, the test arm is positioned to extract, or to receive, from the target test slot, a test carrier containing devices that have been tested. The test carrier containing devices that have been tested is received into the theretofore empty first gripper. Following receipt of the test carrier containing devices that have been tested, the test arm rotates to position the test carrier in the second gripper, which contains devices that have not been tested, into position for insertion into the same test slot. Thereafter, the test carrier containing devices that have not been tested is pushed into that test slot, and the foregoing operations are repeated, slot-by-slot.

As noted, to access different test slots in the test rack, the test arm is configured to move in the Z dimension, which is orthogonal to the X and Y dimensions. To this end, each test arm 77, 78 may be mounted on a corresponding track 84, 85 (see, e.g., FIG. 18), and controlled robotically to implement the Z-dimension movement, as well as the X- and Y-dimensions movements required to implement the rotation and flipping operations. The Z-dimension, in this example, is in a different plane than the X and Y dimensions. In some implementations, each test arm may be configured to move in the X direction, e.g., across the test rack, or the Y direction (into or out of the test rack).

The test stage includes, but is not limited to, the test rack and slots therein. As explained above, the test rack 80 includes electronics for implementing testing operations on devices in the test carriers. In some implementations, the test stage is a lower-precision stage than the loading stage, in that the test stage is configured to operate with higher tolerances for deviations than the loading stage. That is, while the loading stage may permit deviations of only microns, the insertion stage may allow deviations in terms of, e.g., tenths of millimeters, millimeters, or more. In this example, the mechanics of the test stage and the insertion stage support these higher tolerances. For example, as described below, the insertion stage may include a pushing mechanism, or pusher, which pushes a test carrier through a gripper into a test slot, or pulls a test carrier from a test slot into a gripper.

In some implementations, the pusher may precisely push and pull the test carrier along only one degree of freedom, while allowing the test carrier to move, in a relatively loose manner, in the other five degrees of freedom. In some cases, this configuration may reduce, or eliminate, the need for vision systems and precision robots for loading test carriers in to the test rack. For example, the pusher may push or pull the test carrier in one dimension (e.g., the Y dimension) and, in this example, not include tight servo-control. The pusher allows other movement of the test carrier in other dimension, which may result in test carrier wobble. This test carrier wobble, however, is accounted for, and addressed, in the test system design. For example, each test slot contains walls, which are configured to as guides to funnel a test carrier into the test slot so that the test carrier eventually reaches a resting position where electrical contacts on the test carrier can mate to complementary electrical contacts in the test carrier. The guides enable the test carrier to reach its resting position even if the insertion process is not implemented with precision. Thus, in some implementations, by pushing in one dimension, and making use of guides within the test carrier that operate with relatively large tolerances, the test system is able to control costs through use of less precise robotics, while maintaining testing throughput and speed. In some implementations, the use of a pusher that operates in one degree of freedom and guides configured to direct a test carrier in a test slot enable implementation of a low-cost automation solution to perform a task that aligns electrical connections relatively accurately at the back of the carrier. In some implementations, the test slot and the test carrier may be manufacture of plastic. In some implementations, the plastic may be low-cost.

The subsequent description follows devices through the example system of FIGS. 1 to 19, from the I/O stage, through testing, and back to the I/O stage.

In FIG. 1, a device that is untested has been moved, via device shuttle 31, from the transport stage to the loading stage. In the loading stage, loading robot 48 loads the device into test carrier 50. In FIG. 2, device shuttle 31 moves back to the transport stage. In FIG. 3, another device is picked-up by transport robot 30, and moved to device shuttle 31. In FIG. 4, device shuttle 31 transports the other device from the transport stage to the loading stage. In FIG. 5, a socket cap is fixed to the device in socket 70. Cameras above and below the loading stage capture images of the device before and after placement in the test carrier, and the computing system that controls the test system controls the loading robot with micron-level precision to place the device and socket cap with appropriate precision. As described herein, at this point, the test carrier is held in place on a carrier shuttle 73 using a vacuum created by suction.

Figure 6:
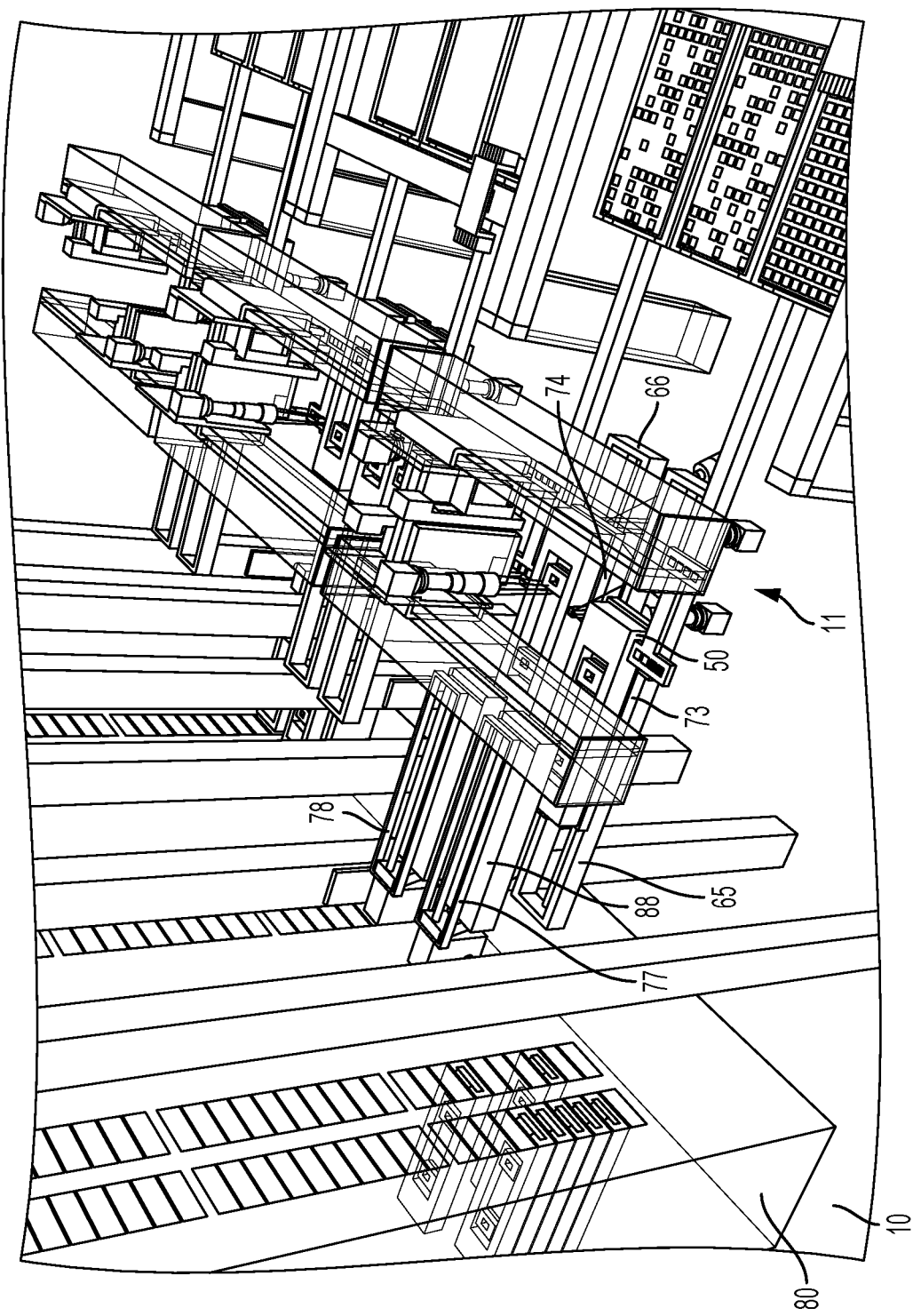
Figure 7:
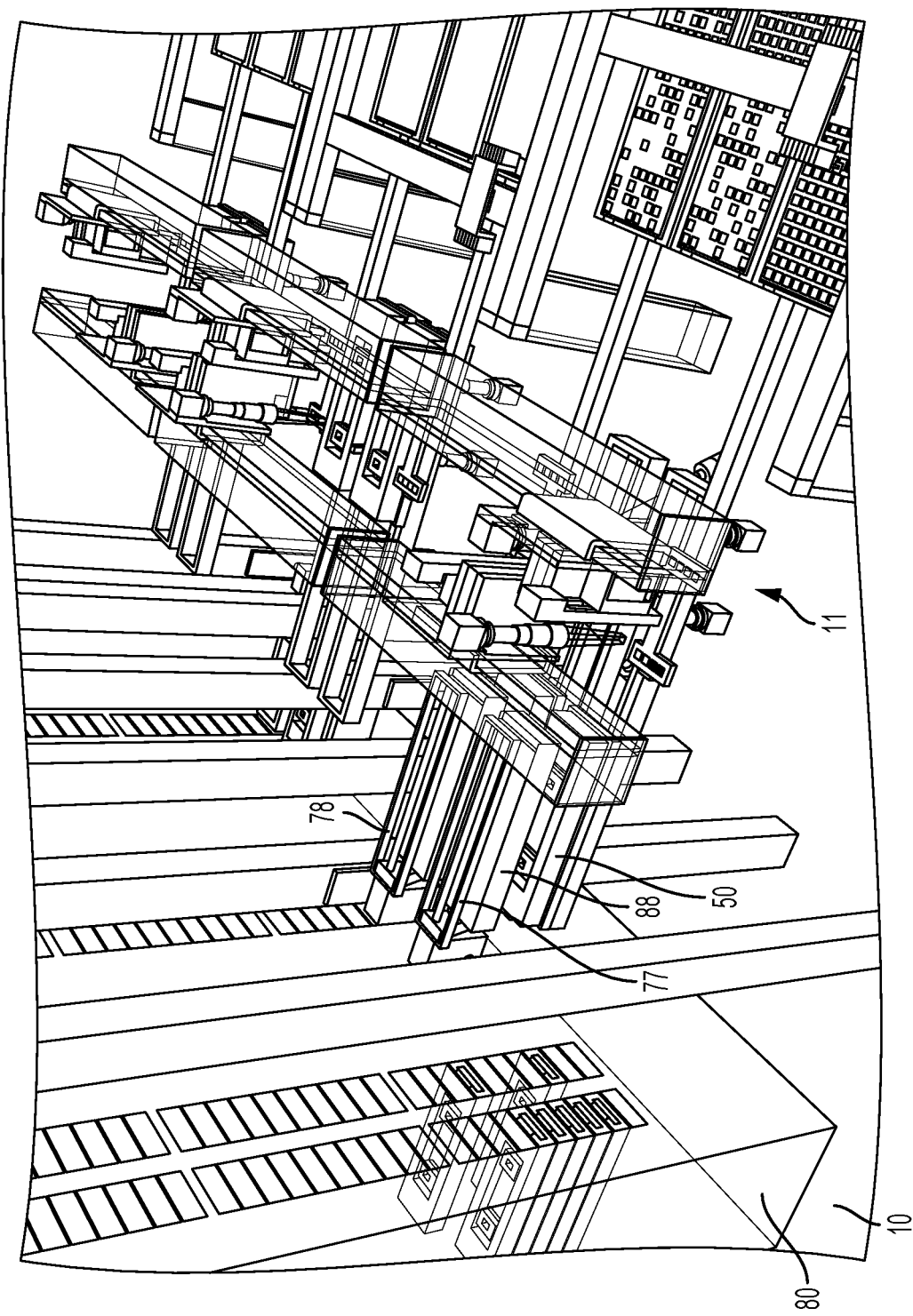

After both sockets of test carrier 50 have been loaded with devices to be tested, the socket carrier is transported to the insertion stage by carrier shuttle 73, as shown in FIG. 6. There, the vacuum is released, allowing the test carrier 50 to be picked-up by the gripper in test arm 77, as shown in FIGS. 7 and 8. In the example of FIGS. 7 and 8, test arm 77 moves into place to enable a gripper (e.g., gripper 80 of FIG. 26) to engage test carrier 50, and to hold the test carrier for movement.

Figure 9:
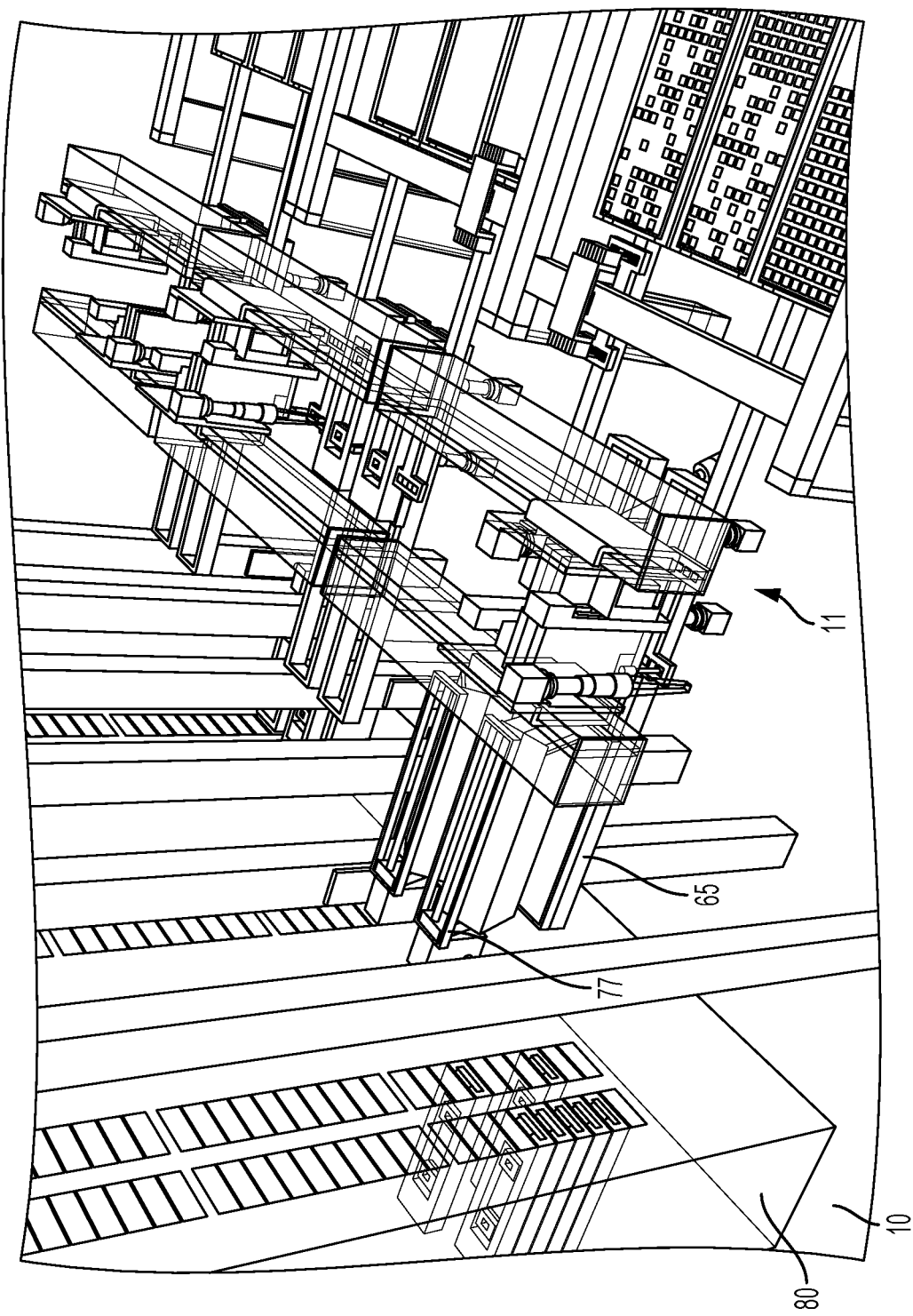
Figure 10:
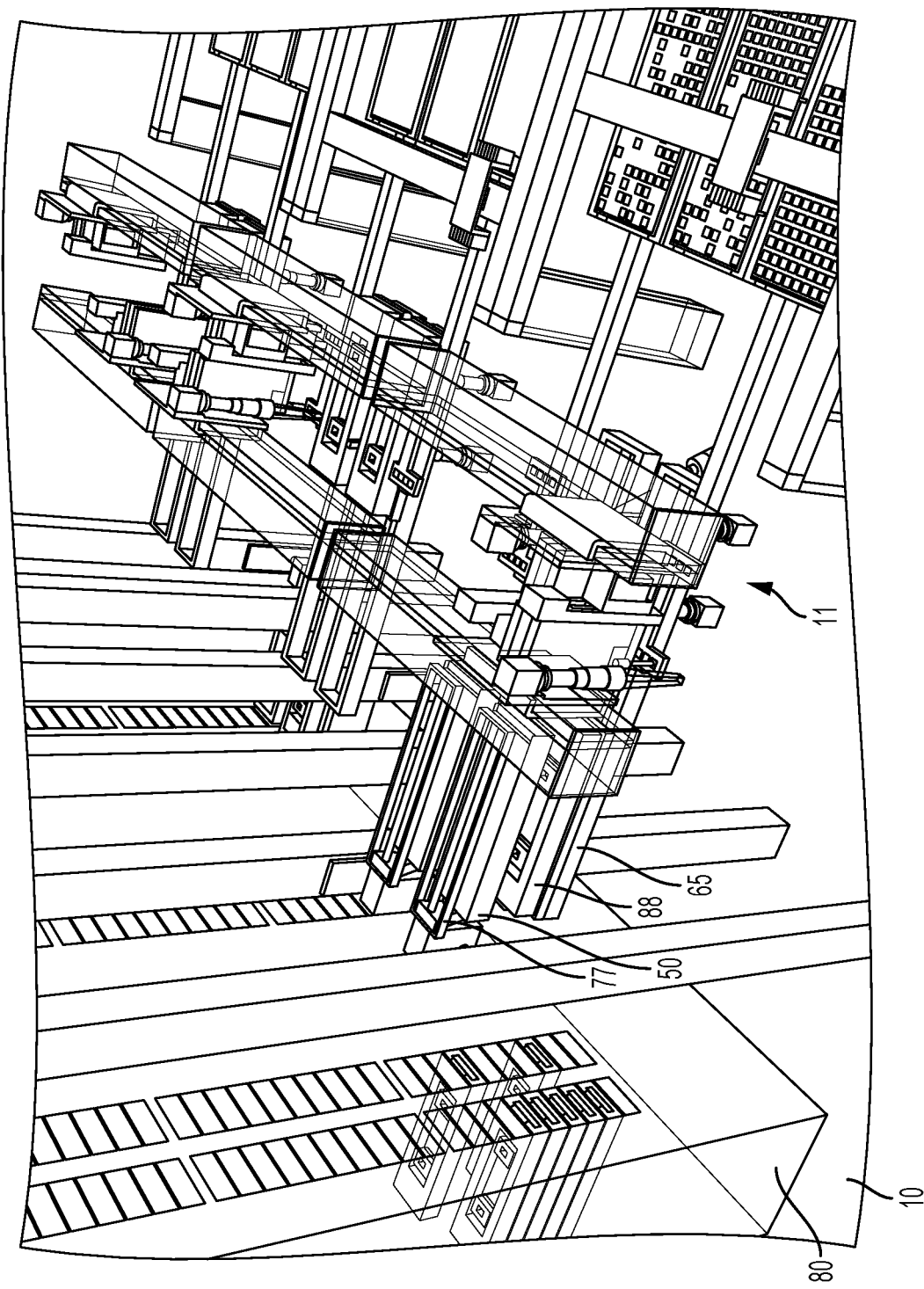
Figure 11:
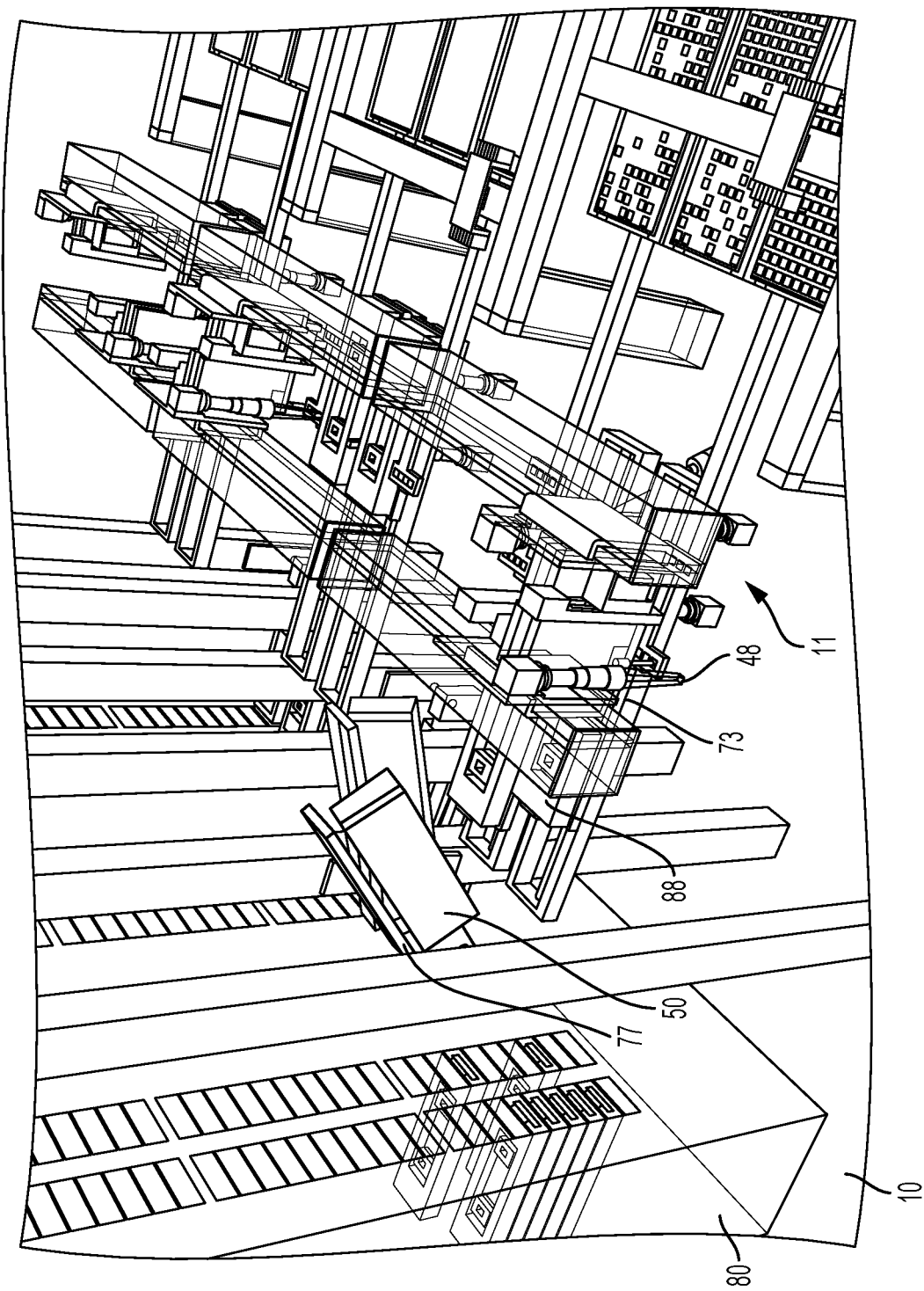
Figure 12:
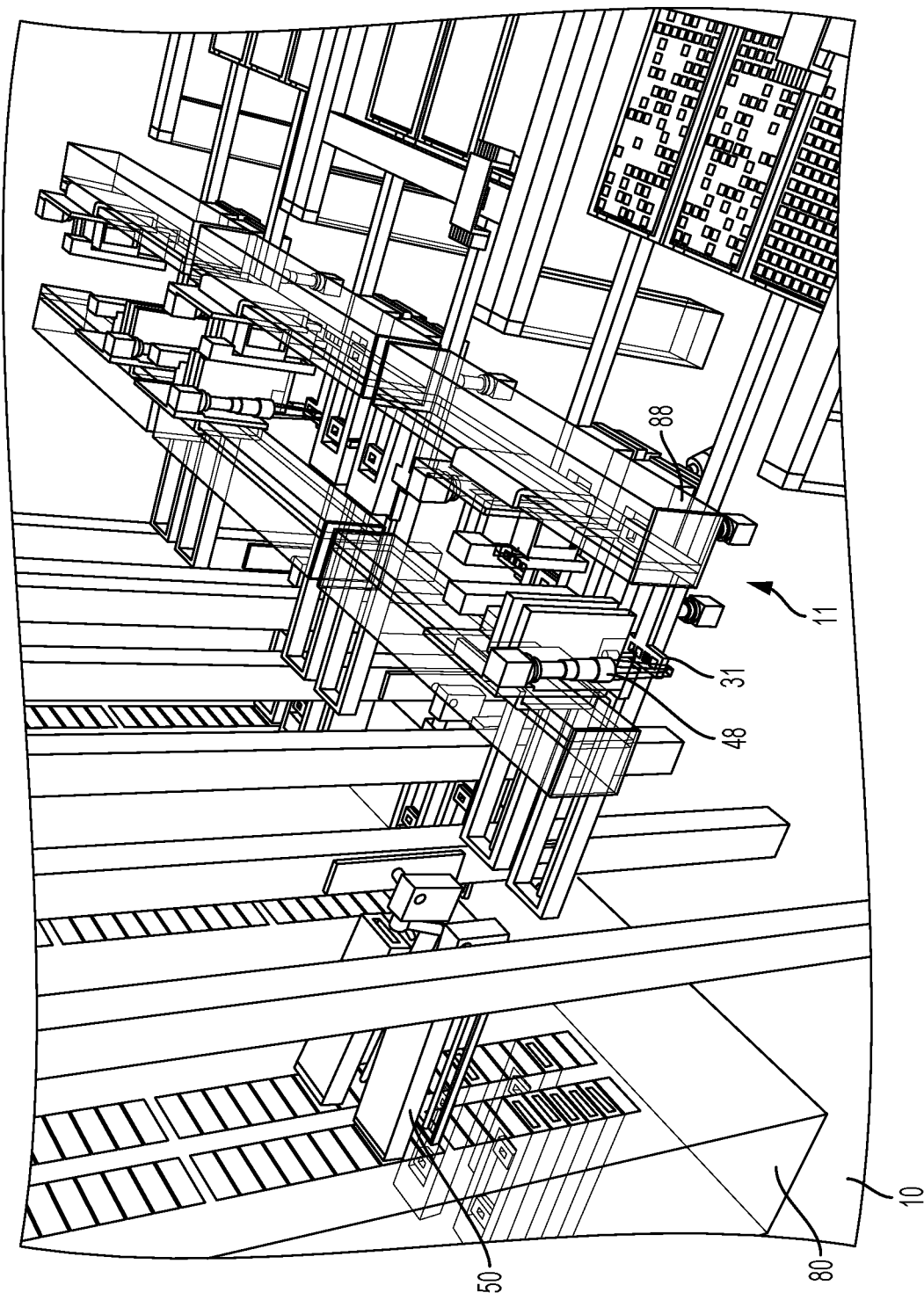
Figure 13:
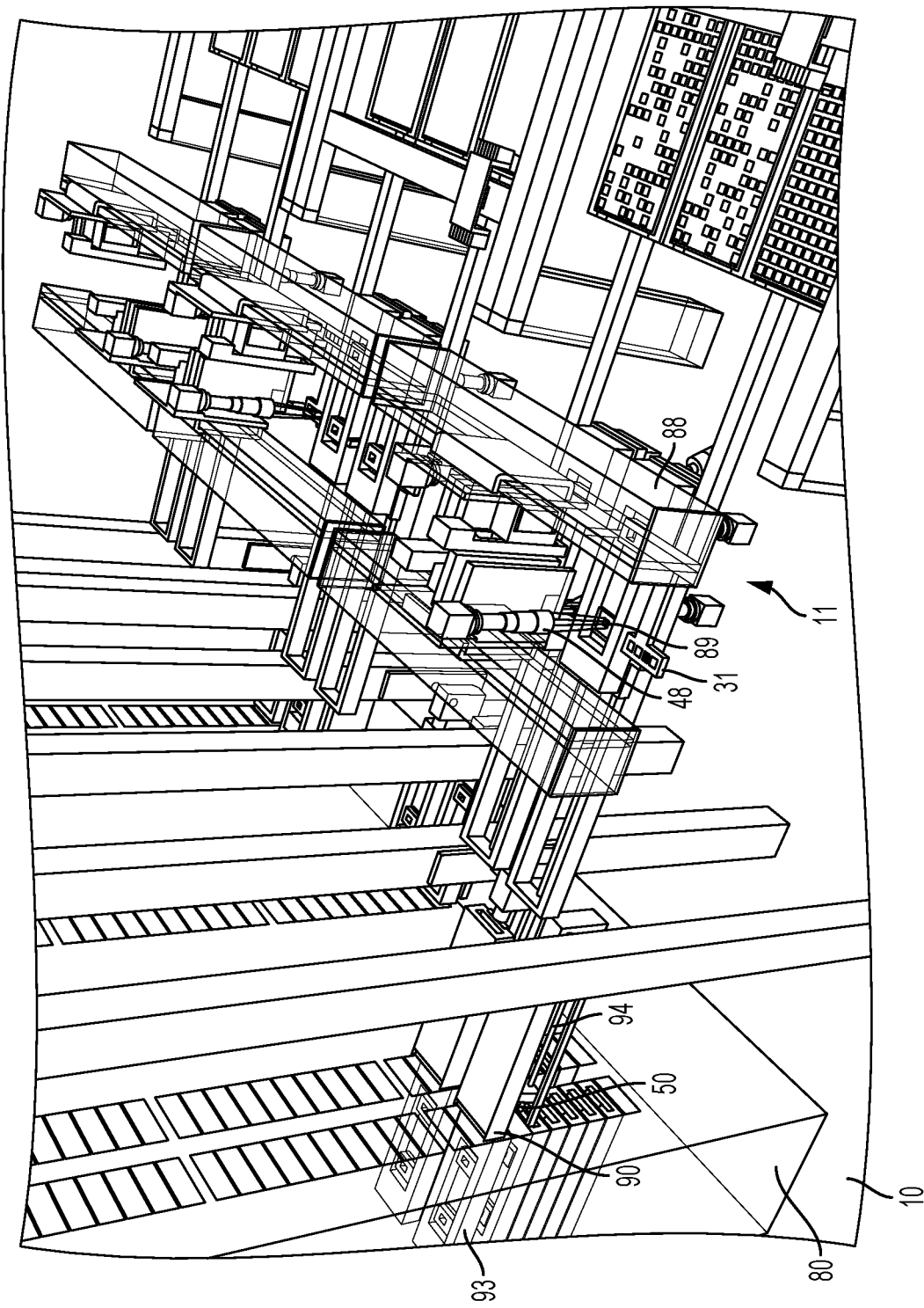
Figure 14:
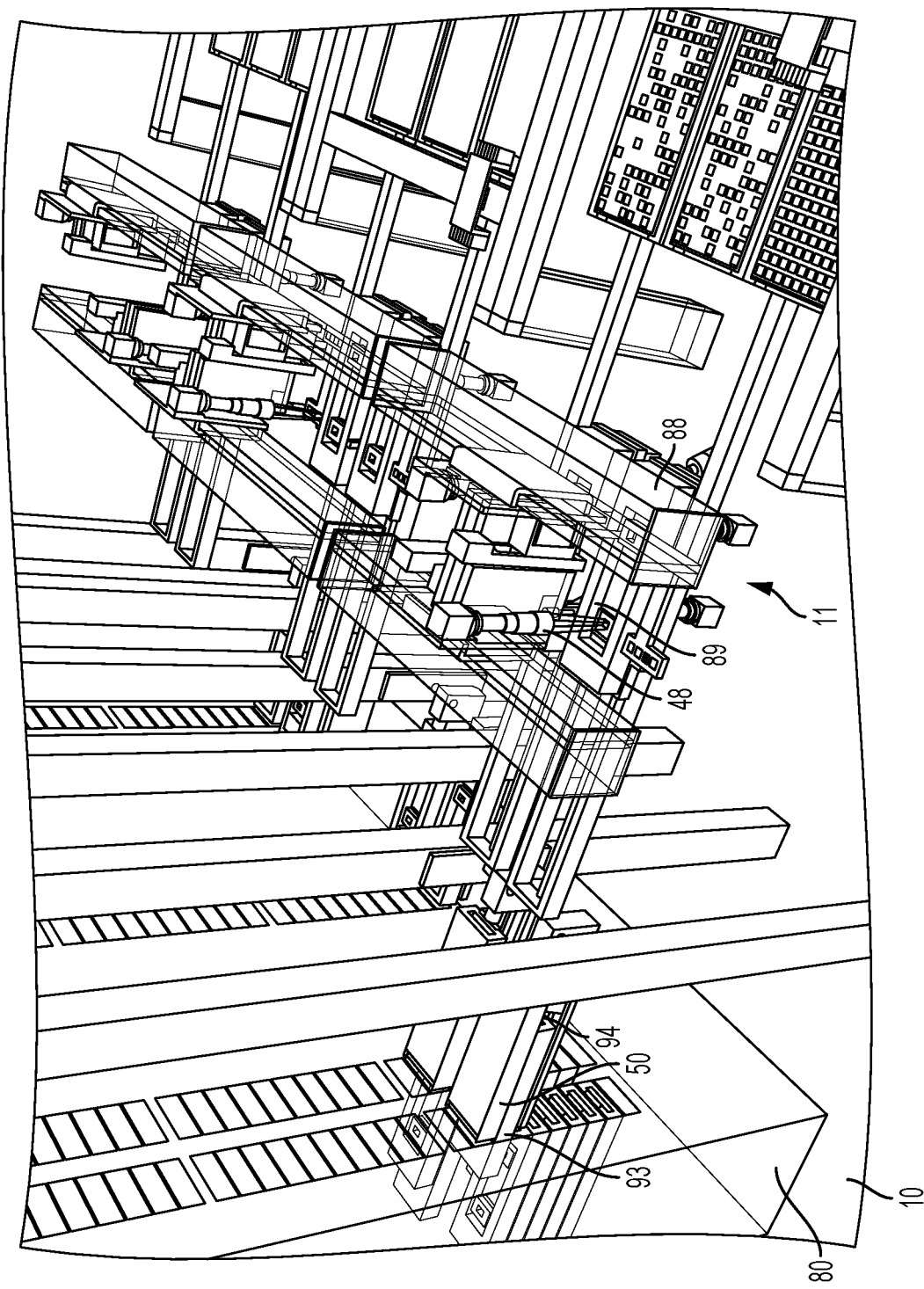

As shown in FIG. 9, test arm 77 then rotates along its longitudinal axis to deposit test carrier 88 containing tested devices on carrier shuttle 65 as shown in FIG. 10. The other gripper of test arm 77 is therefore empty for the journey back to test rack 80. Test arm 77 moves into position in front of a slot of the test rack to extract a test carrier from the slot, and to insert the test carrier containing the untested device into the test slot. As shown in FIGS. 11 to 13, the test arm movement includes rotating a part of the test arm holding the test carrier along its longitudinal axis, and flipping the test arm (e.g., rotating the test arm about 180° along the X-axis) so that the test arm 77 is positioned in front of a slot 90 to remove a test 93 carrier from the slot. As shown in FIGS. 13 and 14, test arm 77 extends pusher 94 to connect to test carrier 93, and retracts pusher 94 to draw test carrier 93 into the gripper of test arm 77.

Figure 18:
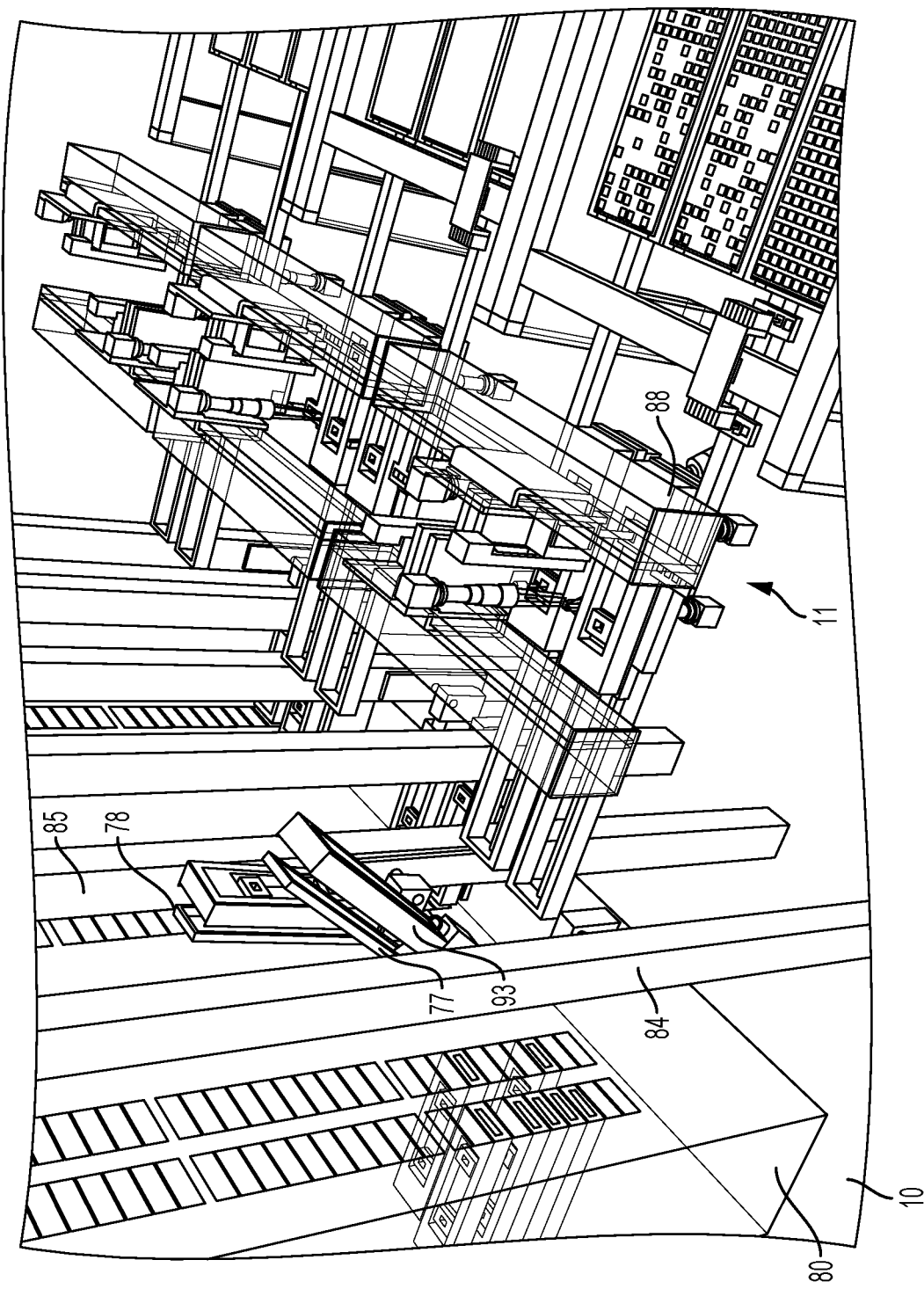
Figure 19:
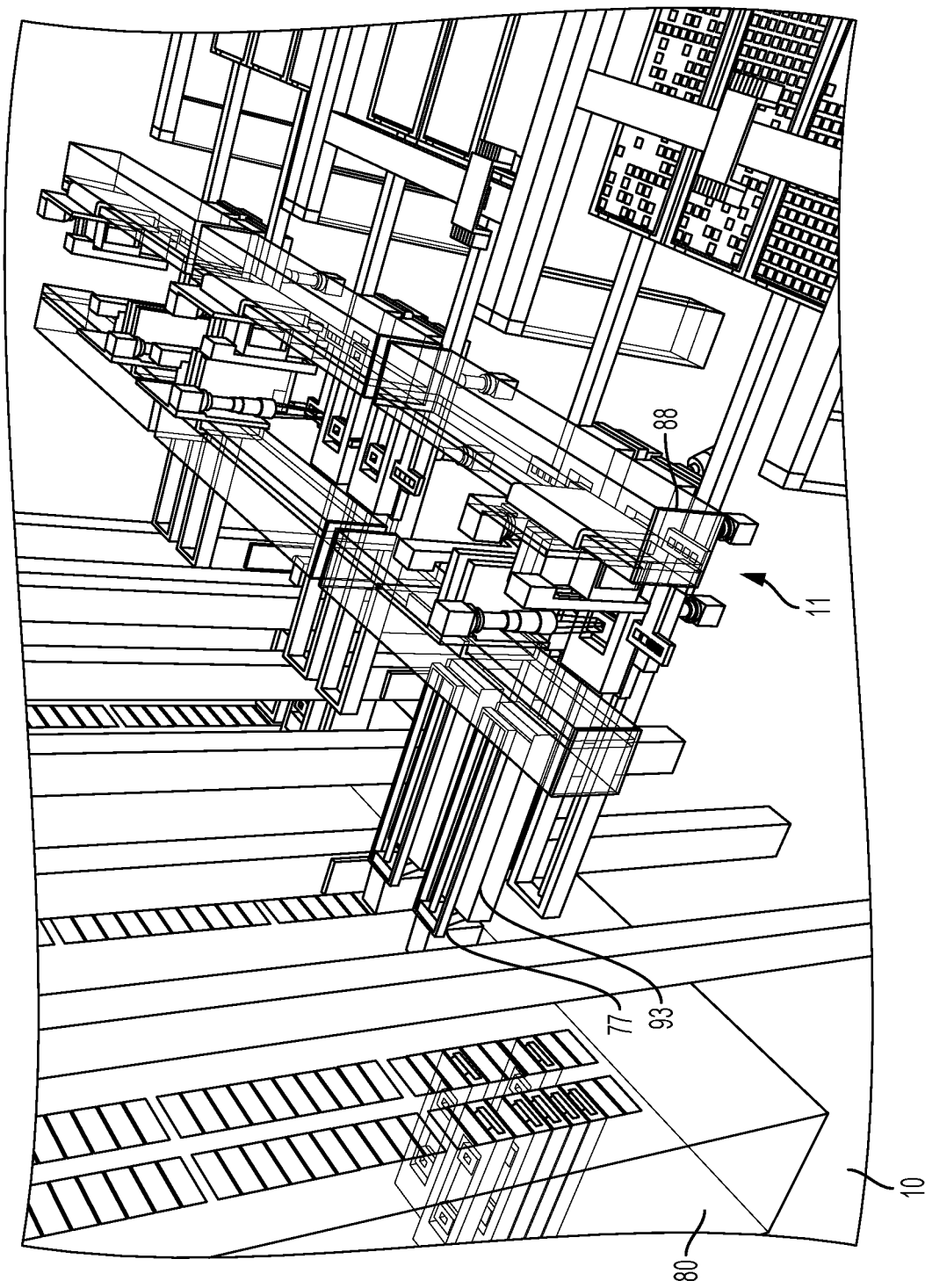

At the position of FIGS. 13 to 16, test arm extracts test carrier 93 containing tested devices from test slot 90, and rotates following extraction as shown in FIG. 15. The rotation positions test carrier 50 for insertion into slot 90 via pusher 94, as shown in FIG. 16. Test carrier 93 containing tested devices is above the slot at this time. Thereafter, testing of devices in test carrier 50 is performed in the test slot. Meanwhile, as shown in FIGS. 17 to 19 test arm 77 flips and rotates to position itself relative to the carrier shuttle.

More specifically, following extraction and subsequent insertion of a new test carrier in the test slot, the part of test arm 77 that holds test carrier 93 rotates along its longitudinal axis and flips (e.g., rotates along the X-axis) to position its empty gripper to pick-up a new test carrier from the carrier shuttle. Then, after picking-up a new test carrier from the carrier shuttle, the test arm rotates in place to deposit a test carrier containing tested devices onto the carrier shuttle.

At the loading stage, a device that has been tested is removed from test carrier, such as test carrier 88, and placed onto device shuttle 31. In an example implementation, the ports in the carrier shuttle force air outwardly, causing the carrier shuttle to float on the device carrier. While the test carrier is floating on pressurized air, a socket picker head of the loading robot engages a socket cap over the device, and removes the socket cap as described herein. The socket cap is then held by the socket picker head for subsequent placement on the test carrier, as described herein. At this time, the ports in the carrier shuttle suction air, creating a vacuum to hold the test carrier in place. A device picker head on the loading robot removes the device that has been tested from the test socket. As described, vacuum suction may be used by the device picker head to pick-up and to hold the device during movement, a mechanical grasping mechanism may be used by the device picker head to pick-up and to hold the device during movement, or a combination of vacuum suction and one or more mechanical elements may be used by the device picker head to pick-up and to hold the device during movement. In any event, the device picker head moves the device that has been tested to an empty receptacle of device shuttle. The computing system that controls operation of the test system may keep track of which receptacles of the device shuttle are empty, and control the loading robot accordingly.

In some implementations, after all untested devices have been removed from the device shuttle, and tested devices have been placed into receptacles on the device shuttle, the computing system that controls operation of the test system controls the device shuttle to move from the loading stage towards, and to, the transport stage. At the transport stage, the transport robot 30 removes the devices that have been tested from the device shuttle, and places the devices into an appropriate tray based on whether a device has passed testing or has not passed testing. As described, one or more cameras in the transport stage keep track of open cells in the trays for placement of tested devices. A tray containing the tested device may be moved back into the feeder stage after the tray is full or at least partly full.

Figure 27:
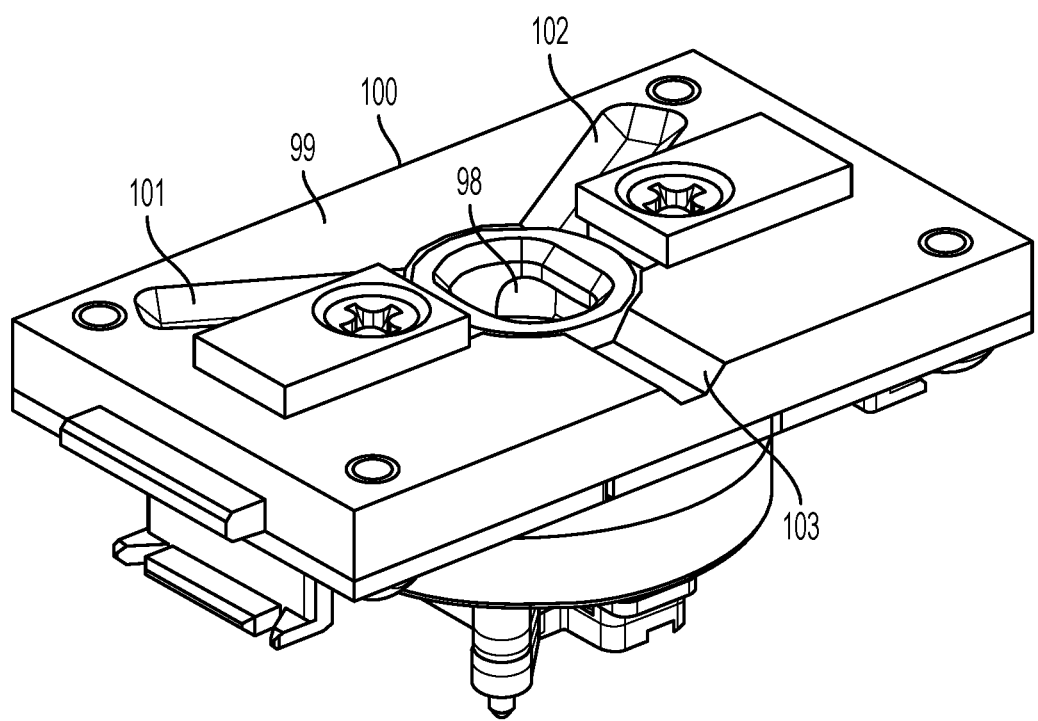
FIG. 27 is a top perspective view of an example socket cap that covers a socket in a test carrier in the example test system.

Referring to FIG. 27, in some implementations, the socket cap 100 may be, or include, a kinematic mount, that applies force to a device in a socket via a compression spring. In some implementations, the kinematic mount is built into the top of the socket cap, and an air-float bearing is employed to float the test carrier during docking of the kinematic mount. In some implementations, the kinematic mount is a purely mechanical mechanism for precisely aligning the socket and the socket lid. In some implementations, a vacuum system is used within the same air bearing to suction down (e.g., to chuck) and to secure the test carrier during the loading and unloading of devices from the test carrier following alignment with the kinematic mount. In some implementations, as described, the test carrier contains two test sockets, and a separate socket cap is attachable to each test socket. In some implementations, the socket cap floats during the connection (or latching) process, so that the act of connecting the socket cap to the socket does not disturb the device location during precision placement of the socket cap. In this regard, the tooling balls may be lowered to an arbitrary height, and then the test carrier may be floated upwards to enable the tooling balls to align the socket cap to the socket cap actuator. In some implementations, this floating ensures that vertical tolerances in the test carrier do not result in excessive downward force being applied to the socket cap, and, in turn, into a circuit board within the test carrier, which could result in micro-strain fractures of copper tracking within the circuit board within the test carrier. In some implementations, once the test carrier is aligned to its unique position, this position is retained by applying negative pressure to the floatation mechanism (e.g., by suctioning air to create a vacuum), causing the test carrier to secure to the base of the carrier shuttle.

As explained the socket cap is configured to contact a device in a socket of the test carrier and, in response to pressure, to cause the device to connect electrically to electrical connections in the test carrier and/or in the socket cap. An actuator may be movable relative to the socket cap to engage the socket cap to enable to socket cap to apply pressure as described herein. As described with respect to FIG. 32 below, the actuator may include a key element and tooling balls. Referring also to FIGS. 28 to 31, socket cap 100 includes a top plate 99 having grooves 101, 102, 103 that are configured and arranged to engage the tooling balls. The top plate includes a hole 98 having a complementary shape to the key element to allow the key element to pass through the hole when the key element is in the proper orientation.

Figure 29:
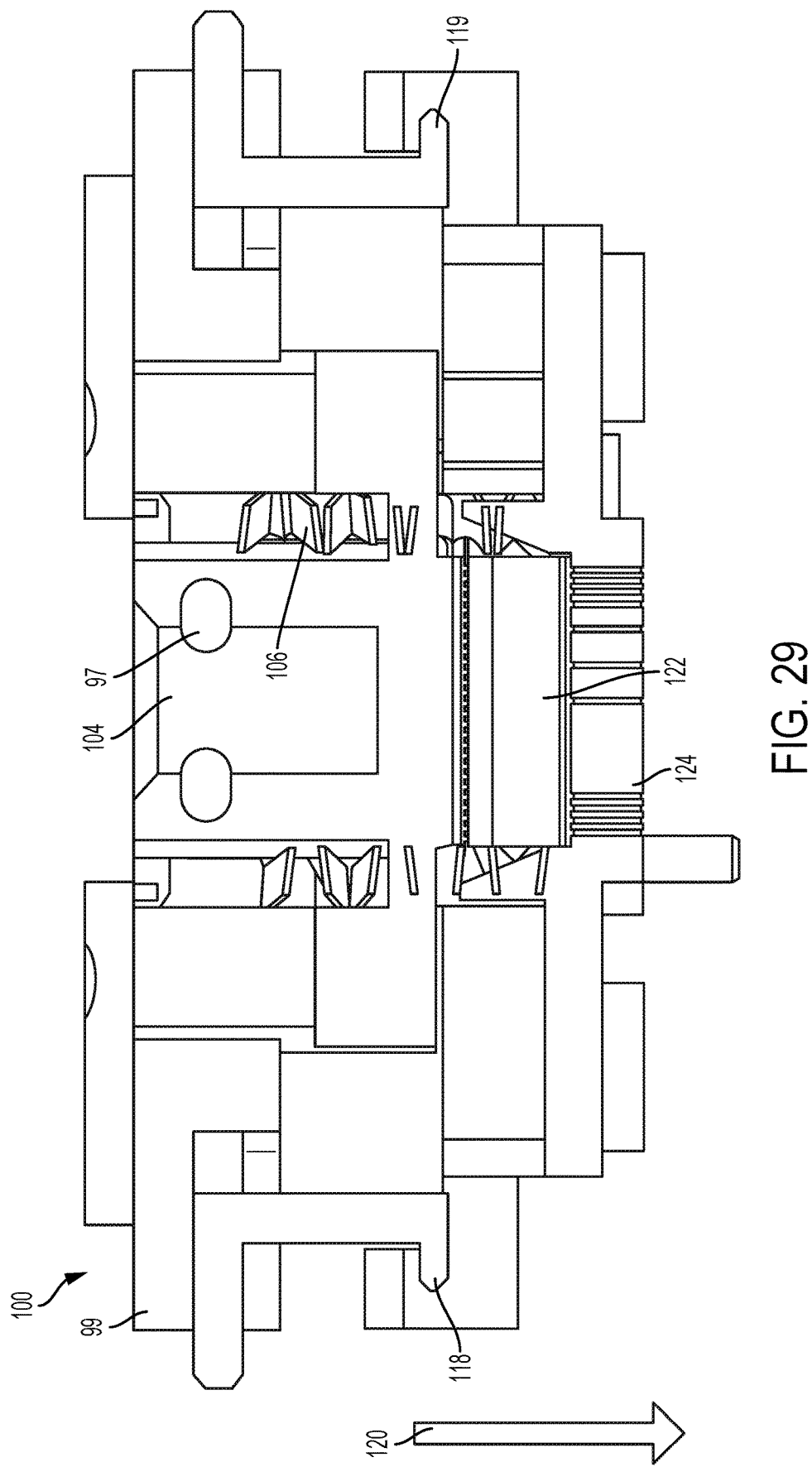
FIG. 29 is a cut-away view that includes the example socket cap.
Figure 31:
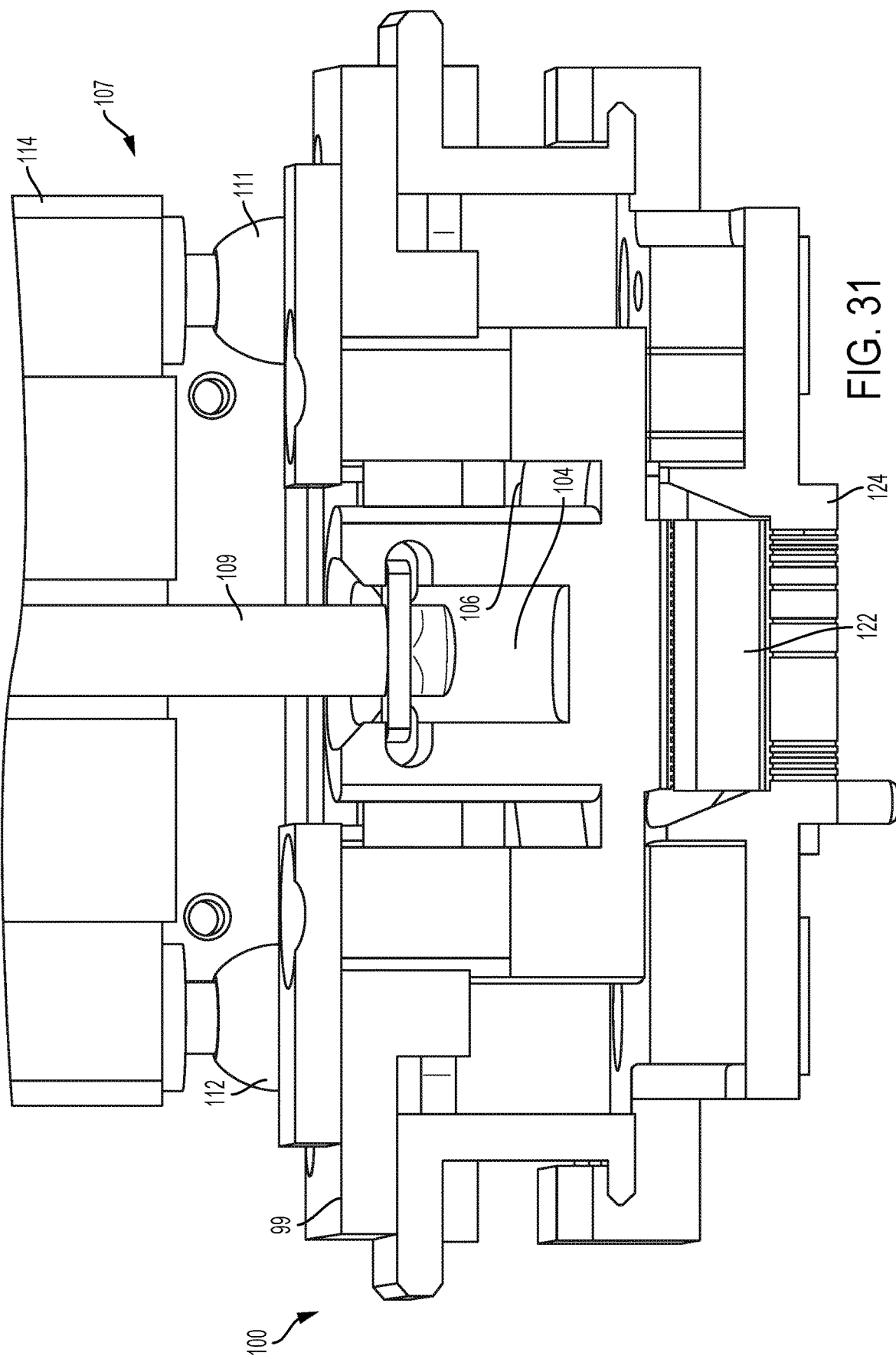
Figure 32:
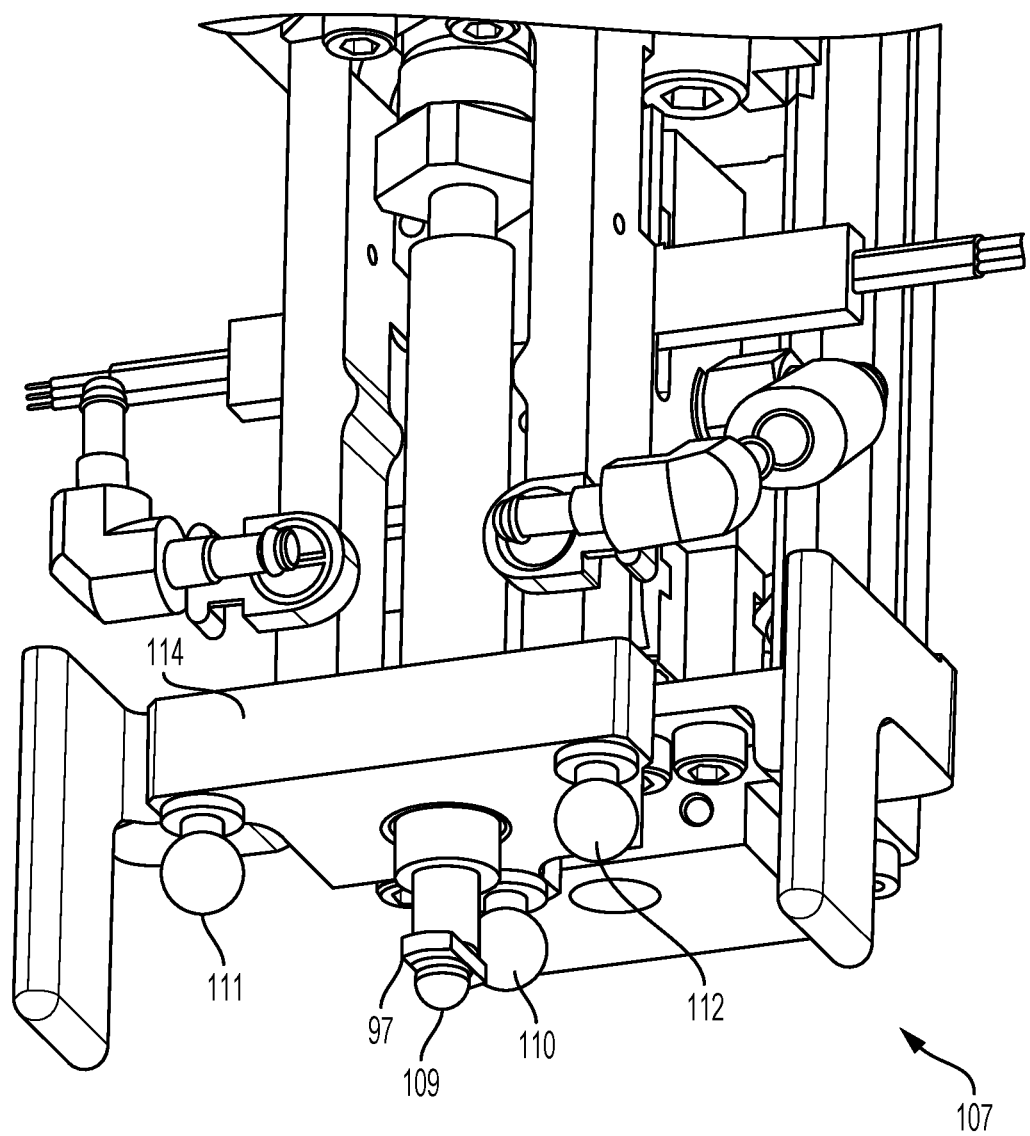
FIG. 32 is a perspective view of the example actuator.

Referring to FIGS. 29 and 31, the example socket cap also includes a center plunger 104 that is engageable by the key element. The center plunger 104 includes a hole to receive the key element that passed through the top plate. Referring to FIGS. 29 and 32, the key element and the plunger hole have complementary shapes 97 to allow the key element to pass through the plunger hole when the key element is in the proper orientation. The key element is configured to rotate in the plunger hole to rotate to engage notches in the plunger. That is, when rotated within the plunger hole, the key element cannot be slid out of the hole, but rather connects to the plunger and causes the plunger to move in response to upward force. The socket cap also includes a compression spring 106 which is controlled by the actuator.

Figure 30:
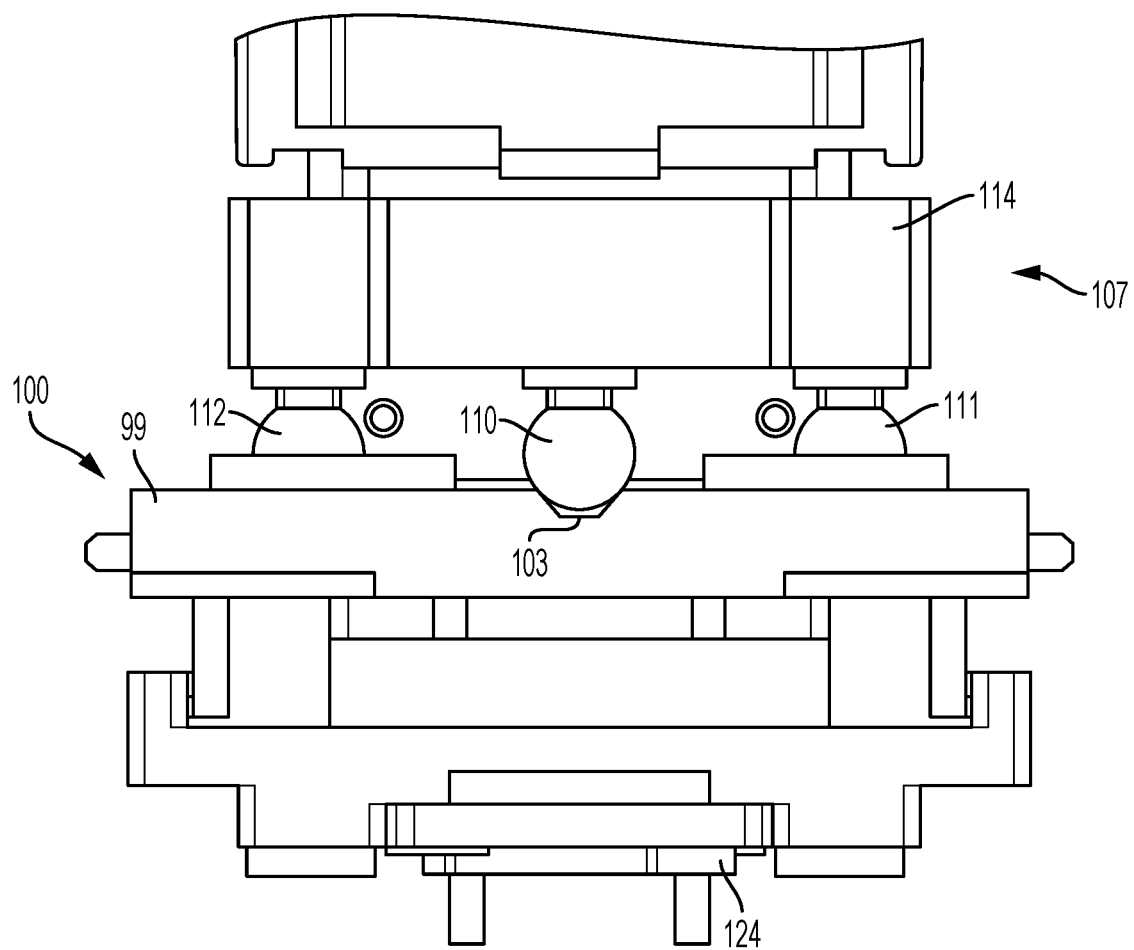
FIGS. 30 and 31 are cut-away views showing an example actuator engaging the example socket cap.

Referring to FIG. 32, actuator 107 includes the key element 109 that is rotatable, tooling balls 110, 111, 112 arranged relative to the key element; and a block 114 to which the tooling balls are fixed. The key element is movable through the block, and relative to tooling balls. Referring to FIGS. 30 and 31, actuator 107 is controllable to move the key element inside plunger 104 and to rotate the key element inside plunger 104. Meanwhile, the tooling balls engage grooves, as shown in FIGS. 30 and 31. Then, in this example, the actuator is controlled to push the tooling balls downward against the grooves, and to pull the key element upwards along with the plunger 104. This causes compression spring 106 in the socket cap to compress. With the compression spring compressed in this manner, the socket cap may be placed precisely over the device in the socket without applying significant force. Once the socket cap is placed into position, appropriate force may be applied by releasing the compression spring.

Figure 28:
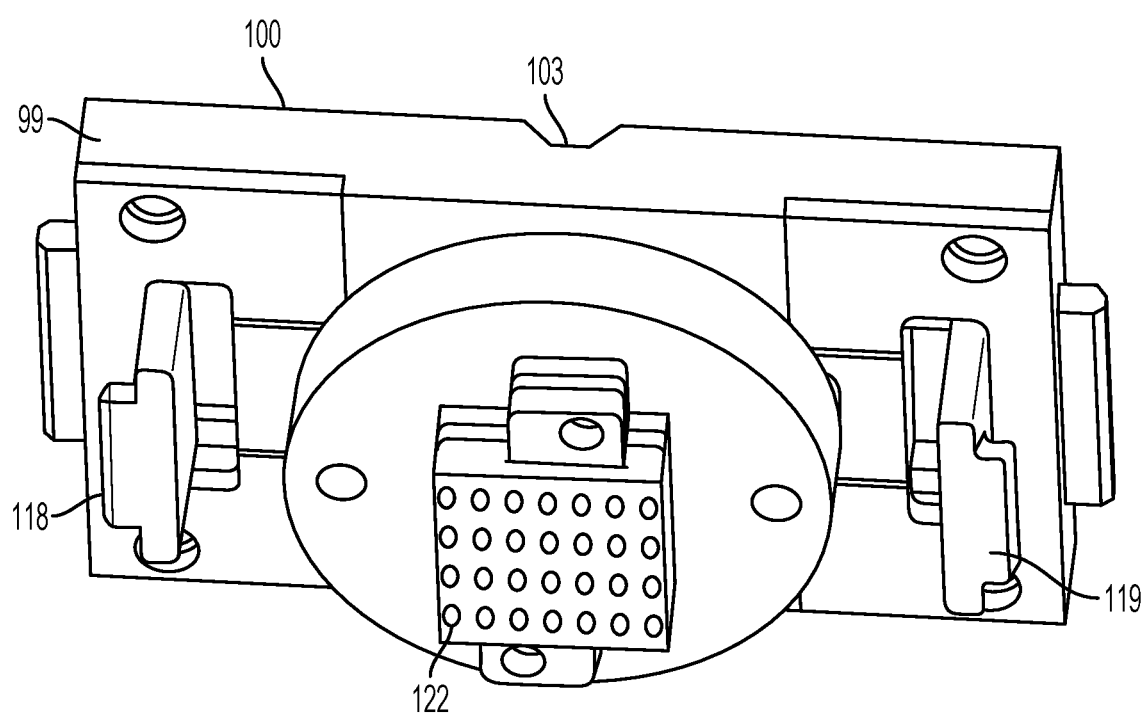
FIG. 28 is a bottom perspective view of the example socket cap.

In this regard, the actuator may be part of a socket picker head of a loading robot. The socket picker head places the socket cap over the socket containing an untested device. The socket cap includes flanges 118, 119 that physically hold the socket cap in place in the test socket. Following physical connection of the socket cap to the socket via the flanges, the actuator is released, which causes the compression spring to release and to apply force downward, in the direction of arrow 120 (FIG. 29). This force is sufficient to make the connections among the test carrier, the device, and/or memory in the socket cap. For example, as shown in FIGS. 28 and 29, the socket cap includes a memory stack 122 containing pins that connect, e.g., through an interposer 124, to complementary pins on an upper surface of the device to be tested. The compressive force of the spring enables connections of these pins to the device and connection of pins on the device to complementary pins on a circuit board that is on the test carrier and that is located beneath the device to be tested.

As described, in some implementations, the test arm includes a pusher that is configured to extend and thereby to push the test carrier into the test slot. In some implementations, the pusher moves in one dimension only (e.g., the Y dimension), and pushes the test carrier into the test slot in only one degree of freedom. As a result, during movement of the device into the test slot, the test carrier may wobble in other degrees of freedom. However, as the test carrier engages with the test slot, walls, or guides, within the test slot direct, or funnel, the test carrier into a resting position within the test slot. The force applied by the pusher allows electrical contacts on the test carrier—which are part of electrical pathways to the devices in the test slots—to connect to complementary electrical contacts in the test slot. Tests of the devices may be performed by sending signals along these electrical pathways, and from one or more controllers resident in the slot to the test computing system.

Figure 33:
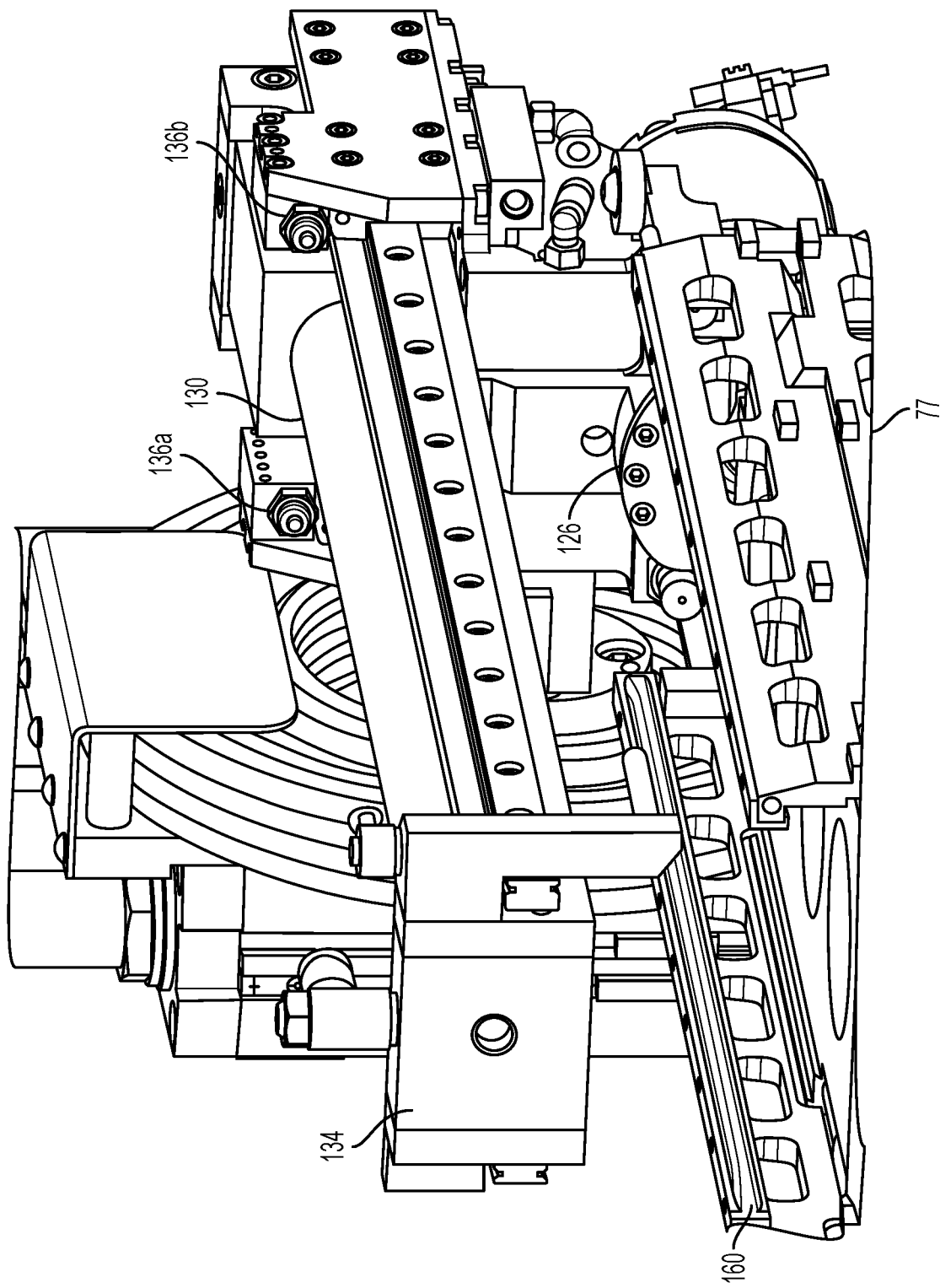
FIGS. 33 and 34 are perspective views of an example pusher and test arm.
Figure 34:
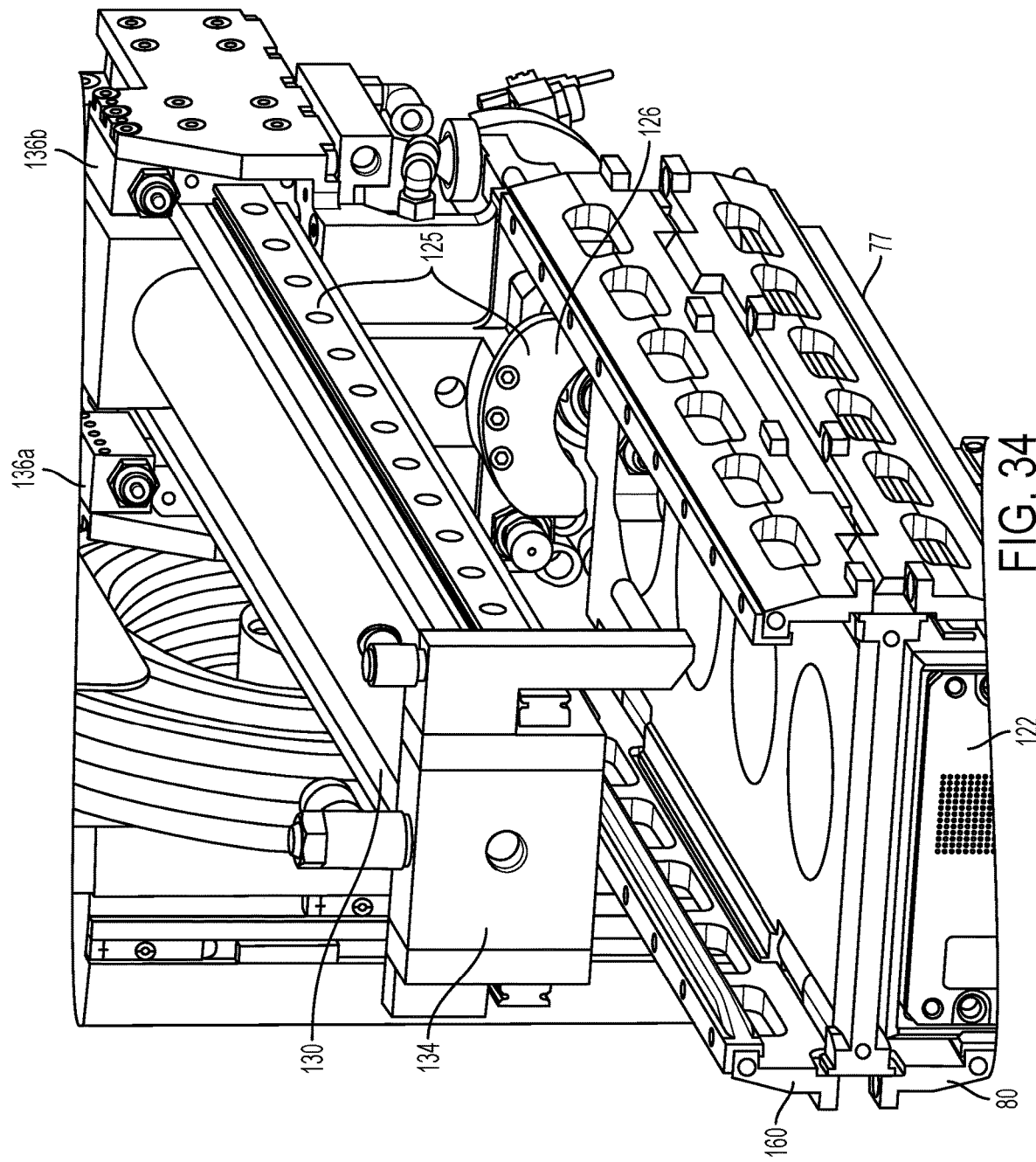

FIGS. 33 and 34 shows an example implementation of the pusher on an example test arm 77. Pusher 125 includes a hitch or head 126 that engages a test carrier to either load the test carrier into a test slot, or to extract a test carrier from the test slot. In some implementations, the head is configured to apply minimal mechanical engagement with the test carrier, securing it only in a single plane, thus enabling the carrier to float freely whilst being loaded and unloaded from a test slot. In this regard, FIG. 34 shows part an example of a test carrier 122 held in a gripper 80 of test arm 77. Gripper 160 is empty in this example. In this regard, the portion of the test arm containing the grippers for holding test carriers is configured to rotate (e.g., about 180° along its longitudinal axis) to align the pusher with either the gripper containing a test carrier for insertion into a test slot or a gripper that is empty.

When pusher 125 aligns to a gripper containing a test carrier, in some implementations the pusher is configured to move in one dimension (e.g., the Y dimension), and to force the test carrier into the test slot in only one degree of freedom. As explained above, the gripper engages grooves in the sides of the test carrier, such as groove 128 of test carrier 56 (see, e.g., FIG. 22). The grooves enable movement of the test carrier in the Y dimension in response to applied force. Accordingly, while inhibiting movement in other dimensions or degrees of freedom, the gripper still enables the pusher to force a test carrier out of the gripper and into a test slot. As explained above, walls or guides in the test slot direct, or funnel, the test carrier into a resting position within the test slot. Accordingly, while the test carrier may wobble in other degrees of freedom, this wobbling is mitigated by the guides in the test slot, and does not prevent insertion of the test carrier into the slot or accurate electrical connections between the test slot and the test carrier.

Referring back to FIGS. 33 and 34, pusher 125 is connected, mechanically, to track 130, and is configured to move in the Y dimension via track 130. Movement may be from a fully retracted position shown in FIGS. 33 and 34, along all or part of the length of the grippers, to a fully extended position (e.g., pusher 94 shown in FIGS. 2 and 13) at which the head 126 meets, or moves past, element 134 in the direction of the test slot. At the fully extended position, the pusher has either completed insertion of a test carrier containing devices to be tested into a test slot, or is ready to extract a test carrier containing tested devices that is already in the test slot.

Figure 35:
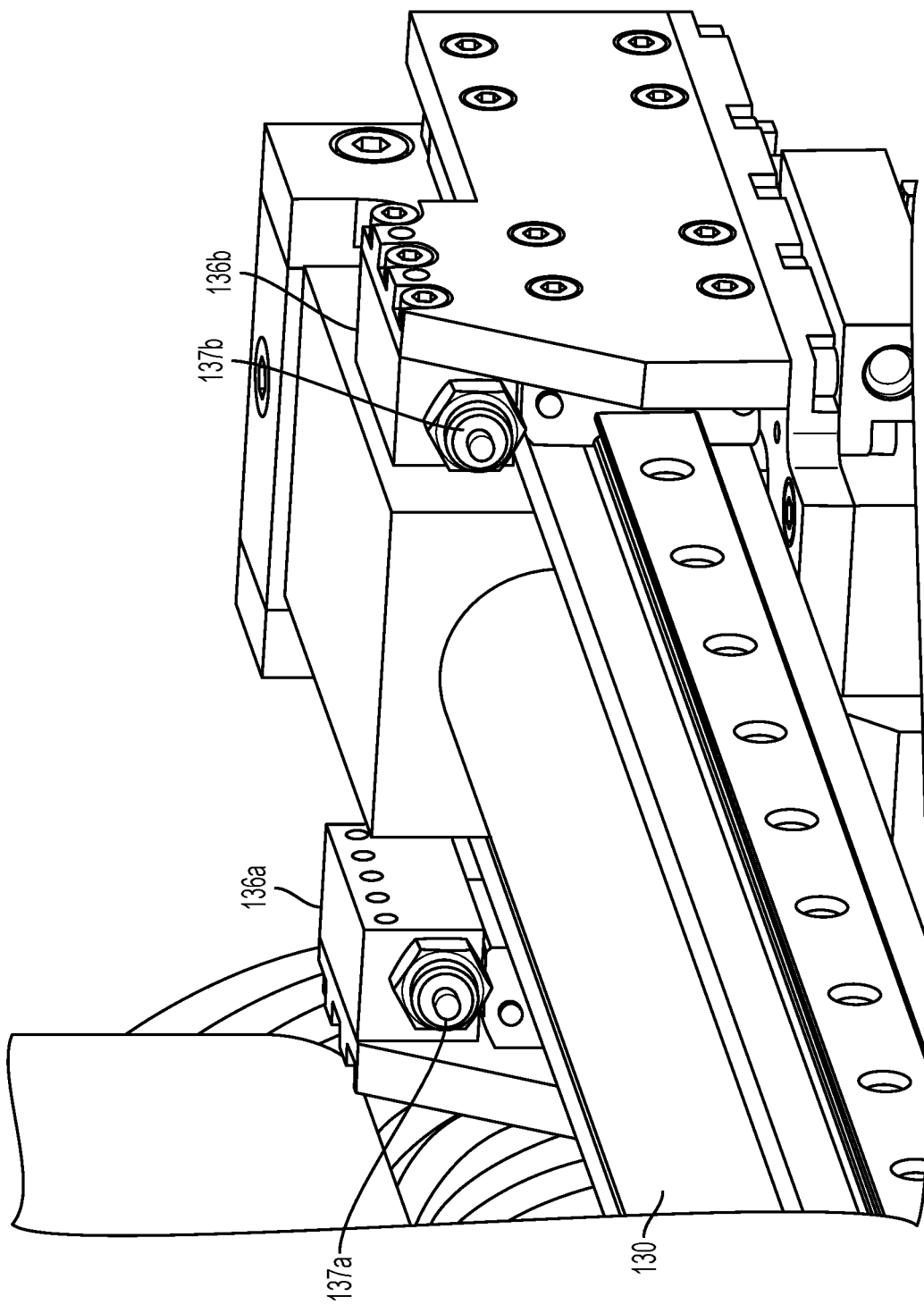
FIG. 35 is a perspective view of example springs on the example pusher.

As shown in FIGS. 33, 34, and 35, the pusher contains termination blocks 136a, 136b that include one or more springs 137a, 137b to engage element 134 when the pusher is at least partially, or fully, extended. For example, as the pusher extends, part of the pusher travels along track 130 until the springs 136a, 136b engage element 134. The springs push against element 134 when the pusher is fully, or at least partially, extended thereby controlling the end velocity of the pusher. In addition, as described below, pusher 125 is controlled pneumatically. In some implementations. every direction of movement of the pusher is created via air passing through a valve; therefore, there is a valve to extend the pusher, and a separate valve to retract the pusher, with the only exception being the latch release actuators, which retract with an internal spring, and so have one valve to control extension. In this example, the pusher stops on the spring 136a, 136b because the valves which control it are supplied with two selectable air pressures. One low pressure is selected to extend the pusher, but it is too low to compress the springs. Once the springs need to be compressed, the low pressure is switched to high pressure, the springs compress, and the last part of the movement of the pusher occurs towards the test rack.

Figure 36:
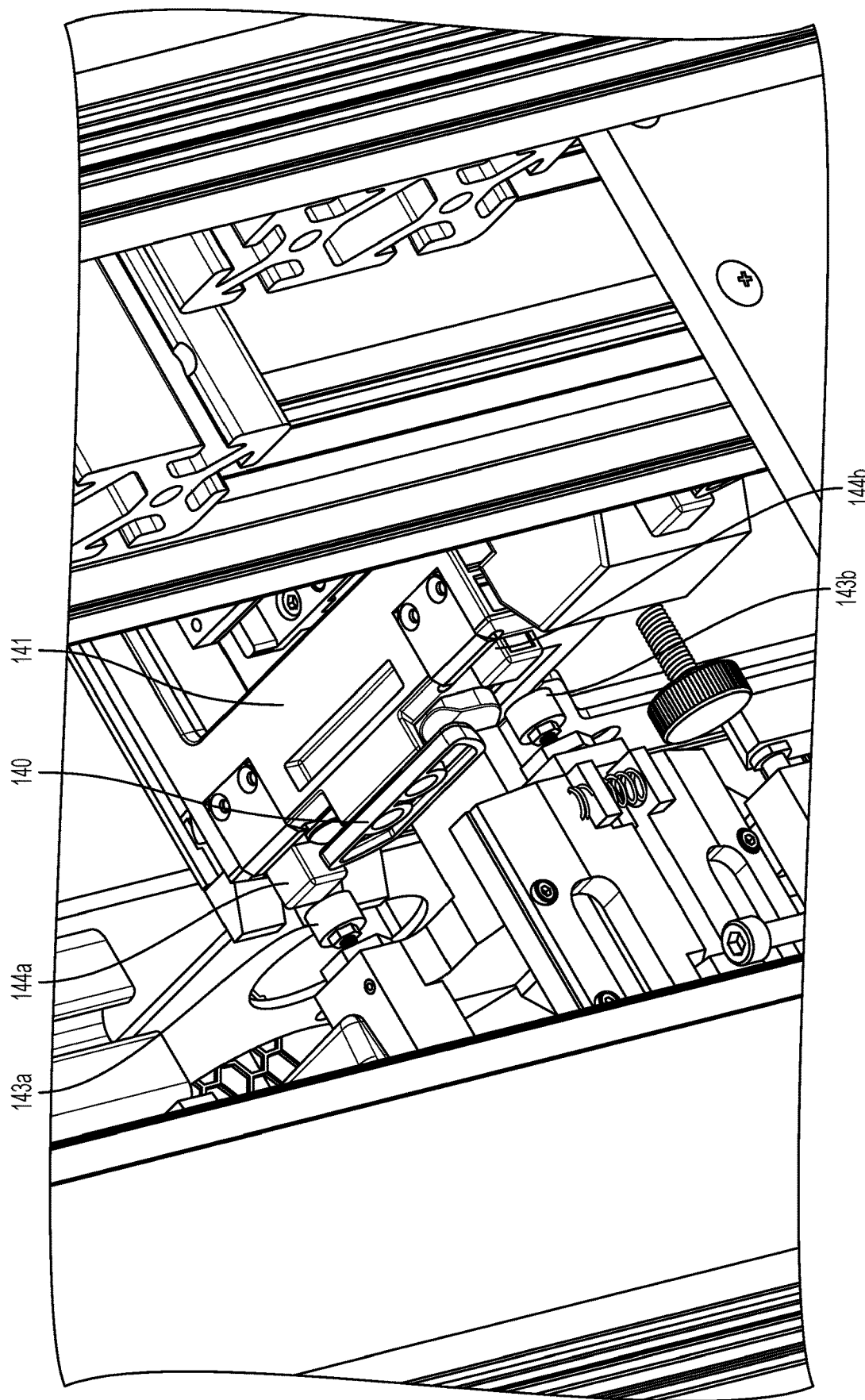
FIGS. 36 and 37 are perspective views of an example test carrier mounted in an example test slot, including example release buttons.
Figure 37:
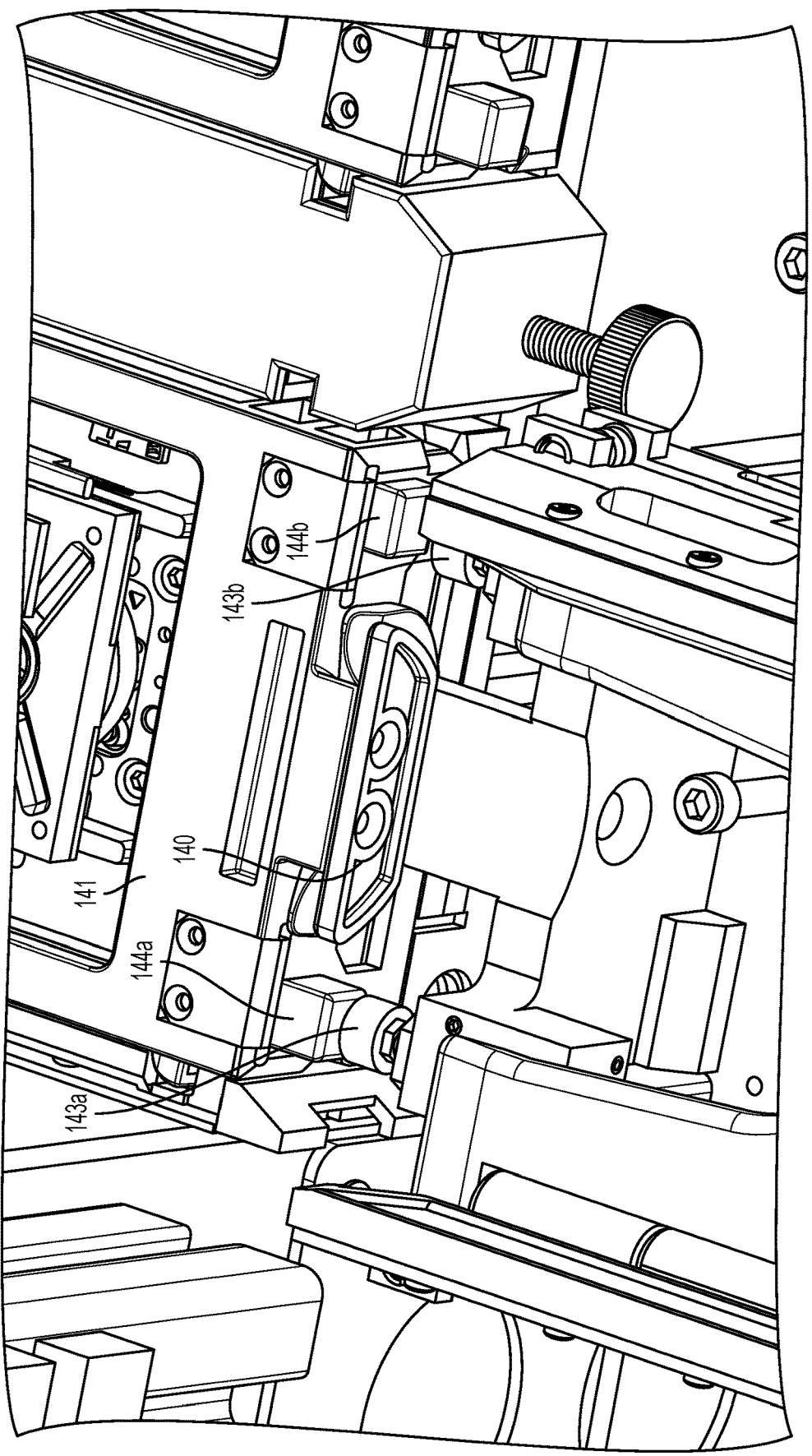

As shown in FIGS. 33 and 34, the pusher includes a head 126 that is configured to engage a member on a test carrier to push the carrier or to extract a test carrier from a test slot. To engage a test carrier in a test slot, the test arm, including the pusher, is configured to move in the Z-dimension—in some implementations, down then up relative to the test rack—in order for the head to engage a complementary connector on the test carrier. FIGS. 36 and 37 show an example of such a complementary connector 140 on a test carrier 141 disposed in a test slot. In some implementation, the test carrier is held mechanically in the test slot. Release buttons on the test carrier, when engaged (e.g., pressed), enable the test carrier to be extracted from the test slot.

Referring to FIGS. 36 and 37, the pusher includes smaller, air-controlled extenders 143a, 143b that are controllable to engage the release buttons in order to allow the test carrier to be extracted from the test rack. The air-controlled extenders are placed in complementary locations to the release buttons 144a, 144b such that, when the pusher 125 is extended, and the air-controlled extenders 143a, 143b are actuated, the air-controlled extenders engage the release buttons to release the mechanics that hold the test carrier in the test rack. After this operation, pusher 125 retracts, and draws the test carrier into an empty gripper, such as gripper 160, on the test arm.

Figure 38:
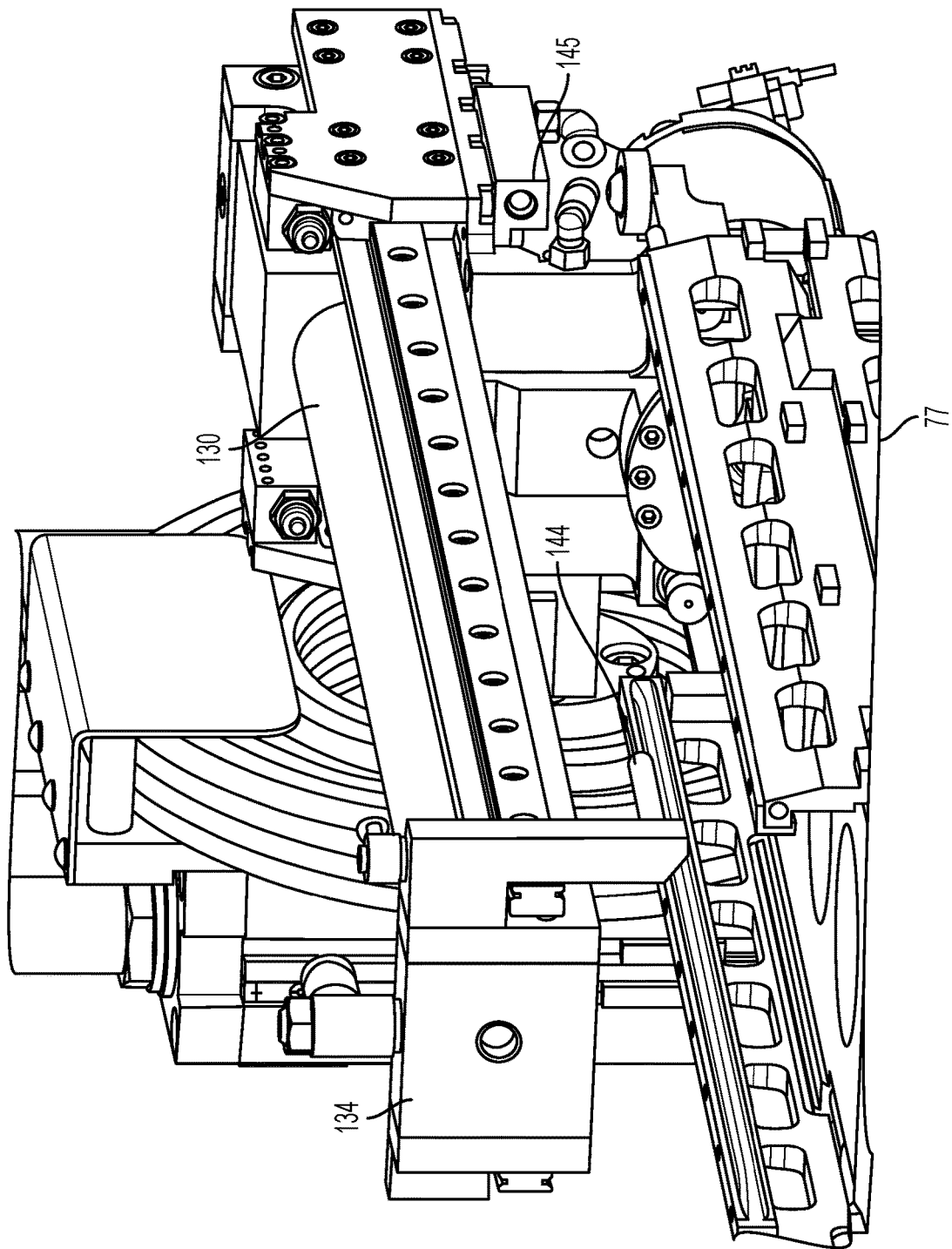
FIGS. 38 and 39 are perspective view of an example test arm, an example pusher, and example hoses and cables mounted in a rotary configuration.
Figure 39:
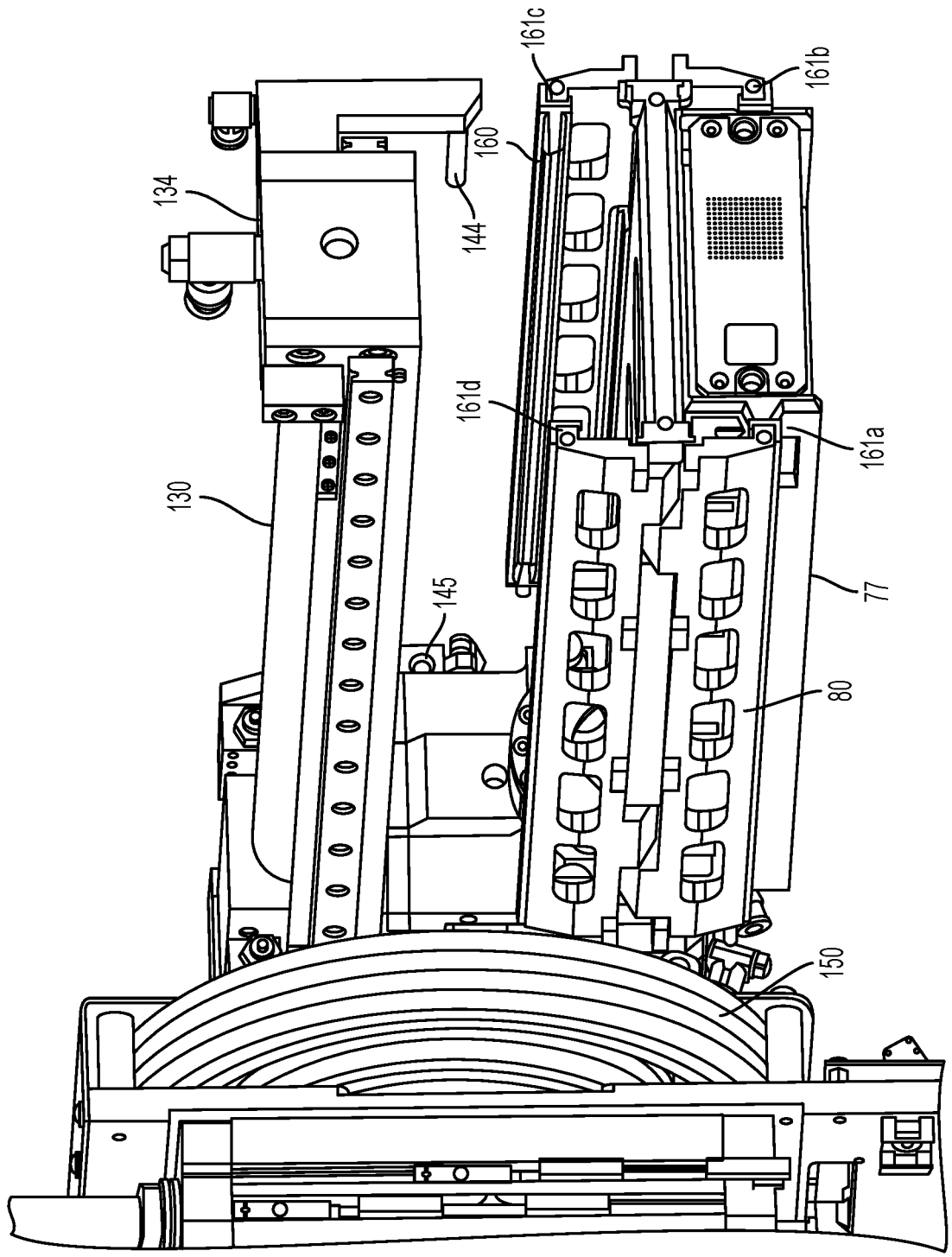

The air-controlled extenders may be controlled using a pneumatic system. In some implementations, air used to actuate the air-controlled extenders is supplied only when pusher 125 is extended. Referring to FIGS. 26, 38, and 39, a connector 144 is located proximate to element 134. As pusher 125 travels via track 130 to an extended position (e.g., to a fully extended position), connector 144 engages an air-supply port 145 that travels with the pusher. The air-supply port includes leads to an air hose that leads a supply of pressurized air. In some implementations, a purpose of this configuration is to achieve an axis of motion, in a relatively tightly-compact space, with fewer, or no, moving or flexing cables or tubes. At the pusher reaches full extension, the air-supply port 145 mates to connector 144. Air may then be provided, via this mating, to the air-controlled extenders, which causes those extenders to actuate and engage the release buttons located on the test carrier. In the example of FIGS. 26 and 38, there is a single connector 144 and air-supply port 145 to control to air-controlled extenders. However, in some implementations, there may be two, or more, connectors and air-supply ports, e.g., one on each side of the termination block. The foregoing configuration may have advantages. For example, in some implementations, by connecting the air supply only when the pusher is extended, air hoses need not run along the length of the test arm when the test arm rotates and flips. As a result, there are fewer changes for malfunctions resulting from torn or disconnected hoses.

As noted above, in some implementations, the pusher is controlled using a pneumatic system. Air reaches the pusher through air hoses that are held in a rotary winding. In this regard, some conventional cable management systems would have required additional space along the X-axis and the Z-axis, which would increase the footprint of a slice. However, as shown in FIG. 39, example air hoses 150 may be wound in helical form having radii that increase or decrease as the test arm moves (e.g., rotates and flips) between the test stage and the loading stage. For example, when the test arm faces the test rack, the helically-wound hoses may become more loosely wound, resulting in a larger radius. For example, when the test arm faces the loading stage, the helically-wound hoses may become more tightly wound, resulting in a smaller radius. The example system is not limited to this type of winding; any appropriate type of helical or rotary winding may be used to reduce the footprint of the system, the size of the system, or the geometry of the system.

In some implementations, individual air hoses are interconnected like ribbon cable. In some implementations, individual air hoses are separate. In some implementations, each air hose includes one or more electrical cables—e.g., one or more wound cables—running longitudinally through the air hose. The electrical cables send signals to and from components of the test system, such as the test arm, to control their operation. Because the electrical cables are within the air hoses, the electrical cables are also part of the helical or rotary winding that includes the rotary hoses. Thus, the amount of space taken-up by the electrical cables may also be reduced In some implementations, the tubing is a multi-channel tube ribbon, with some channels used to convey compressed air, and others used to route high-flex cable for the purposes of passing electrical signals between static and the dynamic sides of the assembly (or fixed and the rotating parts of the system).

Referring to FIG. 39, test arm 77 is shown containing two grippers 80 and 160. In this example, each gripper has a butterfly configuration, which includes two flanges such as 81, 82 (FIG. 26), which are spring-loaded and configured to spread open to engage or to release a test carrier, or to close to hold a test carrier. In some implementations, the gripper is not powered electrically to open or close (e.g., to spread or to close the flanges). Instead, in some implementations, this function is provided at the carrier shuttle. For example, as shown in FIG. 39, ends of the flanges each include a hole 161*a*, 161*b*, 161*c*, 161*d*. When positioned at the loading stage, complementary posts on, or associated with, the carrier shuttle mate to holes in a gripper and expand outwardly in response to electrical signals or pneumatics, which causes the gripper to let go of the test carrier that it had previously been holding. As described, the test carrier may be deposited onto the carrier shuttle for further processing. The posts for opening and closing the gripper may be electrically or pneumatically actuated.

In some implementations, the transport robot may be calibrated in order to pick, hold, and place devices on the various trays, and in order to pick, hold, and place devices in the device shuttles on the parallel paths. An example implementation of the transport robot includes eight pick-and-place actuators configured to move in three orthogonal axes, including in plane that is parallel to the floor, which is referred to as the XY plane. The actuators can also move up and down along the Z dimension (see the legend of FIG. 1). The example calibration process includes calibration in the XY plane. In an example implementation of the transport robot, the eight pick and place actuators are mounted on a head that itself is mounted on a gantry system—the H-bar—having two degrees of freedom (in the X and Y dimensions in this example). An application programming interface (API) allows a calling program to instruct the head of the transport robot to move distances specified, e.g., in millimeters or sub-millimeters, in both the X and Y dimensions. The movement of the head is repeatable within an acceptable margin of error. However, due to inaccuracies that arise from assembly and design of the gantry itself, the actual distance the head moves in the X and/or Y dimensions may not be accurate to within an acceptable limit (e.g., the sub-millimeter level), and can vary based on the starting and ending positions of the head. In addition, each individual tray feeder may not be positioned accurately enough relative to the gantry system. A tray may not even be a perfect rectangle. All of these sources of error create a challenge to position the pick and place actuators accurately relative to a position of a cell in a tray from any one of the three feeders, or to a receptacle (another type of cell) of device shuttles serviced by the transport robot.

In some implementations, the example calibration process described herein employs mechanical and executable tools and procedures to learn the shape and position of a tray relative to a set of pick and place actuators mounted on a the robot's head, with freedom to move in orthogonal (e.g., XY) axes. In some implementations, the calibration process does not require a uniform relationship between the axes that the pick-and-place actuators move and the distance covered as measured on the target trays themselves. In some implementations, the calibration process is independent of the dimensions of the device that is handled by the pick-and-place actuators. In some implementations, the calibration process is independent of the quantity of devices that can be contained in each tray from each feeder.

Figure 41:
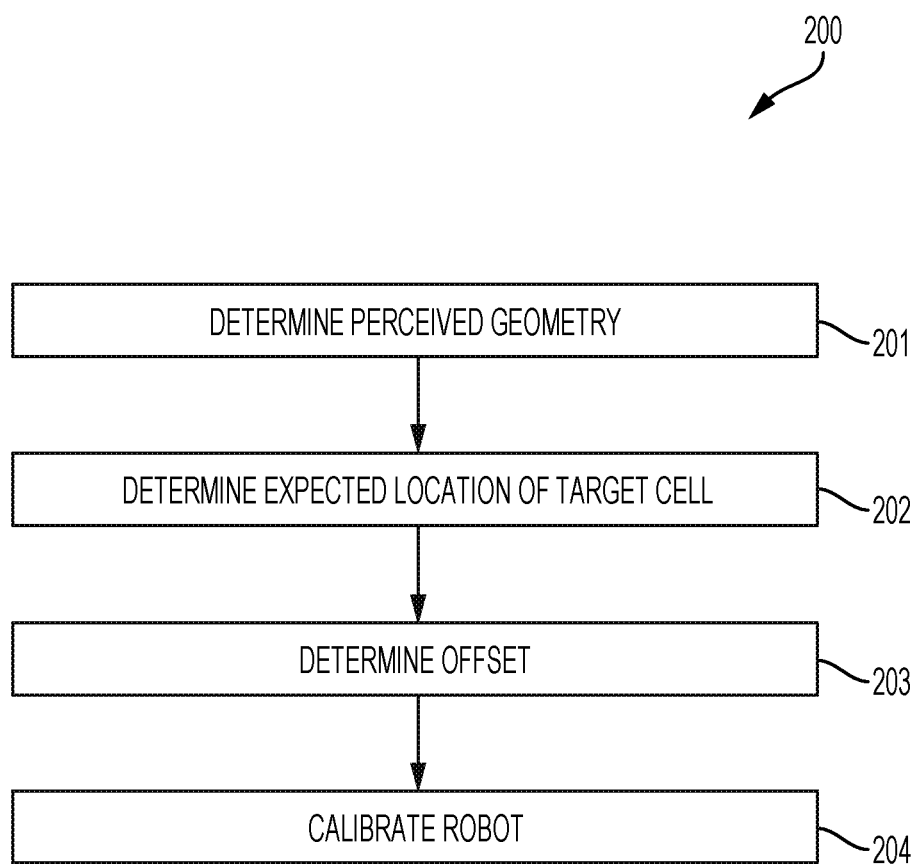
FIG. 41 is a flowchart showing an example calibration process.
Figure 42:
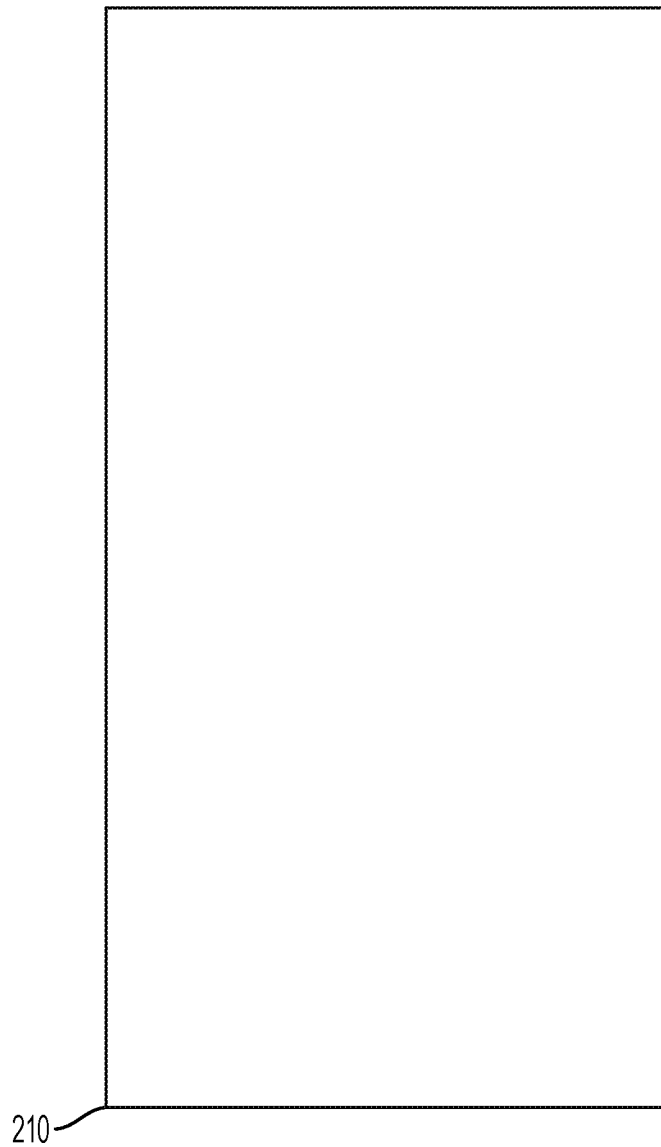
FIG. 42 is a block diagram of an actual geometry of an example arrangement cells in a tray configured to hold devices.
Figure 43:
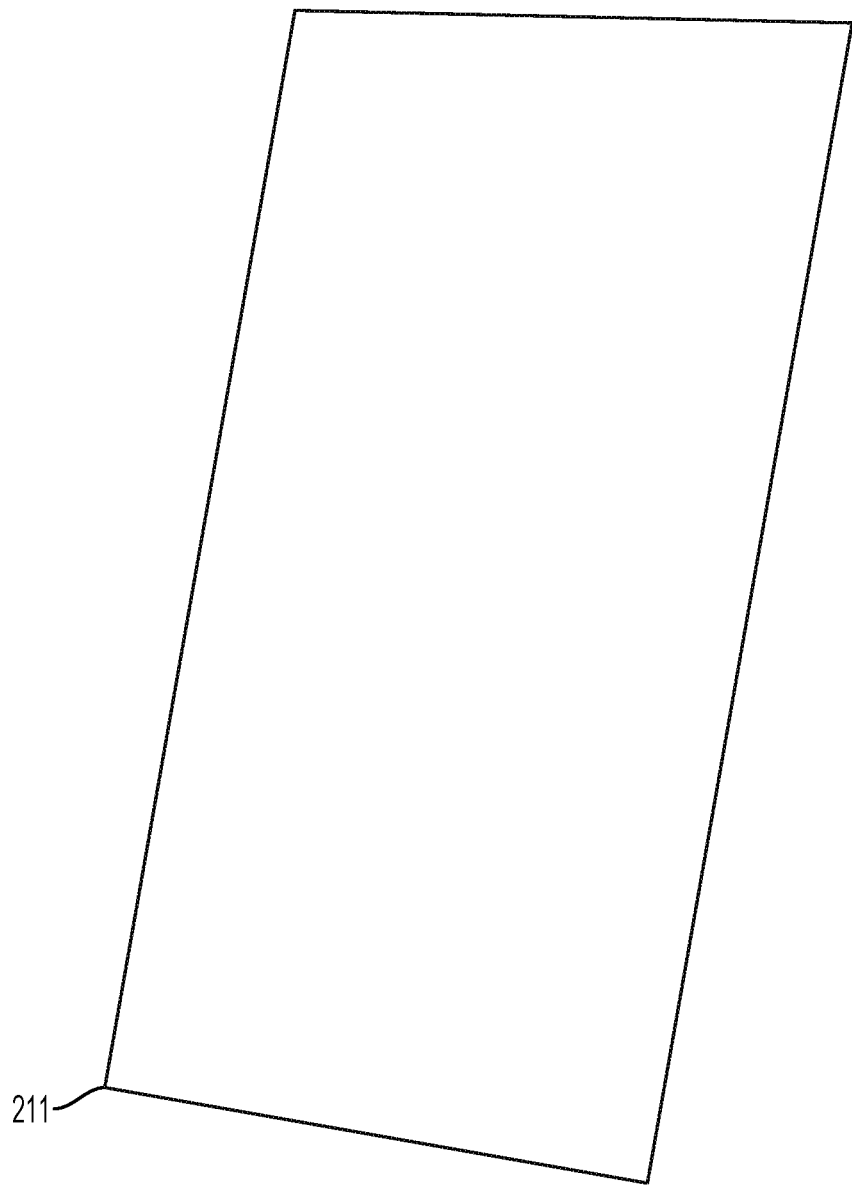
FIG. 43 is a block diagram of a geometry of the arrangement cells in the tray as perceived by a robot for moving devices into, and out of, the cells.

Referring to FIG. 41, example calibration process 200 includes determining (201) a geometry of an arrangement of cells that is perceived by the transport robot. For example, because of inaccuracies such as those described above, the transport robot may perceive the geometry of the arrangement differently than it actually is. As a result, absent calibration, the transport robot may deposit devices into the wrong cells. For example, as shown in FIG. 42, a tray of cells may have an actual geometry 210; however, the robot may perceive the tray of cells to have a different geometry, such as geometry 211 of FIG. 43. In this example, perception by the robot of the tray includes the robot mis-identifying coordinates of different cells on the tray.

Figure 44:
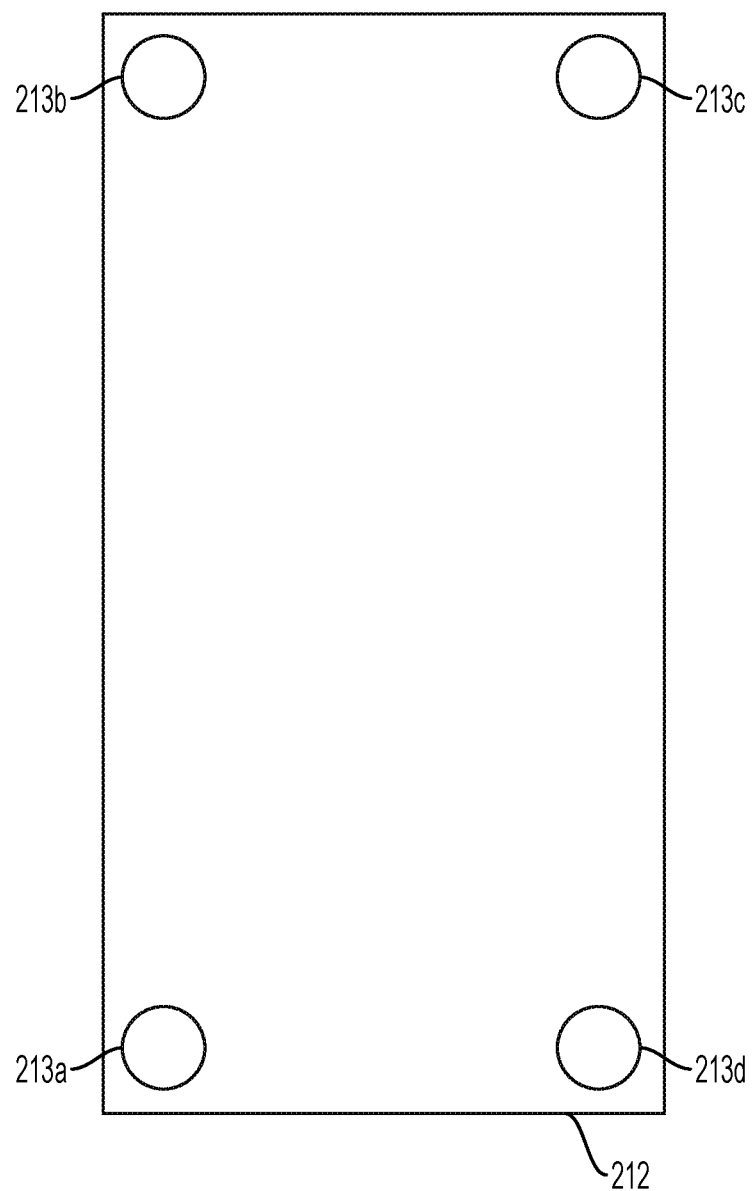
FIG. 44 is a block diagram of an example calibration device.

The computer system that performs the calibration process stores, in memory, the shape and coordinates of the actual geometry 210. The computer system that performs the calibration also stores, in memory, the shape and coordinates of the perceived geometry 211. In some implementations, the perceived geometry of an arrangement of cells, such as a tray, is determined before calibration. For example, in some implementations, a calibration device having the same geometry as the tray may be used to determine the perceived geometry. For example, as shown in FIG. 44, a calibration device 212 contains a predefined number, such as four, holes 213*a*, 213*b*, 213*c*, 213*d* (not shown to scale). To determine how the transport robot perceives the device, a technician may manually move the transport robot to each of the holes and, with the same pick-and-place actuator, insert the actuator into each hole. The computer system records the coordinates at each hole, and constructs the perceived geometry 211 of FIG. 43. The discrepancies between the actual and perceived geometries may be due to the errors in the robot or elsewhere described above. This perceived geometry is used for each tray having the same dimensions as the calibration device. Also, although only four holes are shown in the calibration device of FIG. 44, any appropriate number of holes may be used to determine the perceived geometry.

By comparing the actual geometry 210 to the perceived geometry 211, it is apparent in this example that the perceived geometry is a distorted version of the actual geometry. In this example, the perceived geometry is stretched and skewed irregularly; however, different robots may perceive the same geometry differently and not necessarily in the manner shown in FIG. 43. The calibration process identifies, for each cell of a tray or shuttle, an offset between the expected (e.g., actual) location of the cell in the actual geometry and the perceived location of the cell in the perceived geometry This offset may include, for example, X dimension and Y dimension error values. These X dimension and Y dimension error values may be added to coordinate values of the perceived location so that the robot is above to reach the actual location.

Referring back to FIG. 41, calibration process 200 includes determining (202) an expected location of a target cell among an arrangement of cells, such as a tray. As noted, the actual geometry of the tray is stored in memory. Accordingly, the computer system can identify the expected location of a particular cell based on the stored geometry. For example, the stored geometry may represent that cells are arranged in a regular rectangular grid pattern, that the regular grid pattern includes N rows and M columns of cells, and that the cells are identified by row and column, with corresponding coordinates stored for the rows and columns. Knowing this information, the computer system can determine, based on the cell to be accessed, the expected location of the target cell. The expected location may be a central or other predefined location within the target cell, and calibration may be performed with respect to the central or predefined location. This is done, in some examples, to increase the likelihood that a pick-and-place actuator will contact a device at the central or predefined location. In some examples, picking a device up from its edges or other non-preferred location may adversely affect its placement onto a shuttle or into a tray, which is why calibration may be performed relative to a central or other predefined location in a cell.

Calibration process 200 determines (203) an offset from the expected location that is based on the geometry of the arrangement of cells that is perceived by the robot. In some implementations, determining the offset includes, but is not limited to, calculating a first dimension—e.g., X dimension—error based on a difference, in the first dimension, between the actual geometry and the perceived geometry; and calculating a second dimension—e.g., Y dimension—error based on a difference, in the second dimension, between the actual geometry and the perceived geometry. The offset includes a combination of the first dimension error and the second dimension error, and may be combined with the coordinates of the robot's perceived location of the cell so that the robot is able to reach the expected location of the cell.

Figure 45:
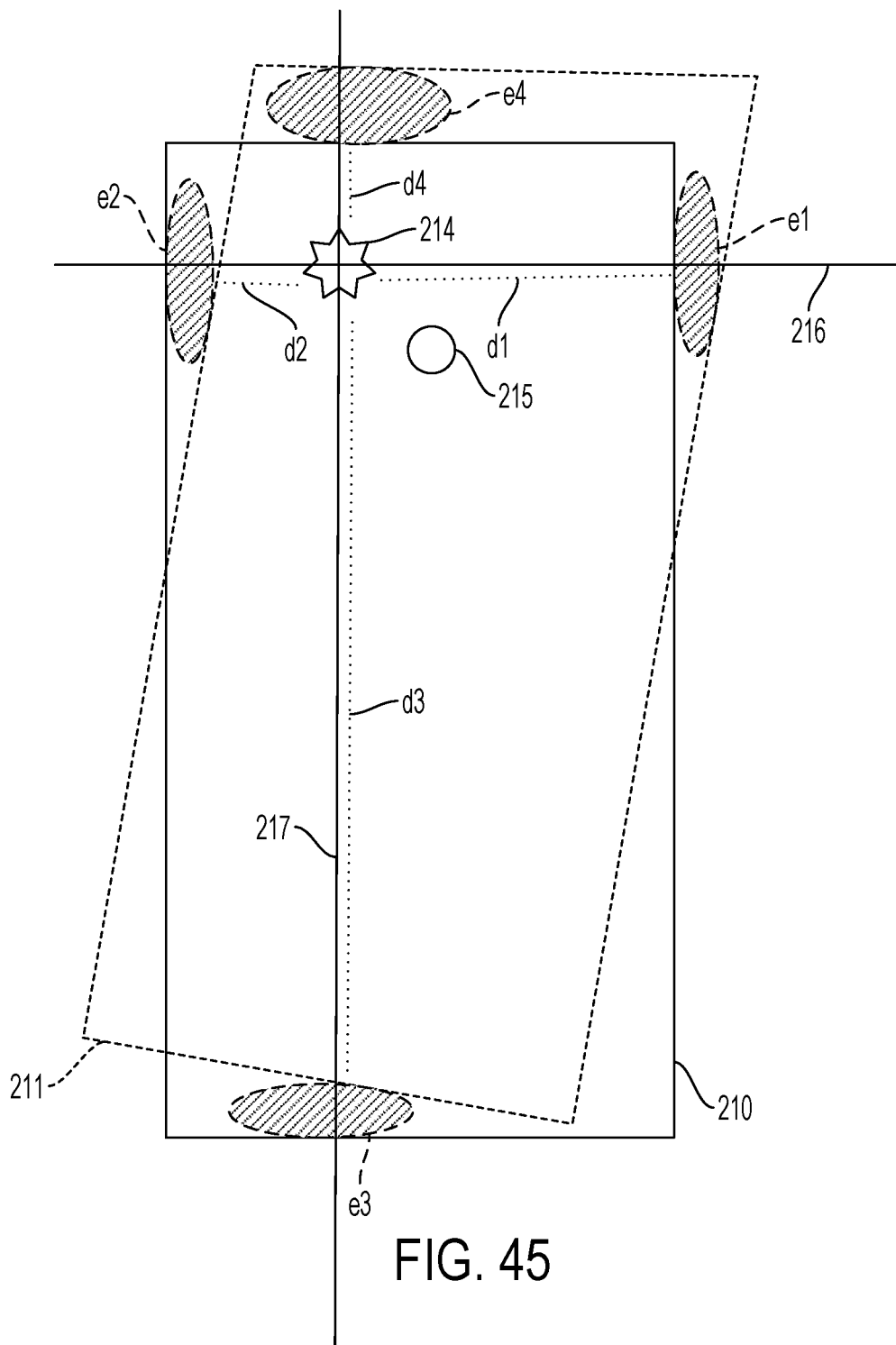
FIG. 45 is a block diagram showing the perceived geometry of the cells in the tray overlaid on the actual geometry of cells in the tray.

FIG. 45 shows, conceptually, how the X dimension error and the Y dimension error are determined in an example implementation. FIG. 45 shows an actual geometry 210 of an arrangement of cells, and an actual (or expected) location 214 of a target cell within the actual geometry. FIG. 45 also shows a perceived geometry 211 of the arrangement of cells overlaid on the actual geometry 210, and a perceived location 215 of the target cell within the perceived geometry. As noted, the perceived location is the location where, absent calibration, the transport robot would deliver a device destined for the actual (expected) location 214. In this example, calibration is performed for each actual location/perceived location pair for a particular robot.

Accordingly, to obtain the X dimension error, the computer system simulates a horizontal line 216 through actual location 214. As shown in FIG. 45, distances $d_1$ and $d_2$ are determined, in the X dimension, between the actual location and the edges of the perceived geometry 211. The differences between distances $d_1$ and $d_2$ and the edges of the actual geometry 210 along horizontal line 216 constitute errors $e_1$, $e_2$ in the X dimension. The total error in the X dimension is a sum of $e_1$ an $e_2$, with one of the two being assigned a positive value or a negative value based on whether the edges of the perceived geometry fall inside, or outside, of the edges of the actual geometry. In this example, to obtain the Y dimension error, the computer system simulates a vertical line 217 through the actual location 214. As shown in FIG. 45, distances $d_3$ and $d_4$ are determined, in the Y dimension, between the actual location and the edges of the perceived geometry 211. The differences between distances $d_3$ and $d_4$ and the edges of the actual geometry 210 along vertical line 217 constitute errors $e_3$, $e_4$ in the Y dimension. The total error in the Y dimension is a sum of $e_3$ an $e_4$, with one of the two being assigned a positive value or a negative value based on whether the edges of the perceived geometry fall inside, or outside, of the edges of the actual geometry.

The combination of the errors in the X dimension and the Y dimension constitute the offset. The transport robot may be calibrated (204) based on the offset. For example, if the transport robot is controlled to move to the target cell, the computer system is programmed to combine the coordinates of the target cell as perceived by the transport robot with the offset—e.g., the errors in the X and Y dimensions—in order to enable the transport robot to travel to, and to reach, the target cell at the actual/expected location. For example, the error in the X dimension may be added to, or subtracted from, the X coordinate of the perceived location, and the error in the Y dimension may be added to, or subtracted from, the Y coordinate of the perceived location. In some implementations, weighting factors or multipliers may be applied to the error in the X and/or Y dimensions. In some implementations, the transport robot is calibrated to a sub-millimeter precision. For example, the transport robot may be calibrated to an accuracy of at least 0.1 millimeters—for instance, the transport robot may be calibrated and controlled so that the transport robot positions a device in a cell at a location that is no more than 0.1 millimeters from its expected location.

In some implementations, the transport robot includes multiple—e.g., eight—pick-and-place actuators, as noted above. The offset described above may be determined with respect to a designated one of the multiple pick-and-place actuators. Calibrating the transport robot may include calibrating a second head among the multiple heads that is different than the designated head. The second head may be calibrated based on both the offset and a second offset corresponding to a difference in locations between the designated head and the second head. For example, the computer system may know the distances between heads on a transport robot. The offset may be determined with respect to the designated head. An additional offset, reflecting the distance between the second head (e.g., an adjacent head) and the designated head may also be applied when determining where to position the second head. For example, in addition to adding the X dimension error and the Y dimension error, an additional X and/or Y dimension offset may be applied to the perceived coordinates when performing calibration for a head other than the designated head.

Although calibration process 200 is described with respect to the transport robot, the example calibration process may be used with any appropriate robot or system.

The example systems described herein may be implemented by, and/or controlled using, one or more computer systems comprising hardware or a combination of hardware and software. For example, a system like the ones described herein may include various controllers and/or processing devices located at various points in the system to control operation of the automated elements. A central computer may coordinate operation among the various controllers or processing devices. The central computer, controllers, and processing devices may execute various software routines to effect control and coordination of the various automated elements.

The example systems described herein can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing can be performed by one or more programmable processors executing one or more computer programs to perform the functions described herein. All or part of the testing can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may imply a direct physical connection or a wired or wireless connection that includes or does not include intervening components but that nevertheless allows electrical signals to flow between connected components. Any "connection" involving electrical circuitry that allows signals to flow, unless stated otherwise, is an electrical connection and not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A test system comprising:
   robotics configured to operate on devices, the robotics comprising a robot to move the devices into or out of a test carrier, the robot having a first tolerance that allows the robot to position one of the devices in the test carrier at a position that deviates from a first target position in the test carrier by a first amount; and
   stages comprising parallel paths that are configured to pass the devices between adjacent stages, the stages being different from the robotics, each of the stages having a second tolerance that allows a stage to position one of the devices in the stage at a position that deviates from a second target position in the stage by a second amount;
   wherein the second amount is greater than the first amount.

2. The test system of claim 1, wherein:
   the stages comprise a device shuttle to transport devices;
   the device shuttle is configured to move, towards a stage of the test system containing the robot, a first device among the devices that has not been tested, the device shuttle being configured to move in a first dimension; and
   the robot is configured to move the first device from the device shuttle to the test carrier, the robot being configured to move in a second dimension that is different from the first dimension.

3. The test system of claim 2, further comprising:
   cameras configured to capture images of the devices, the robot being controllable based on the images captured.

4. The test system of claim 3, wherein the cameras comprise at least a first camera that is below the robot and that faces upward relative to ground, and at least a second camera that is above the robot and faces downward relative to ground.

5. The test system of claim 1, wherein the test system has a footprint that is less than sixteen square meters, that is less than ten square meters, that is less than nine square meters, or that it less than eight square meters.

6. The test system of claim 1, wherein the test system has a volume of less than forty-eight cubic meters.

7. The test system of claim 1, wherein the first amount is measured in single-digit microns; and
   wherein the second amount is measured in tenths of millimeters or greater.

8. The test system of claim 1, wherein the second amount is different for at least two different ones of the stages.

9. A test system comprising:
   robotics comprising a robot configured to operate on devices;
   stages comprising parallel paths that are configured to pass the devices between adjacent stages; and a test carrier comprising a test socket for holding a device under test, the device under test being one of the devices;
   wherein the stages comprise:
   a test rack comprising a test slot;
   a test arm configured to receive the test carrier, to flip the test carrier, to rotate the test carrier, and to push the test carrier into the test slot following rotating the test carrier, the test arm comprising a pusher that is air-controlled to extend and thereby push the test carrier into the test slot; and
   a pneumatic system to deliver air to the pusher to push the test carrier, the pneumatic system comprising at least one rotary cable that is configured to deliver both air to move the pusher and to transmit electrical signals to and from the test arm.

10. The test system of claim 9, wherein the at least one rotary cable comprises an electrical conduit surrounded by tubing, the tubing being connected to an air source to pass the air to the pusher.

11. The test system of claim 9, wherein the pusher comprises a head that is configured to engage a member on the carrier to push the carrier.

12. The test system of claim 9, wherein the test carrier is first test carrier;
   wherein the pusher is configured to engage a member of a second test carrier in the test slot prior to rotating the test carrier, the second test carrier comprising release buttons to engage to release the second test carrier from the test slot; and
   wherein the test arm comprises air-controlled extenders to engage the release buttons, an air port being controllable to travel at least partway along the test arm to connect to an air hose located proximate to the pusher.

13. The test system of claim 12, wherein the air-controlled extenders are configured to receive air from the air hose following connection, and to extend outwardly in response to receipt of the air to engage the release buttons.

14. The test system of claim 13, wherein the test arm is configured to move in a direction that has a vertical component relative to ground in order to cause the pusher to engage a member on the second test carrier; and
   wherein the pusher is configured to retract following engaging the member and following the air-controlled extenders engaging the release buttons, the pusher being configured to retract to cause the second test carrier to leave the test slot.

15. The test system of claim 14, wherein the test arm is configured to hold the second test carrier on one side of the test arm, and to rotate following retracting thereby positioning the first test carrier for pushing into the test slot.

16. The test system of claim 15, wherein, following pushing the first test carrier into the test slot, the test arm is configured to flip and to rotate to reach a position to receive another test carrier.

17. The test system of claim 9, wherein the at least one rotary cable has a diameter that changes based on flipping of the test arm.

18. A test system comprising:
robotics configured to operate on devices;
stages comprising parallel paths that are configured to pass the devices between adjacent stages; and
a test carrier comprising a test socket for holding a device under test, the device under test being one of the devices;
wherein the stages comprise:
a test rack comprising a test slot; and
a test arm configured to receive the test carrier, to flip the test carrier, to rotate the test carrier, and to push the test carrier into the test slot following rotating the test carrier;
wherein the test arm comprises a pusher that is configured to extend and thereby push the test carrier into the test slot, the pusher comprising a head that is configured to engage a member on the test carrier to push the test carrier.

19. The test system of claim 18, wherein the test carrier is first test carrier;
wherein the pusher is configured to engage a member of a second test carrier in the test slot prior to rotating the test carrier, the second test carrier comprising release buttons to engage to release the second test carrier from the test slot; and
wherein the test arm comprises actuators to engage the release buttons.

20. The test system of claim 19, wherein the actuators are configured extend outwardly in response to a stimulus to engage the release buttons.

21. The test system of claim 20, wherein the test arm is configured to move in a direction that has a vertical component relative to ground in order to cause the pusher to engage a member on the second test carrier; and
wherein the pusher is configured to retract following engaging the member and following the actuators engaging the release buttons, the pusher retracting to cause the second test carrier to leave the test slot.

22. The test system of claim 21, wherein the pusher is configured to extend and thereby push the first test carrier into the test slot following causing the second test carrier to leave the test slot.

23. The test system of claim 22, wherein the test slot remains occupied during testing except for a time between removal of the second test carrier and insertion of the first test carrier.

24. The test system of claim 18, wherein the test rack comprises multiple test slots and, for each of the multiple test slots, the test arm is configured to remove a test carrier containing tested devices and to insert a test carrier containing untested devices before proceeding to service a next test slot.

25. The test system of claim 18, wherein the test slot comprises guides that are engaged by the test carrier upon entry of the test carrier into the test slot, the guides for directing the test carrier into position while the pusher continues to push the test carrier.

26. The test system of claim 25, wherein the pusher is configured to extend in a single dimension to push the test carrier into the test slot.

27. The test system of claim 25, wherein the pusher is configured to push in the single dimension independently of movement of the test carrier in dimensions other than the single dimension.

28. The test system of claim 18, wherein the stages comprise a carrier holder for holding the test carrier in the test arm, the test carrier containing grooves that enable movement of the test carrier in at least the single dimension; and
wherein the pusher is configured to extend through the carrier holder to push the test carrier into the test slot.

29. A test system comprising:
robotics configured to operate on devices;
stages comprising parallel paths that are configured to pass the devices between adjacent stages; and
a test carrier to hold devices tested or to be tested, the devices tested or to be tested being among the devices passed between adjacent stages;
wherein the stages comprise:
a test slot; and
a test arm comprising:
a pusher that mates to the test carrier, the pusher being extendible and retractable to move the test carrier relative to the test slot; and
a carrier holder to hold the test carrier on the test arm, the carrier holder comprising a gripper that is spring-loaded to hold the test carrier and to maintain the test carrier within the carrier holder.

30. The test system of claim 29, wherein the test carrier comprises grooves; and
wherein the gripper is configured to engage the grooves of the test carrier to hold the test carrier in place absent external force applied to the arms.

31. The test system of claim 30, wherein the gripper comprises springs that are configured to spread the gripper to expand to accept the test carrier, and to release the test carrier.

32. The test system of claim 31, wherein the test carrier comprises grooves; and
wherein the gripper is configured to engage the test carrier to hold the test carrier in place absent external force applied to the gripper while still allowing movement of the test carrier in response to applied force along a longitudinal dimension of the carrier holder.

33. The test system of claim 29, wherein the stages comprise a carrier shuttle, the carrier shuttle comprising posts to engage flanges to cause the gripper to open and thereby expand an area for receiving the test carrier.

34. The test system of claim 29, wherein the carrier holder is a first carrier holder, the test carrier is first test carrier, and the test system comprises a second test carrier; and
wherein the test arm comprises a second carrier holder to hold the second test carrier on the test arm, the carrier holder comprising a second gripper that is spring-loaded to hold the second test carrier and to maintain the second test carrier within the carrier holder.

35. The test system of claim 34, wherein the test arm comprises a first face and a second face, the first face holding the first carrier holder and the second face holding the second carrier holder, the first carrier holder and the second carrier holder facing in opposite directions.

36. The test system of claim 29, wherein the stages comprise:
- a track along which the pusher is configured to travel; and
- a termination block against which a part of the pusher abuts when the pusher is fully extended, the pusher comprising one or more springs that engage the termination block when the pusher is at least partially extended.

37. The test system of claim 36, wherein the termination block is arranged to engage the one or more springs when the pusher is fully extended.

38. The test system of claim 36, wherein the one or more springs are two springs.

39. The test system of claim 36, wherein the springs are configured and arranged to compress, at least partially, when the pusher is at least partially extended.

40. The test system of claim 36, wherein the stages comprise:
- a pneumatic system to control extending and retracting the pusher, the pneumatic system comprising air valves to receive air to cause the pusher to extend; and
- wherein the one or more springs are configured to apply force to the pusher in a direction opposite to motion of the pusher.

41. The test system of claim 36, wherein the test arm is configured to receive the test carrier and, following receipt of the test carrier, to flip and to rotate to position the test carrier for insertion into the test slot.

42. A test system comprising:
- robotics configured to operate on devices;
- stages comprising parallel paths that are configured to pass the devices between adjacent stages;
- a test carrier comprising a test socket, the test socket for receiving a device for test, the test socket comprising electrical connections, the device for test being one of the devices;
- a socket cap to contact the device for test to apply pressure to cause the device for test to connect electrically to the electrical connections; and
- an actuator that is movable relative to the socket cap to engage the socket cap;
- wherein the stages comprise a carrier shuttle having a surface to receive the test carrier, the surface comprising ports to force air to float the test carrier or to suction air to hold the test carrier.

43. The test system of claim 42, wherein the stages comprise an air control system to force the air to float the test carrier during removal of the socket cap from contact with the device for test, and to suction air thereafter.

44. The test system of claim 43, wherein the actuator comprises:
- a key element that is rotatable;
- tooling balls arranged relative to the key element; and
- a block, the tooling balls being fixed to the block, and the key element passing through the block and being movable relative to the block.

45. The test system of claim 44, wherein the socket cap comprises a kinematic mount, the kinematic mount comprising:
- a first structure comprising grooves that are configured and arranged to engage the tooling balls, the first structure having a hole, the hole and the key element having complementary shapes to allow the key element to pass through the hole;
- a second structure having a hole, the hole and the key element having complementary shapes to allow the key element to pass through the hole, the key element being configured to rotate to engage the second structure; and
- at least one compression spring controllable by the first structure and the second structure.

46. The test system of claim 45, wherein the actuator and the air control system are configured to operate together to cause operations comprising:
- the air control system forces air to float the test carrier;
- the actuator engages the socket cap forcing the tooling balls against the grooves and causing the key element to pass through the first and second structures;
- the actuator rotates the key element;
- the key element pulls against the second element while the tooling balls pushes against the grooves to compress the compression spring;
- the actuator moves the socket cap in place over the device causing the socket cap to connect to the test carrier; and
- following connection of the socket cap to the test carrier, the actuator retracts.

47. The test system of claim 43, wherein the air control system is configured to force air out of the ports to float the test carrier while the socket cap removed from the device for test, and thereafter to suction air through the ports to hold the test carrier.

48. The test system of claim 42, wherein the stages comprise a device shuttle to move the device for test towards, and away from, a stage of the test system containing the test socket; and
- wherein the robotics comprise a robot to move the device for test between the device shuttle and the test socket, the robot being in the stage of the test system.

49. The test system of claim 42, wherein the robot is configured to move in a first dimension and the device shuttle is configured to move in a second dimension that is different from the first dimension.

50. The test system of claim 49, wherein the robot is configured to rotate the device for test before, or after, placement in the test socket.

51. The test system of claim 42, wherein the actuator is controllable using a pneumatic system.

52. A test system comprising:
- robotics configured to operate on devices;
- stages comprising parallel paths that are configured to pass the devices between adjacent stages;
- a test socket in one of the stages, the test socket for receiving a device for test, the test socket comprising electrical connections, the device for test being one of the devices;
- a socket cap to fit over the test socket and to contact the device for test to apply pressure to cause the device for test to connect electrically to the electrical connections; and
- an actuator that is movable relative to the socket cap to engage the socket cap.

53. The test system of claim 52, wherein the actuator comprises:
- a key element that is rotatable;
- tooling balls arranged relative to the key element; and
- a block, the tooling balls being fixed to the block, and the key element passing through the block and being movable relative to the block.

54. The test system of claim 53, wherein the socket cap comprises a kinematic mount, the kinematic mount comprising:
- a first structure comprising grooves that are configured and arranged to engage the tooling balls, the first structure having a hole, the hole and the key element having complementary shapes to allow the key element to pass through the hole;

a second structure having a hole, the hole and the key element having complementary shapes to allow the key element to pass through the hole, the key element being configured to rotate to engage the second structure; and at least one compression spring controllable by the first structure and the second structure.

55. The test system of claim 54, wherein the actuator and the key element are configured to operate together to cause operations comprising:

the actuator engages the socket cap forcing the tooling balls against the grooves and causing the key element to pass through the first and second structures;

the actuator rotates the key element;

the key element pulls against the second element while the tooling balls pushes against the grooves to compress the compression spring;

the actuator moves the socket cap in place over the device causing the socket cap to connect to the test carrier; and following connection of the socket cap to the test carrier, the actuator retracts.

56. The test system of claim 55, wherein there are three tooling balls arranged at equidistant locations relative to the key.

57. A test system comprising:

robotics configured to operate on devices;

stages comprising parallel paths that are configured to pass the devices between adjacent stages, the stages comprising:

trays to hold ones of the devices that have been tested and ones of the devices that are to be tested, the trays containing cells, each cell for holding a single device;

a device shuttle to transport the devices that have been tested, or the devices that are to be tested, between the trays and a stage of the test system configured to receive devices that have been tested or to forward devices to be tested; and a robot to move the devices that have been tested or the devices that are to be tested between the trays and the device shuttle;

one or more cameras to image cells of the trays; and one or more processing devices to locate cells of the trays that do not contain a device based on the image data, and to control the robot to move based on locations of the cells that do not contain a device.

58. The test system of claim 57, wherein the robot is configured to move in two dimensions to reach different cells of the trays.

59. The test system of claim 57, wherein the robot is configured to move to place devices that have been tested into cells that do not contain devices.

60. The test system of claim 57, wherein the stages comprise:

a loading station to receive trays of devices to be tested and to receive trays of devices that have been tested.

61. The test system of claim 57, wherein the trays comprise:

a first tray containing devices to be tested;

a second tray containing devices that have been tested and that have passed testing; and a third tray containing devices that have been tested and that have not passed testing.

62. The test system of claim 57, wherein the test system has a footprint that is less than sixteen square meters, that is less than ten square meters, that is less than nine square meters, or that is less than eight square meters.

63. The test system of claim 57, wherein the test system has a volume of less than forty-eight cubic meters.

64. The test system of claim 57, wherein the robot is a first robot; and wherein the robotics comprises second robots to move devices between the device shuttle and a test carrier.

65. The test system of claim 57, wherein a cell among the cells has tapered edges, the tapered edges for funneling a device received in the cell to a resting position.

66. The test system of claim 57, wherein the one or more processing devices are programmed to control the robot to move so as not to place devices into cells that already contain a device.

67. The test system of claim 57, wherein the one or more processing devices are programmed to receive image data from the one or more cameras, the image data representing cells of the trays, the image data being received in real-time.

* * * * *